(12) United States Patent
Hwu et al.

(10) Patent No.: US 11,855,099 B2
(45) Date of Patent: Dec. 26, 2023

(54) METAL-INSULATOR-SEMICONDUCTOR TUNNEL DIODE MEMORY

(71) Applicants: TAIWAN SEMICONDUCTOR MANUFACTURING COMPANY, LTD., Hsinchu (TW); NATIONAL TAIWAN UNIVERSITY, Taipei (TW)

(72) Inventors: Jenn-Gwo Hwu, Taipei (TW); Ting-Hao Hsu, Hsinchu (TW)

(73) Assignees: TAIWAN SEMICONDUCTOR MANUFACTURING COMPANY, LTD., Hsinchu (TW); NATIONAL TAIWAN UNIVERSITY, Taipei (TW)

(*) Notice: Subject to any disclaimer, the term of this patent is extended or adjusted under 35 U.S.C. 154(b) by 0 days.

(21) Appl. No.: 17/582,674

(22) Filed: Jan. 24, 2022

(65) Prior Publication Data

US 2023/0238384 A1    Jul. 27, 2023

(51) Int. Cl.
*H01L 29/88* (2006.01)
*H01L 27/105* (2023.01)
(Continued)

(52) U.S. Cl.
CPC ........ *H01L 27/1021* (2013.01); *H01L 27/105* (2013.01); *H01L 29/66151* (2013.01);
(Continued)

(58) Field of Classification Search
CPC ......... H01L 23/49838; H01L 23/49844; H01L 27/1021; H01L 27/105; H01L 29/41;
(Continued)

(56) References Cited

U.S. PATENT DOCUMENTS

| 2019/0103441 A1* | 4/2019 | Hwu | ................ G11C 11/56 |
| 2021/0058034 A1* | 2/2021 | Hwu | ................ H01L 29/417 |
| 2021/0202484 A1* | 7/2021 | Hwu | ................ H10B 99/00 |

OTHER PUBLICATIONS

Hsu et al., "Prolonged Transient Behavior of Ultrathin Oxide MIS-Tunneling Diode Induced by Deep Depletion of Surrounded Coupling Electrode", IEEE Transactions on Electron Devices, Aug. 2020, vol. 67, No. 8, pp. 3411-3416.

(Continued)

*Primary Examiner* — Herve-Louis Y Assouman
*Assistant Examiner* — Christopher M Roland
(74) *Attorney, Agent, or Firm* — Birch, Stewart, Kolasch & Birch, LLP

(57) ABSTRACT

A method includes forming a first dielectric layer over the substrate and covering first, second, third, fourth, fifth and sixth protrusion regions; forming first, second, and third gate conductors over the first, fourth, and fifth protrusion regions, respectively; performing a first implantation process to form a second source region and a second drain region in the fourth protrusion region; performing a second implantation process to form a first source region and a first drain region in the first protrusion region, and to form a third source region and a third drain region in the fifth protrusion region; forming a metal layer over the third protrusion region; patterning the metal layer to form an inner circular electrode and an outer ring electrode encircling the inner circular electrode; forming a word line; and forming a bit line.

20 Claims, 53 Drawing Sheets

(51) Int. Cl.
 *G11C 11/38* (2006.01)
 *H01L 27/102* (2023.01)
 *H01L 29/66* (2006.01)
 *H10B 99/00* (2023.01)

(52) U.S. Cl.
 CPC ............. *H01L 29/88* (2013.01); *H10B 99/16* (2023.02); *G11C 11/38* (2013.01)

(58) Field of Classification Search
 CPC ................ H01L 29/417; H01L 29/423; H01L 29/66151; H01L 29/88; H10B 99/16; G11C 11/38; G11C 2213/52; G11C 2213/54; G11C 2213/81; G11C 2213/82
 See application file for complete search history.

(56) References Cited

OTHER PUBLICATIONS

Nair et al., "ArchShield: Architectural Framework for Assisting DRAM Scaling by Tolerating High Error Rates", International Symposium on Computer Architecture, 2013, pp. 72-83.

\* cited by examiner

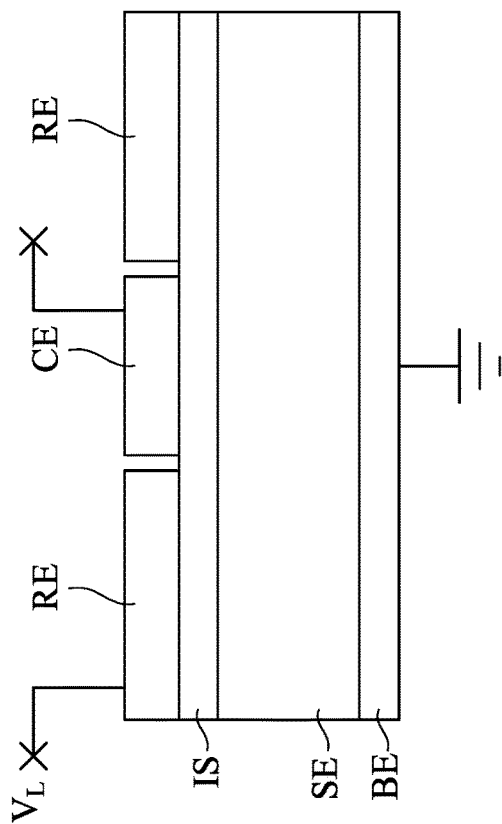
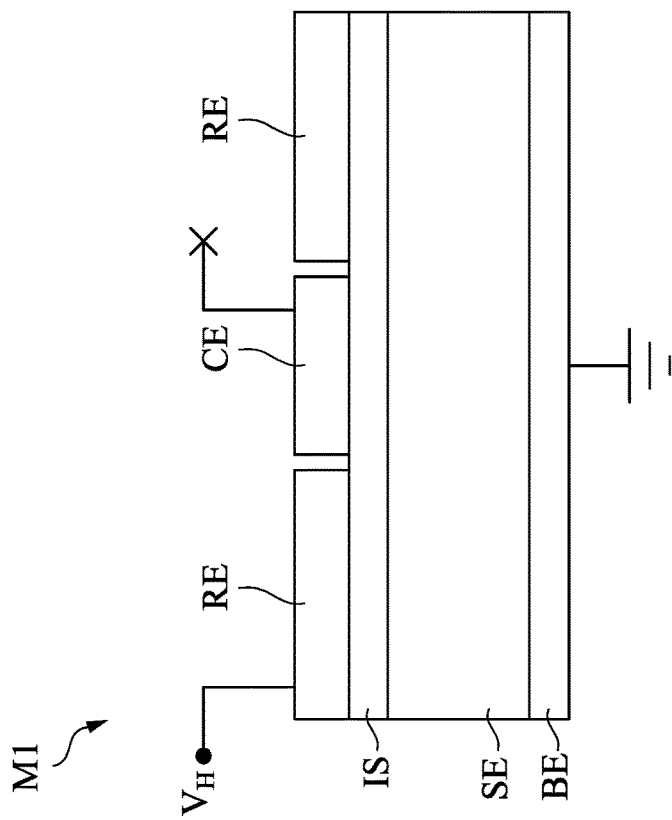

|  | WL | BL1 | BL2 | $V_{g3}$ | $T_{x1}$ | $T_{x2}$ | $T_{x3}$ | Duration |
|---|---|---|---|---|---|---|---|---|
| Forming | State 1 | 2V | Low voltage | - | On | Off | Off | 100s |
| Write 1 | State 1 | 1V | Low voltage | - | On | Off | Off | 20ms |
| Write 0 | State 1 | 0V | Low voltage | - | On | Off | Off | 20ms |
| Read 1 | State 0 | - | High voltage | 0.54V | Off | On | On | 20ms |
| Read 0 | State 0 | - | Low voltage | 0V | Off | On | Off | 20ms |

METAL-INSULATOR-SEMICONDUCTOR TUNNEL DIODE MEMORY

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs. In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs. However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4A and 4B are schematic views of operating the metal-insulator-semiconductor tunnel diode (MISTD) structure in accordance with some embodiments of the present disclosure.

FIG. 9B illustrates a diagram of a memory device under different memory operations in accordance with some embodiments of the present disclosure.

DETAILED DESCRIPTION

Figure 1:
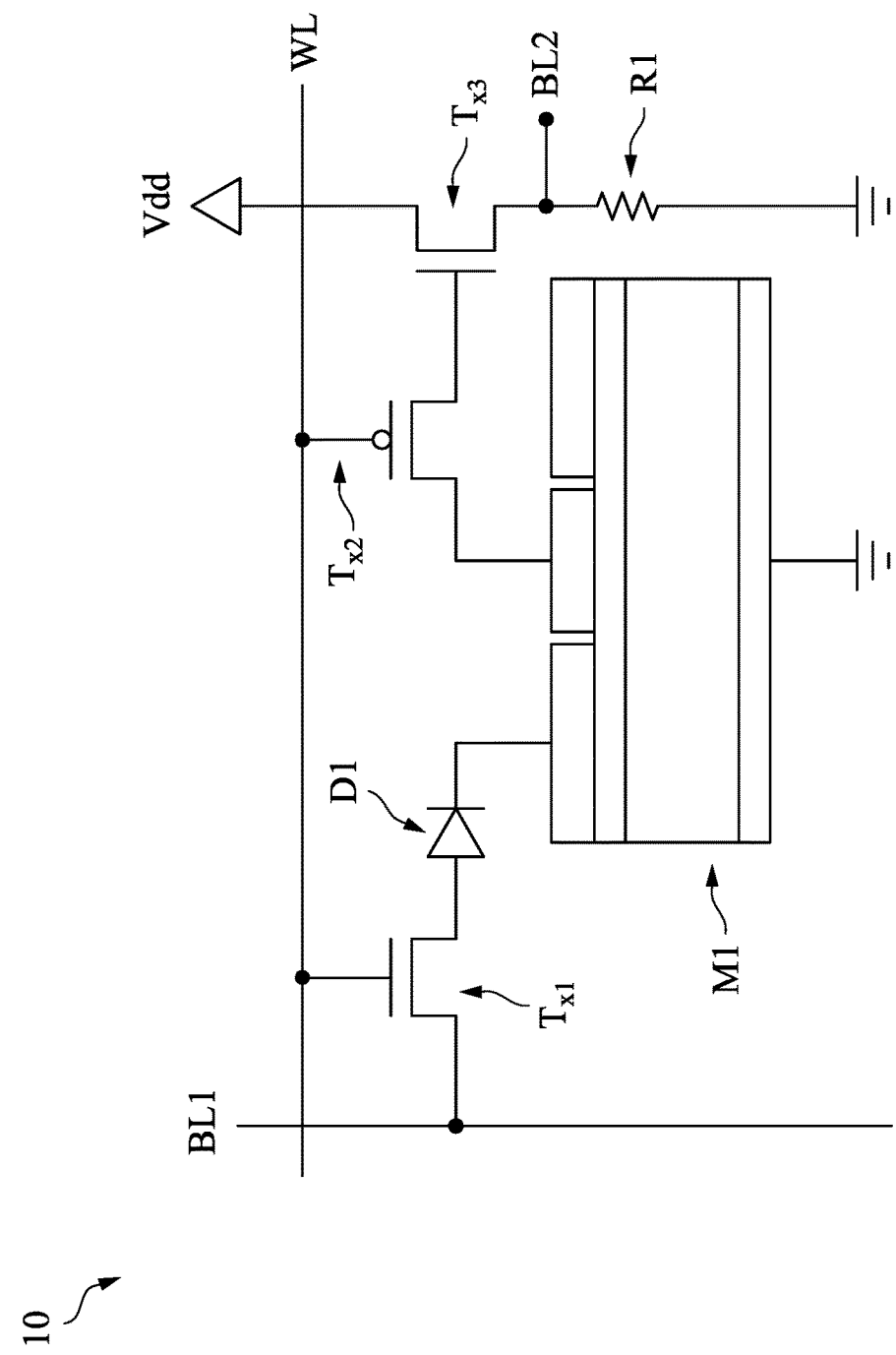
FIG. 1 is a circuit diagram of a memory cell in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2B:
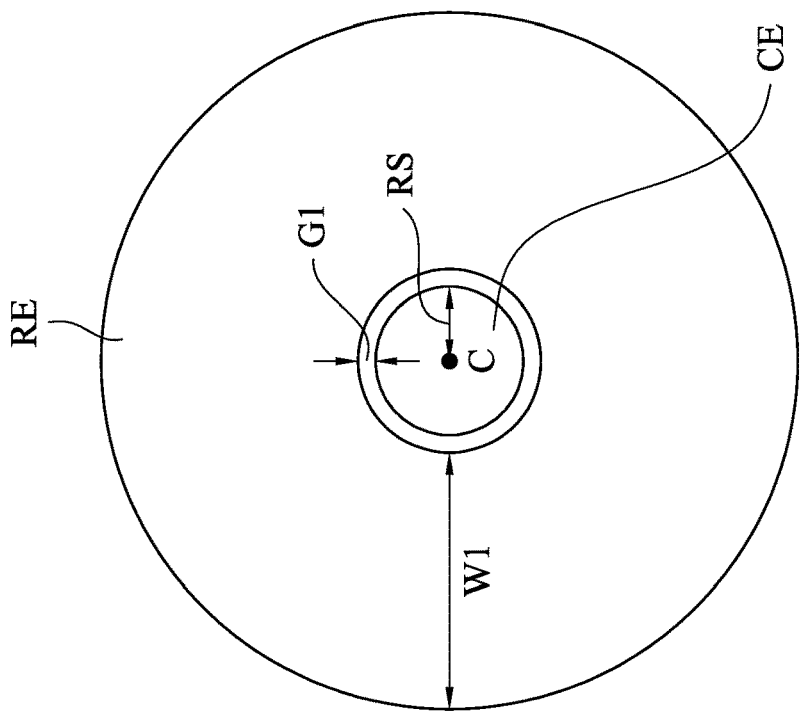
FIG. 2B is a top view of a metal-insulator-semiconductor tunnel diode (MISTD) structure in accordance with some embodiments of the present disclosure.
Figure 2A:
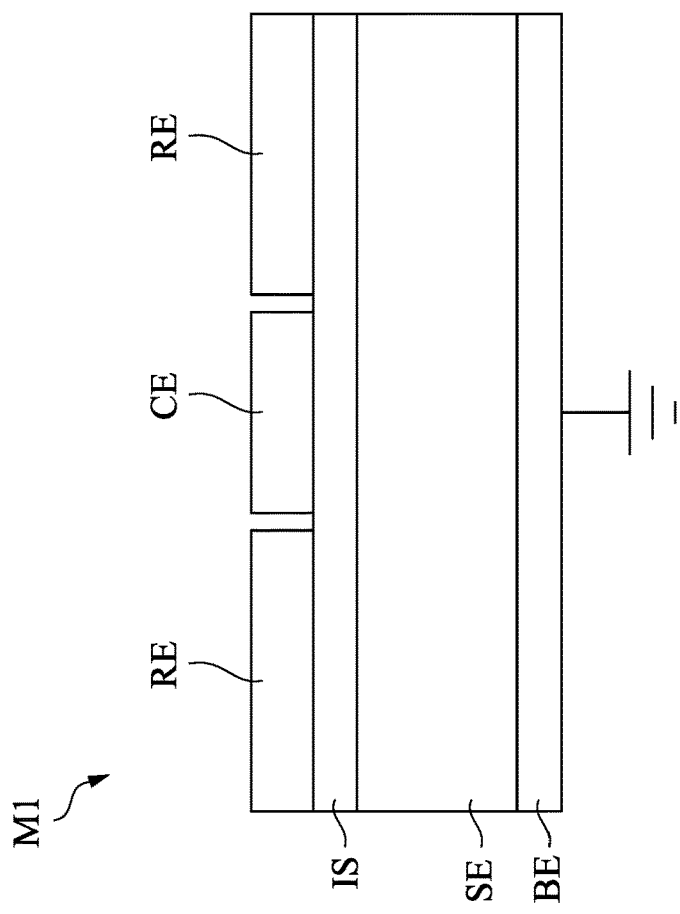
FIG. 2A is a schematic view of a metal-insulator-semiconductor tunnel diode (MISTD) structure in accordance with some embodiments of the present disclosure.

FIG. 1 is a circuit diagram of a memory cell in accordance with some embodiments of the present disclosure. FIG. 2A is a schematic view of a metal-insulator-semiconductor tunnel diode (MISTD) structure in accordance with some embodiments of the present disclosure. FIG. 2B is a top view of a metal-insulator-semiconductor tunnel diode (MISTD) structure in accordance with some embodiments of the present disclosure.

Reference is made to FIG. 1. Shown there is a memory cell 10. The memory cell 10 includes a first transistor $T_{x1}$, a second transistor $T_{x2}$, a third transistor $T_{x3}$, a diode D1, a metal-insulator-semiconductor tunnel diode (MISTD) structure M1, a resistor R1, a bit line BL1, a bit line BL2, and a word line WL.

In some embodiments, the first transistor $T_{x1}$, the second transistor $T_{x2}$, and the third transistor $T_{x3}$ may be metal-oxide-semiconductor field effect transistors (MOSFETs). In some embodiments, the first transistor $T_{x1}$ and the third transistor $T_{x3}$ may include the same conductivity type. For example, the first transistor $T_{x1}$ and the third transistor $T_{x3}$ may be N-type MOSFETs. On the other hand, the second transistor $T_{x2}$ may include a different conductivity type from the first transistor $T_{x1}$ and the third transistor $T_{x3}$. For example, the second transistor $T_{x2}$ may be a P-type MOSFET.

Reference is made to FIGS. 2A and 2B, in which the structural details of the MISTD structure M1 of FIG. 1 are shown. As shown in FIG. 2A, the MISTD structure M1 includes a bottom electrode BE, a semiconductor layer SE over the bottom electrode BE, an insulator IS over the semiconductor layer SE. The MISTD structure M1 further includes an inner circular electrode CE and an outer ring electrode RE over the insulator IS, in which the outer ring electrode RE surrounds the inner circular electrode CE, as shown in FIG. 2B. In some embodiments, the inner circular electrode CE and the outer ring electrode RE are concentrically arranged with respect to the center C of the inner circular electrode CE. In some embodiments, the bottom electrode BE of the MISTD structure M1 is grounded.

As shown in FIG. 2B, the radius RS of the inner circular electrode CE is in a range from about 80 μm to about 90 μm, such as 85 μm in some embodiments. The width W1 of the outer ring electrode RE is in a range from about 450 μm to about 550 μm, such as 500 μm in some embodiments. The gap GI between the inner circular electrode CE and the outer ring electrode RE is in a range from about 2.5 μm to about 7.5 μm, such as 5 μm in some embodiments.

In some embodiments, the bottom electrode BE may include metal, such as aluminum (Al). The semiconductor layer SE may include silicon. In some embodiments, the semiconductor layer SE may include doped silicon. For example, the semiconductor layer may include a P-type doped region. In some embodiments, the insulator IS may include oxide, such as silicon oxide ($SiO_2$), aluminum oxide ($Al_2O_3$), or the like. In some embodiments, the thickness of the insulator IS is in a range from about 15 Å to 24 Å, such as 22.8 Å. In some embodiments, if the thickness of the insulator IS is too thin (e.g., much lower than 15 Å), aluminum layer will tend to penetrate into silicon substrate during the fabrication process, which may damage this device. Moreover, if the thickness of the insulator IS is too thick (e.g., much higher than 24 Å), output signal in application part read at CE may be too low. In some embodiments, the inner circular electrode CE and the outer ring electrode RE may include metal, such as aluminum (Al).

Referring back to FIG. 1. The gate of the first transistor $T_{x1}$ is electrically coupled to the word line WL, the source of the first transistor $T_{x1}$ is electrically coupled to the bit line BL1, and the drain of the first transistor $T_{x1}$ is electrically coupled to the MISTD structure M1 through the diode D1. In greater details, the drain of the first transistor $T_{x1}$ is electrically coupled to the outer ring electrode RE of the MISTD structure M1 through the diode D1.

With respect to the diode D1 connected between the first transistor $T_{x1}$ and the MISTD structure M1, a first side of the diode D1 is connected to the first transistor $T_{x1}$, and a second side of the diode D1 is connected to the MISTD structure M1, in which a current flowing from the first side of the diode D1 to the second side of the diode D1 is referred to as "forward current", while a current flowing from the second side of the diode D1 to the first side of the diode D1 is referred to as "reverse current." The diode D1 has a property that substantially restricts current flow to one direction. For example, the forward current is allowed to pass through the diode D1, while the reverse current is not allowed to pass through the diode D1.

The gate of the second transistor $T_{x2}$ is electrically coupled to the word line WL, the source of the second transistor $T_{x2}$ is electrically coupled to the MISTD structure M1, and the drain of the second transistor $T_{x2}$ is electrically coupled to the gate of the third transistor $T_{x3}$. In greater details, the source of the second transistor $T_{x2}$ is electrically coupled to the inner circular electrode CE of the MISTD structure M1.

The gate of the third transistor $T_{x3}$ is electrically coupled to the drain of the second transistor $T_{x2}$, the source of the third transistor $T_{x3}$ is electrically coupled to a power line Vdd, and the drain of the third transistor $T_{x3}$ is electrically coupled to the bit line BL2. In some embodiments, the drain of the third transistor $T_{x3}$ is further electrically coupled to the ground through the resistor R1.

Figure 3:
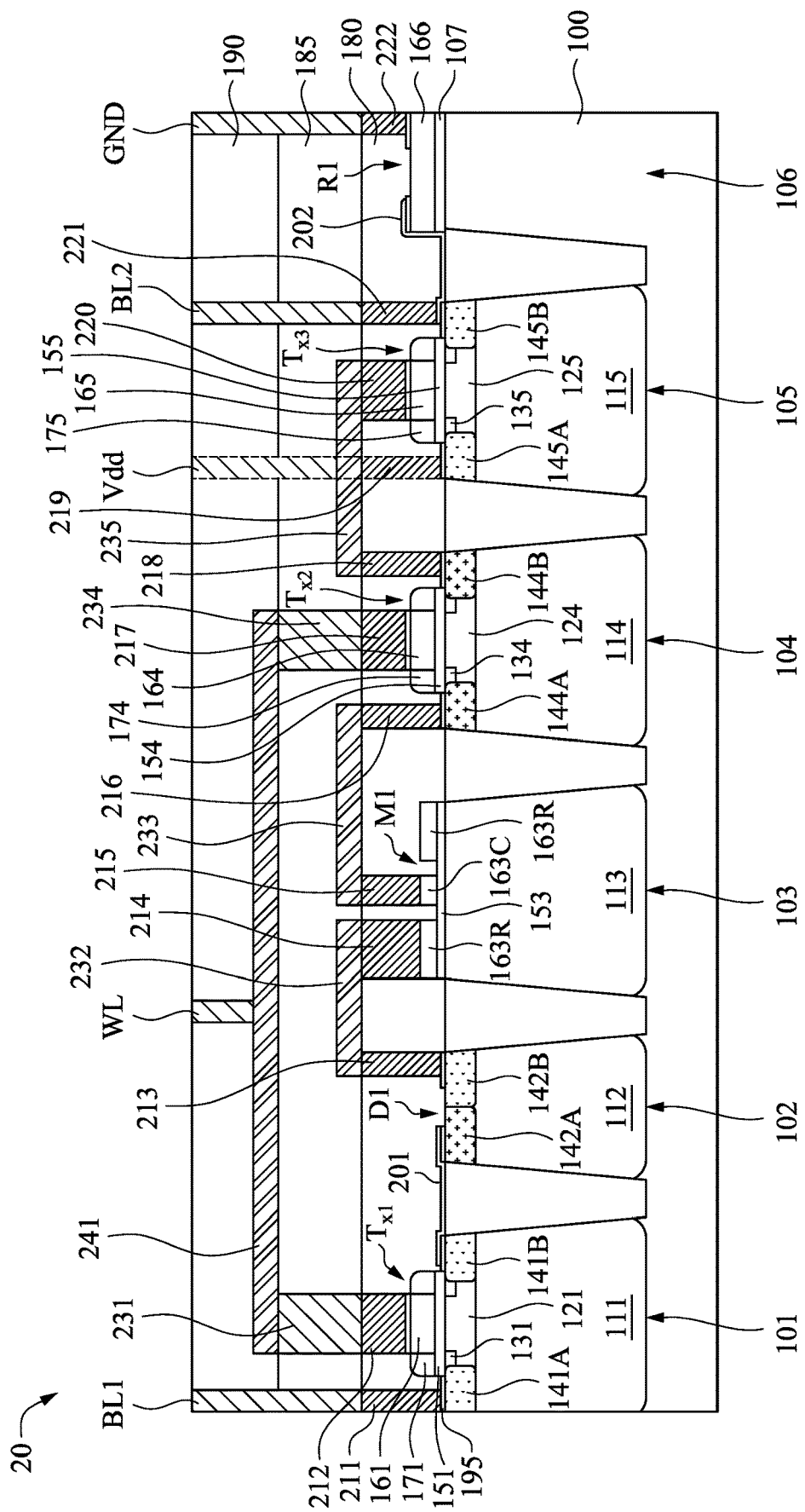
FIG. 3 is a cross-sectional view of a memory device in accordance with some embodiments of the present disclosure.

FIG. 3 is a cross-sectional view of a memory device 20 in accordance with some embodiments of the present disclosure. It is noted that the memory device 20 of FIG. 3 may correspond to the memory cell 10 as discussed in FIGS. 1 to 2B.

The memory device 20 includes a substrate 100. In some embodiments, the substrate 100 may be a semiconductor material and may include known structures including a graded layer or a buried oxide, for example. In some embodiments, the substrate 100 includes bulk silicon that may be undoped or doped (e.g., p-type, n-type, or a combination thereof). Other materials that are suitable for semiconductor device formation may be used. Other materials, such as germanium, quartz, sapphire, and glass could alternatively be used for the substrate 100. Alternatively, the silicon substrate 100 may be an active layer of a semiconductor-on-insulator (SOI) substrate or a multi-layered structure such as a silicon-germanium layer formed on a bulk silicon layer.

Protrusion regions 101, 102, 103, 104, 105, and 106 are protruded over the substrate 100 and are laterally surrounded by isolation structures 108 formed of dielectric material. The isolation structures 108 may be shallow trench isolation (STI) structures, deep trench isolation (DTI) structures, another suitable isolation structures, a combination of the foregoing, or the like. In some embodiments where the STI structures 108 are made of oxide (e.g., silicon oxide), the protrusion regions 101, 102, 103, 104, 105, and 106 can be interchangeably referred to as oxide defined (OD) regions. In some embodiments, the protrusion regions 101, 102, 103, 104, 105, and 106 are semiconductor fins protruding from the substrate 100.

Referring to the protrusion region 101, the protrusion region 101 includes a P-well region 111 and a P-doped region 121 on a top of the P-well region 111. The P-well region 111 and the P-doped region 121 may include P-type dopants, such as boron (B), aluminum (Al), gallium (Ga), or indium (In). In some embodiments, the P-doped region 121 may include higher dopant concentration than the P-well region 111.

A gate dielectric layer 151 is disposed over the protrusion region 101, and a gate conductor 161 is disposed over the gate dielectric layer 151. In some embodiments, the gate dielectric layer 151 and the gate conductor 161 may be collectively referred to as a gate structure. Gate spacers 171 are disposed on opposite sidewalls of the gate conductor 161. In some embodiments, gate spacers 171 are disposed over the gate dielectric layer 151.

In some embodiments, the gate dielectric layers 151 may be made of oxide, such as silicon oxide ($SiO_2$), aluminum oxide ($Al_2O_3$), or the like. In some other embodiments, the gate dielectric layers 151 may be made of high-k dielectric materials, such as metal oxides, transition metal-oxides, or the like. Examples of the high-k dielectric material include, but are not limited to, hafnium oxide ($HfO_2$), hafnium silicon oxide (HfSiO), hafnium tantalum oxide (HMO), hafnium titanium oxide (HfTiO), hafnium zirconium oxide (HfZrO), zirconium oxide, titanium oxide, aluminum oxide, hafnium dioxide-alumina ($HfO_2$—$Al_2O_3$) alloy, or other applicable dielectric materials. In some embodiments, the gate conductor 161 may include amorphous silicon, polycrystalline silicon, or the like. In some other embodiments, the gate conductor 161 may include one or more conductive metals, such as work function metal layers, and filling metals. In some embodiments, the gate spacers 171 may include $SiO_2$, $Si_3N_4$, $SiO_xN_y$, SiC, SiCN films, SiOC, SiOCN films, and/or combinations thereof.

Source/drain regions 141A and 141B are semiconductor regions over the protrusion region 101 and on opposite sides of the gate conductor 161. In some embodiments, lightly-doped (LDD) regions 131 are formed in the protrusion region 101 and adjacent the source/drain regions 141A and 141B, respectively. In some embodiments, the source/drain regions 141A and 141B, and the LDD regions 131 may include N-type dopants, such as phosphorus (P) or arsenic (As). In some embodiments, the source/drain regions 141A and 141B may include higher dopant concentration than the LDD regions 131.

The P-well region 111, the P-doped region 121, the LDD regions 131, the source/drain regions 141A and 141B, the gate dielectric layer 151, the gate conductor 161, and the gate spacers 171 may collectively form the first transistor $T_{x1}$ as discussed in FIG. 1. Stated another way, the first transistor $T_{x1}$ is disposed over the protrusion region 101. In some embodiments, the source/drain region 141A may be the source region of the first transistor $T_{x1}$, while the source/drain region 141B may be the drain region of the first transistor $T_{x1}$.

Referring to the protrusion region 102, the protrusion region 101 includes a P-well region 112, and a P-doped region 142A and an N-doped region 142B are disposed on the top of the P-well region 112. The P-well region 112 and the P-doped region 142A may include P-type dopants, such as boron (B), aluminum (Al), gallium (Ga), or indium (In). In some embodiments, the P-doped region 142A may include higher dopant concentration than the P-well region 112. In some embodiments, the N-doped region 142B may include N-type dopants, such as phosphorus (P) or arsenic (As). The P-doped region 142A is in contact with the N-doped region 142B to form a P-N junction, and therefore the P-doped region 142A and the N-doped region 142B collectively form the diode D1 as discussed in FIG. 1.

Referring to the protrusion region 103, the protrusion region 103 includes a P-well region 113. A dielectric layer 153 is disposed over the top surface of the protrusion region 103. An inner circular electrode 163C and an outer ring electrode 163R are disposed over the dielectric layer 153. In some embodiments, the protrusion region 103, the dielectric layer 153, inner circular electrode 163C, and the outer ring electrode 163R may collectively form the MISTD structure M1 as discussed in FIGS. 1, 2A, and 2B. In greater details, the protrusion region 103 is similar to the semiconductor layer SE of the MISTD structure M1 as discussed in FIG. 2A, the dielectric layer 153 is similar to the insulator IS of the MISTD structure M1 as discussed in FIG. 2A, the inner circular electrode 163C is similar to the inner circular electrode CE of the MISTD structure M1 as discussed in FIGS. 2A and 2B, and the outer ring electrode 163R is similar to the outer ring electrode RE of the MISTD structure M1 as discussed in FIGS. 2A and 2B. In some embodiments, the inner circular electrode 163C and the outer ring electrode 163R may be made of conductive material, such as Al, Cu, Ru, Ni, Co, alloys of these, combinations thereof, and the like. In some embodiments, the dielectric layer 153 may include oxide, such as silicon oxide ($SiO_2$), aluminum oxide ($Al_2O_3$), or the like.

Referring to the protrusion region 104, the protrusion region 104 includes an N-well region 114 and an N-doped region 124 on a top of the N-well region 114. The N-well region 114 and the N-doped region 124 may include N-type dopants, such as phosphorus (P) or arsenic (As). In some embodiments, the N-doped region 124 may include higher dopant concentration than the N-well region 114.

A gate dielectric layer 154 is disposed over the protrusion region 104, and a gate conductor 164 is disposed over the gate dielectric layer 154. In some embodiments, the gate dielectric layer 154 and the gate conductor 164 may be collectively referred to as a gate structure. Gate spacers 174 are disposed on opposite sidewalls of the gate conductor 164. In some embodiments, gate spacers 174 are disposed over the gate dielectric layer 154. In some embodiments, materials of the gate dielectric layer 154, the gate conductor 164, and the gate spacers 174 may be similar to the gate dielectric layer 151, the gate conductor 161, and the gate spacers 171, and thus relevant details will not be repeated for brevity.

Source/drain regions 144A and 144B are semiconductor regions over the protrusion region 104 and on opposite sides of the gate conductor 164. In some embodiments, lightly-doped (LDD) regions 134 are formed in the protrusion region 104 and adjacent the source/drain regions 144A and 144B, respectively. In some embodiments, the source/drain regions 144A and 144B, and the LDD regions 134 may include P-type dopants, such as boron (B), aluminum (Al), gallium (Ga), or indium (In). In some embodiments, the source/drain regions 144A and 144B may include higher dopant concentration than the LDD regions 134.

The N-well region 114, the N-doped region 124, the LDD regions 134, the source/drain regions 144A and 144B, the gate dielectric layer 154, the gate conductor 164, and the gate spacers 174 may collectively form the second transistor $T_{x2}$ as discussed in FIG. 1. Stated another way, the second transistor $T_{x2}$ is disposed over the protrusion region 104. In some embodiments, the source/drain region 144A may be the source region of the second transistor $T_{x2}$, while the source/drain region 144B may be the drain region of the second transistor $T_{x2}$.

Referring to the protrusion region 105, the protrusion region 105 includes a P-well region 115 and a P-doped region 125 on a top of the P-well region 111. The P-well region 115 and the P-doped region 125 may include P-type dopants, such as boron (B), aluminum (Al), gallium (Ga), or indium (In). In some embodiments, the P-doped region 125 may include higher dopant concentration than the P-well region 115.

A gate dielectric layer 155 is disposed over the protrusion region 105, and a gate conductor 165 is disposed over the gate dielectric layer 155. In some embodiments, the gate dielectric layer 155 and the gate conductor 165 may be collectively referred to as a gate structure. Gate spacers 175 are disposed on opposite sidewalls of the gate conductor 165. In some embodiments, gate spacers 175 are disposed over the gate dielectric layer 155. In some embodiments, materials of the gate dielectric layer 155, the gate conductor 165, and the gate spacers 175 may be similar to the gate dielectric layer 151, the gate conductor 161, and the gate spacers 171, and thus relevant details will not be repeated for brevity.

Source/drain regions 145A and 145B are semiconductor regions over the protrusion region 105 and on opposite sides of the gate conductor 165. In some embodiments, lightly-doped (LDD) regions 135 are formed in the protrusion region 105 and adjacent the source/drain regions 145A and 145B, respectively. In some embodiments, the source/drain regions 145A and 145B, and the LDD regions 135 may include N-type dopants, such as phosphorus (P) or arsenic (As). In some embodiments, the source/drain regions 145A and 145B may include higher dopant concentration than the LDD regions 135.

The P-well region 115, the P-doped region 125, the LDD regions 135, the source/drain regions 145A and 145B, the gate dielectric layer 155, the gate conductor 165, and the gate spacers 175 may collectively form the third transistor $T_{x3}$ as discussed in FIG. 1. Stated another way, the third transistor $T_{x3}$ is disposed over the protrusion region 105. In some embodiments, the source/drain region 145A may be the source region of the third transistor $T_{x3}$, while the source/drain region 145B may be the drain region of the third transistor $T_{x3}$.

Referring to the protrusion region 106, a dielectric layer 156 is disposed over the protrusion region 106. A resistor element 166 is disposed over the dielectric layer 156. In some embodiments, the dielectric layer 156 may include similar material as the gate dielectric layer 151. In some embodiments, the resistor element 166 may include amorphous silicon, polycrystalline silicon, or the like. In some embodiments, the resistor element 166 may include a same material as the gate conductors 161, 164, and 165. The resistor element 166 may serve as the resistor R1 as discussed in FIG. 1.

An interlayer dielectric (ILD) layer 180 is disposed over the substrate 100, in contact with the isolation structures 108, and laterally surrounding the first transistor $T_{x1}$, the MISTD structure M1, the second transistor $T_{x2}$, the third transistor $T_{x3}$, and the resistor element 166. An interlayer dielectric (ILD) layer 185 is disposed over the ILD layer 180. An interlayer dielectric (ILD) layer 190 is disposed over the ILD layer 185.

The ILD layers 180, 185, and 190 may include silicon oxide, phosphosilicate glass (PSG), borosilicate glass (BSG), boron-doped phosphosilicate glass (BPSG), undoped silicate glass (USG), a low dielectric constant (low-k) dielectric such as, fluorosilicate glass (FSG), silicon oxycarbide (SiOCH), carbon-doped oxide (CDO), flowable oxide, or porous oxides (e.g., xerogels/aerogels), or the like, or a combination thereof.

Silicide pads 195 are disposed over and in contact with top surfaces of the source/drain region 141A, the gate conductor 161, the source/drain region 141B, the P-doped region 142A, the N-doped region 142B, the source/drain region 143A, the gate conductor 164, the source/drain region 143B, the source/drain region 144A, the gate conductor 165, the source/drain region 144B, and the resistor element 166. In some embodiments, the silicide pads 195 may include metal silicide, such as $TiSi_2$, $CoSi_2$, $WSi_2$, $NiSi_2$, $MoSi_2$, $TaSi_2$, PtSi, or the like.

Referring to the source/drain region 141A, the source/drain region 141A of the first transistor $T_{x1}$ is electrically connected to a bit line BL1 through the silicide pad 195 and a source/drain contact 211. In some embodiments, the source/drain contact 211 may extend through the ILD layer 180, the bit line BL1 may extend through the ILD layers 185 and 190. In some embodiments, the source/drain contact 211 may include a diffusion barrier and a filling metal over the diffusion barrier. For example, the diffusion barrier is used to reduce out-diffusion of conductive materials into the surrounding dielectric materials. The diffusion barrier may include Ti, Ni, Pt, Co, TiN, TaN, Ta, or other suitable metals, or their alloys. The filling metal may be tungsten (W) or other suitable conductive materials, such as Al, Cu, Ru, Ni, Co, alloys of these, combinations thereof, and the like. In some embodiments, the bit line BL1 may include a diffusion barrier and a filling metal over the diffusion barrier. For example, the diffusion barrier is used to reduce out-diffusion of conductive materials into the surrounding dielectric materials. The diffusion barrier may include Ti, Ni, Pt, Co, TiN, TaN, Ta, or other suitable metals, or their alloys. The filling metal may be copper (Cu) or other suitable conductive materials, such as Al, W, Ru, Ni, Co, alloys of these, combinations thereof, and the like.

Referring to the gate conductor 161, the gate conductor 161 of the first transistor $T_{x1}$ is electrically connected to a word line WL through the silicide pad 195, a gate via 212, a metal via 231, and a metal line 241. In some embodiments, the gate via 212 may extend through the ILD layer 180 to the top surface of the gate conductor 161 (or the silicide pad 195). The metal via 231 may extend through the ILD layer 185 to the top surface of the gate via 212. The metal line 241 laterally extends over the ILD layer 185 and in contact with the metal via 231. The word line WL may extend through the ILD layer 190 to the top surface of the metal line 241. In some embodiments, the gate via 212 may include similar material as the source/drain contact 211. The metal via 231 and the word line WL may include similar material as the bit line BL. In some embodiments, the metal line 241 may be copper (Cu) or other suitable conductive materials, such as Al, W, Ru, Ni, Co, alloys of these, combinations thereof, and the like.

Referring to the source/drain region 141B and the P-doped region 142A, the source/drain region 141B of the first transistor $T_{x1}$ is electrically connected to the P-doped region 142A of the diode D1 through silicide pads 195 and a conductive layer 201. In some embodiments, the conductive layer 201 may be in contact with top surface of a portion of the isolation structures 108 between the protrusion regions 101 and 102. In some embodiments, the conductive layer 201 may include TiN, TaN, other suitable metals, or their alloys.

Referring to the N-doped region 142B and the outer ring electrode 163R, the N-doped region 142B of the diode D1 is electrically connected to the outer ring electrode 163R of the MISTD structure M1 through the silicide pad 195, a metal via 213, a metal line 232, and a metal via 214. The metal via 213 may extend through the ILD layer 180 to the top surface of the N-doped region 142B (or the silicide pad 195 over the N-doped region 142B). The metal via 214 may extend through the ILD layer 180 to the top surface of the outer ring electrode 163R. The metal line 232 may laterally extend over the ILD layer 180 and in contact with top surfaces of the metal vias 213 and 214. In some embodiments, the metal via 213 and the metal via 214 may include similar material as the source/drain contact 211, and the metal line 232 may include similar material as the metal line 241.

Referring to the inner circular electrode 163C and the source/drain region 144A, the inner circular electrode 163C of the MISTD structure M1 is electrically connected to the source/drain region 144A of the second transistor $T_{x2}$ through a metal via 215, a metal line 233, a source/drain contact 216, and the silicide pad 195. The metal via 215 may extend through the ILD layer 180 to the top surface of the inner circular electrode 163C. The source/drain contact 216 may extend through the ILD layer 180 to the top surface of the source/drain region 144A (or the silicide pad 195 over the source/drain region 144A). The metal line 233 may laterally extend over the ILD layer 180 and in contact with top surfaces of the metal via 215 and the source/drain contact 216. In some embodiments, the metal via 215 and the source/drain contact 216 may include similar material as the source/drain contact 211, and the metal line 233 may include similar material as the metal line 241.

Referring to the gate conductor 164, the gate conductor 164 of the second transistor $T_{x2}$ is electrically connected to the word line WL through the silicide pad 195, a gate via 217, a metal via 234, and the metal line 241. In some embodiments, the gate via 217 may extend through the ILD layer 180 to the top surface of the gate conductor 164 (or the silicide pad 195 over the gate conductor 164). The metal via 234 may extend through the ILD layer 185 to the top surface of the gate via 217. The metal line 241 laterally extends over the ILD layer 185 and in contact with the metal via 234. The word line WL may extend through the ILD layer 190 to the top surface of the metal line 241. In some embodiments, the gate via 217 may include similar material as the source/drain contact 211, and the metal via 234 may include similar material as the bit line BL. In some embodiments, the gate conductor 164 of the second transistor $T_{x2}$ is also electrically connected to the gate conductor 161 of the first transistor $T_{x1}$.

Referring to the source/drain region 144B and the gate conductor 165, the source/drain region 144B of the second transistor $T_{x2}$ is electrically connected to the gate conductor 165 of the third transistor $T_{x3}$ through the silicide pads 195, a source/drain contact 218, a metal line 235, and a gate via 220. In some embodiments, the source/drain contact 218 may extend through the ILD layer 180 to the top surface of the source/drain region 144B (or the silicide pad 195 over the source/drain region 144B). The gate via 220 may extend through the ILD layer 180 to the top surface of the gate conductor 165 (or the silicide pad 195 over the gate conductor 165). The metal line 235 laterally extends over the ILD layer 180 and in contact with the source/drain contact 218 and the gate via 220. In some embodiments, the source/drain contact 218 and the gate via 220 may include similar material as the source/drain contact 211. The metal line 235 may include similar material as the metal line 241.

Referring to the source/drain region 145A, the source/drain region 145A of the third transistor $T_{x3}$ is electrically connected to a power line Vdd through the silicide pad 195, and a source/drain contact 219. The source/drain contact 219 may extend through the ILD layer 180 to the top surface of the source/drain region 145A (or the silicide pad 195 over the source/drain region 145A). The power line Vdd may extend through the ILD layers 185 and 190 to the top surface of the source/drain contact 219. In some embodiments, the source/drain contact 219 may include similar material as the source/drain contact 211. The power line Vdd may include similar material as the bit line BL1. It is noted that the source/drain contact 219 and the power line Vdd are drawn in dash-line, because the source/drain contact 219 and the power line Vdd may not be presented in this cross-sectional view in a real structure. That is, the power line Vdd may bypass the metal line 235 and would be in contact with the top surface of the source/drain contact 219.

Referring to the source/drain region 145B, the source/drain region 145B of the third transistor $T_{x3}$ is electrically connected to a bit line BL2 through the silicide pad 195, a conductive layer 202, and a source/drain contact 221. Furthermore, the source/drain region 145B of the third transistor $T_{x3}$ is electrically connected to the resistor element 166 through the silicide pads 195 and the conductive layer 202. The conductive layer 202 may extend from top surface of the silicide pad 195 over the source/drain region 145B, passing through the top surface of the isolation structure 108 between the protrusion regions 105 and 106, to the sidewall of the resistor element 166 and the top surface of the silicide pad 195 over the resistor element 166. The source/drain contact 221 may extend through the ILD layer 180 to the top surface of the source/drain region 145B (or the conductive layer 202). The bit line BL2 may extend through the ILD layers 185 and 190 to the top surface of the source/drain contact 221. In some embodiments, the source/drain contact 221 may include similar material as the source/drain contact 211. The conductive layer 202 may include similar material as the conductive layer 201. The bit line BL2 may include similar material as the bit line BL1.

Referring to the resistor element 166, the resistor element 166 is further electrically connected to a ground contact GND through the silicide pad 195 and a metal via 222. The metal via 222 may extend through the ILD layer 180 to the top surface of the resistor element 166 (or the silicide pad 195 over the resistor element 166). The ground contact GND may extend through the ILD layers 185 and 190 to the top surface of the metal via 222. In some embodiments, the metal via 222 may include similar material as the source/drain contact 211. The ground contact GND may include similar material as the bit line BL1.

FIGS. 4A and 4B are schematic views of operating the metal-insulator-semiconductor tunnel diode (MISTD) structure in accordance with some embodiments of the present disclosure. In greater details, FIGS. 4A and 4B illustrate schematic views of operating the MISTD structure M1 as discussed in FIGS. 1 to 2I3.

In FIG. 4A, the outer ring electrode RE of the MISTD structure M1 is biased at a high voltage level $V_H$, and the inner circular electrode CE of the MISTD structure M1 is floating (e.g., I=0 A). In some embodiments, the high voltage level $V_H$ may be about 1V.

In FIG. 4B, the bias at the outer ring electrode RE of the MISTD structure M1 is switched back from the high voltage level V1 to a low voltage level $V_L$ (e.g., 0V), such that the outer ring electrode RE of the MISTD structure M1 is floating (e.g., I=0 A). In some embodiments, the lower voltage level $V_L$ may be about 0V.

When the inner circular electrode CE and the outer ring electrode RE of the MISTD structure M1 are not biased (e.g., V=0), a built-in inversion charges will naturally formed at the portion of the semiconductor layer SE under the inner circular electrode CE due to the work function difference between the inner circular electrode CE and the semiconductor layer SE. When the outer ring electrode RE is biased at a high voltage level, the inversion electrons under the inner circular electrode CE will be driven to the portion of the semiconductor layer SE under the biased outer ring electrode RE. Furthermore, because the insulator IS is a thin layer, the electrons driven to the portion of the semiconductor layer SE under the biased outer ring electrode RE may tunnel to the outer ring electrode RE due to strong tunneling effect. Accordingly, to compensate the leakage electrons under the inner circular electrode CE, a depletion region will be formed under the inner circular electrode CE, and therefore a positive bias will be induced at the inner circular electrode CE.

Figure 5A:
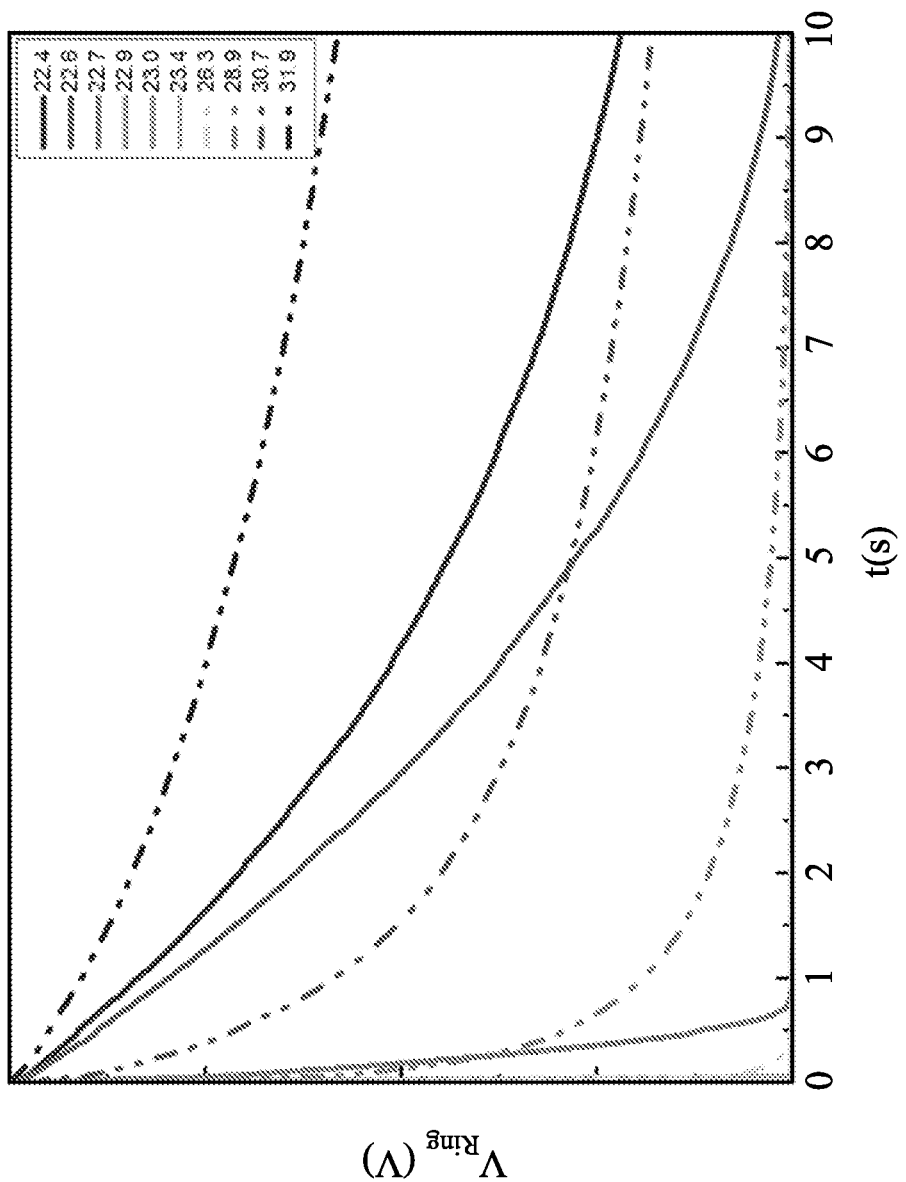
FIG. 5A illustrates voltage decay characteristics of an outer ring electrode of a MISTD structure with various oxide thicknesses after a bias-then-open switching in accordance with some embodiments of the present disclosure.
Figure 5B:
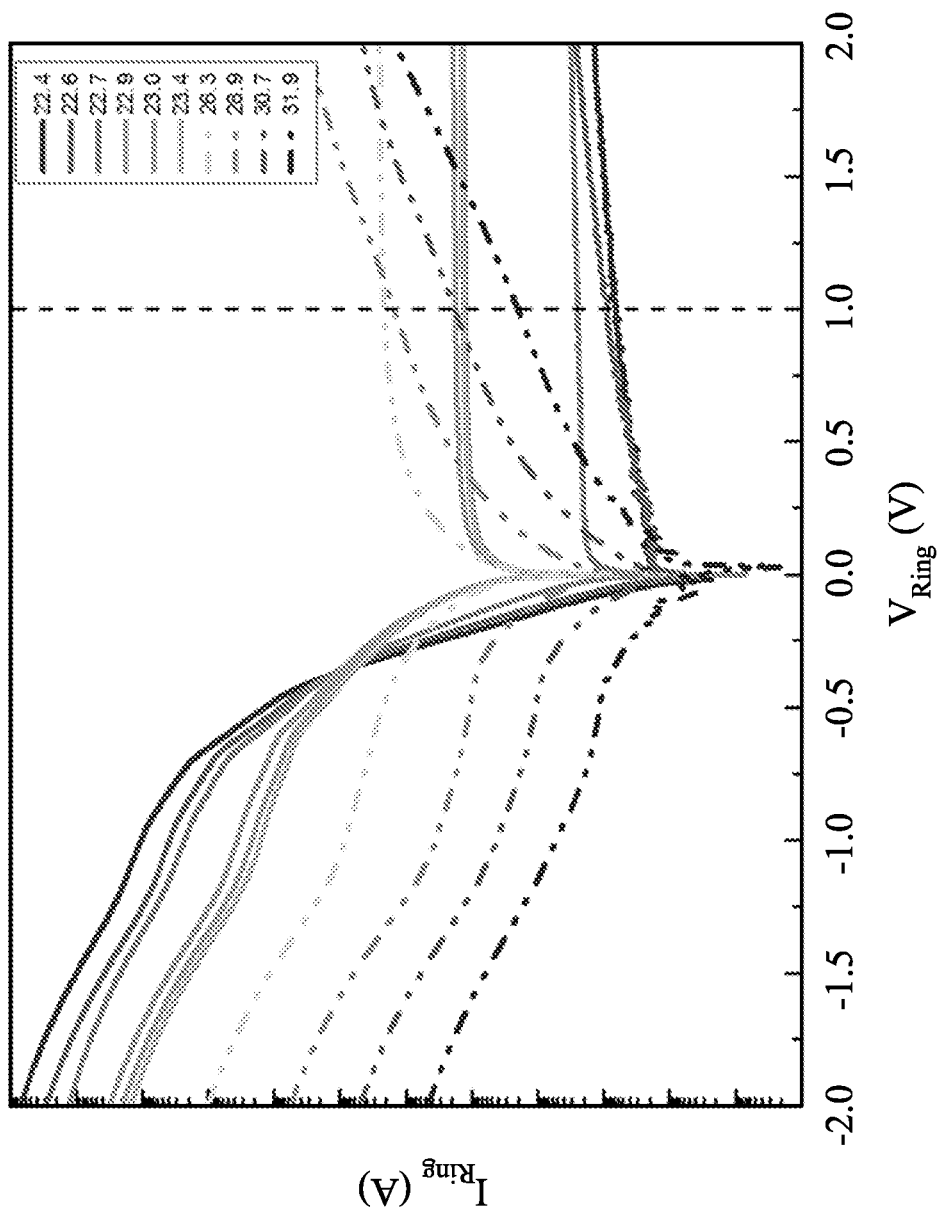
FIG. 5B illustrates I-V curves of outer ring electrode of a MISTD structure with various oxide thicknesses after a bias-then-open switching in accordance with some embodiments of the present disclosure.

FIG. 5A illustrates voltage decay characteristics of an outer ring electrode of a MISTD structure with various oxide thicknesses after a bias-then-open switching in accordance with some embodiments of the present disclosure. FIG. 5B illustrates I-V curves of outer ring electrode of a MISTD structure with various oxide thicknesses after a bias-then-open switching in accordance with some embodiments of the present disclosure. Here, the term "bias-then-open switching" can be referred to as the operations discussed in FIGS. 4A and 4B, in which the voltage at the outer ring electrode RE of the MISTD structure M1 is switched from a high voltage level to floating. Here, the "oxide" discussed later may be the insulator IS of the MISTD structure M1 as discussed in FIG. 2A.

In FIG. 5A, voltage at the outer ring electrode RE are measured with various oxide thicknesses after a bias-then-open switching. The outer ring electrode RE is initially biased at 1 V (see FIG. 4A) and then switched to floating (I=0 A, see FIG. 4B), the voltage on the outer ring electrode RE decaying over time is recorded. It is observed that for those devices with oxide thickness larger than about 26 Å, the thinner oxide shows faster $V_R$ decay. Here, the term "$V_R$" is the measured voltage at the outer ring electrode RE.

In FIG. 5B, the reverse currents of the MISTD structures under 1V are not saturated for oxide thickness larger than 26 Å. That is, those MISTD structures are still under inversion under 1V bias. It is noteworthy that the reverse current for devices with thicker oxide will also saturate eventually. Once the voltage applied on the MISTD structure is large enough that further accumulation of inversion charges is impossible, the Schottky barrier height will be fixed and results in the saturation of reverse current. The decay of the $V_R$ as shown in FIG. 5A is the result of the inversion charges at the semiconductor surface tunnel through the insulator to the metal and recombine with the positive charges. The tunneling probability of the inversion charges increases with reducing oxide thickness and thus results in the increased voltage decay speed as discussed in FIG. 5A.

Referring back to FIG. 5A, for those devices with oxide thickness smaller than 26 Å, however, it is shown that the thinner oxide has slower $V_R$ decay. The turnaround behavior matches with the curve of FIG. 5B. The I-V curves of the devices with oxide thinner than 26 Å are saturated under 1V bias, indicating that those devices are under deep depletion rather than inversion. In this case, since the negative charges in the semiconductor is dominated by the immobile space charges in the deep depletion region, the $V_R$ decay is the result of the positive charges in the metal leaking toward the silicon and recombine with the generated minority electrons in the deep depletion region, that is, the presence of electrons is an important factor to the whole phenomenon. After a certain amount of positive charge starts decreasing, the depletion width is reduced, and the outer ring electrode RE returns to thermal equilibrium. Since $V_{ox}$ is smaller in devices with thinner oxide, a larger Schottky barrier is encountered by the holes and a slower $V_R$ decay is thereby observed.

Figure 6A:
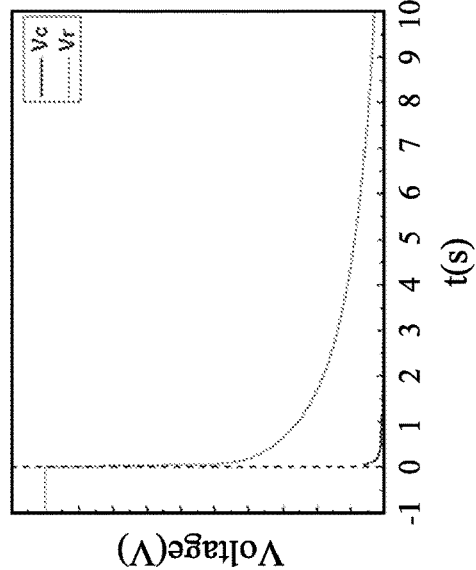
FIGS. 6A, 6B, and 6C illustrate voltage decay characteristics of an inner circular electrode of a MISTD structure with various oxide thicknesses after a bias-then-open switching in accordance with some embodiments of the present disclosure.
Figure 6B:
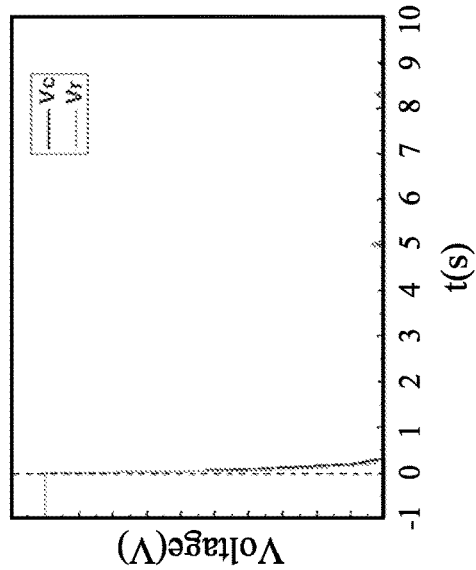
Figure 6C:
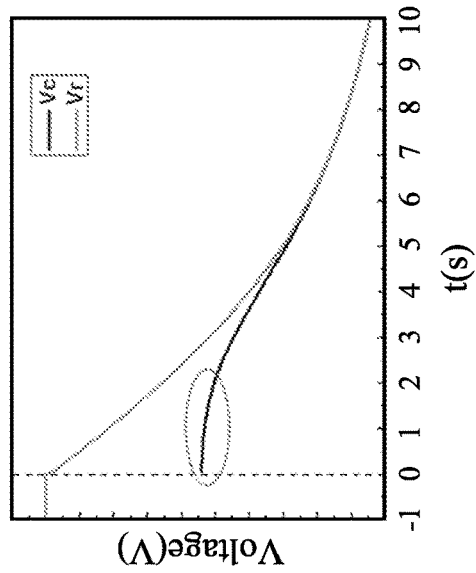

FIGS. 6A, 6B, and 6C illustrate voltage decay characteristics of an inner circular electrode of a MISTD structure with various oxide thicknesses after a bias-then-open switching in accordance with some embodiments of the present disclosure. The outer ring electrode RE is initially biased at 1 V (see FIG. 4A) and then switched to floating (I=0 A, see FIG. 4B), the voltage on the inner circular electrode CE decaying over time is recorded. Here, the term "$V_C$" discussed later is the measured voltage at the inner circular electrode CE of the MISTD structure M1.

In FIGS. 6A and 6B, it is observed that as the oxide is thicker than about 24 Å (e.g., 28.3 Å in FIG. 6A and 24.2 Å in FIG. 6B), $V_C$ decays instantaneously. However, in FIG. 6C, it is observed that as the oxide becomes thinner than 24 Å (e.g., 22.8 Å in FIG. 6A), $V_C$ will stay at some relatively stable value before decaying, instead of decaying instantaneously. The phenomenon is used as the memory characteristic in the present disclosure. It is noted that the observed phenomenon depends on the gap between inner circular electrode CE and the outer ring electrode RE, and the oxide thickness.

Figure 7A:
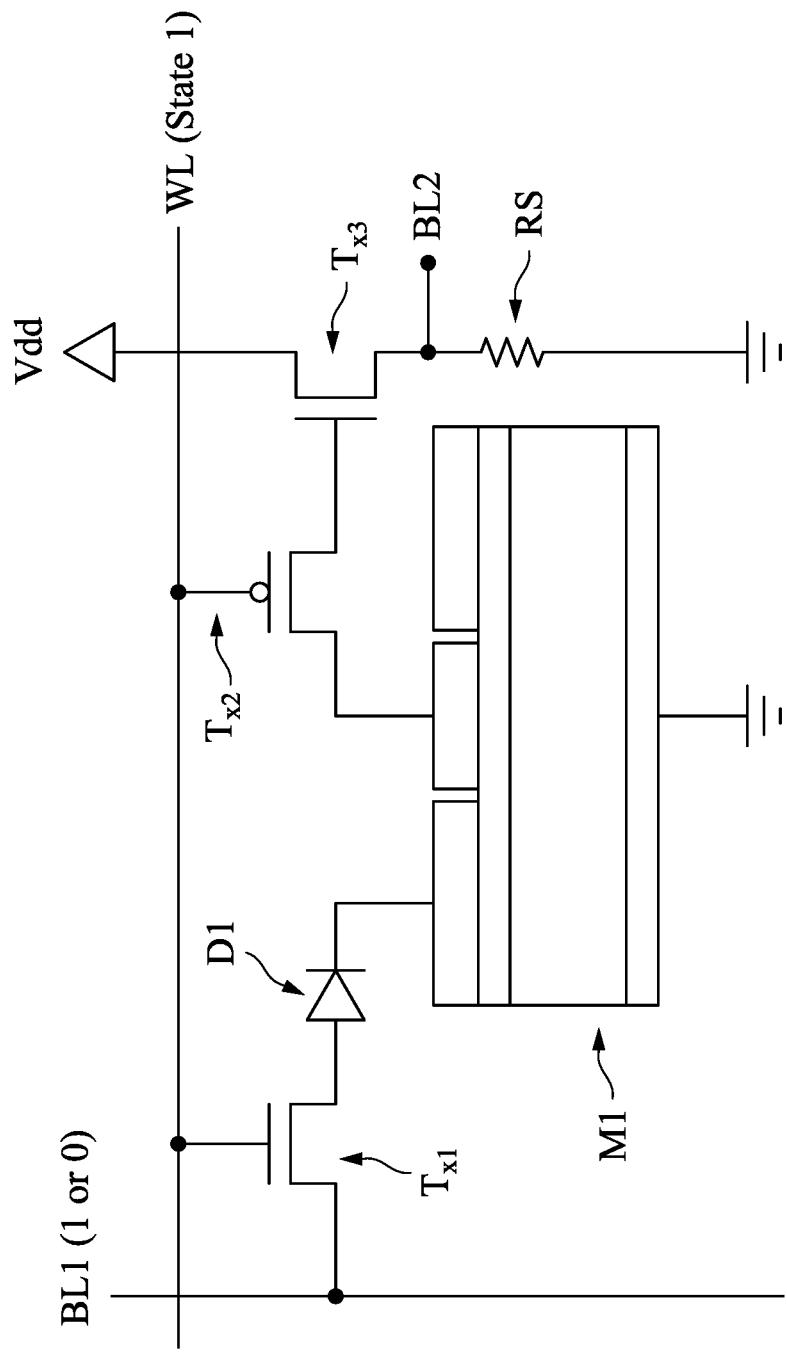
FIG. 7A illustrates a write operation of a memory device in accordance with some embodiments of the present disclosure.
Figure 7B:
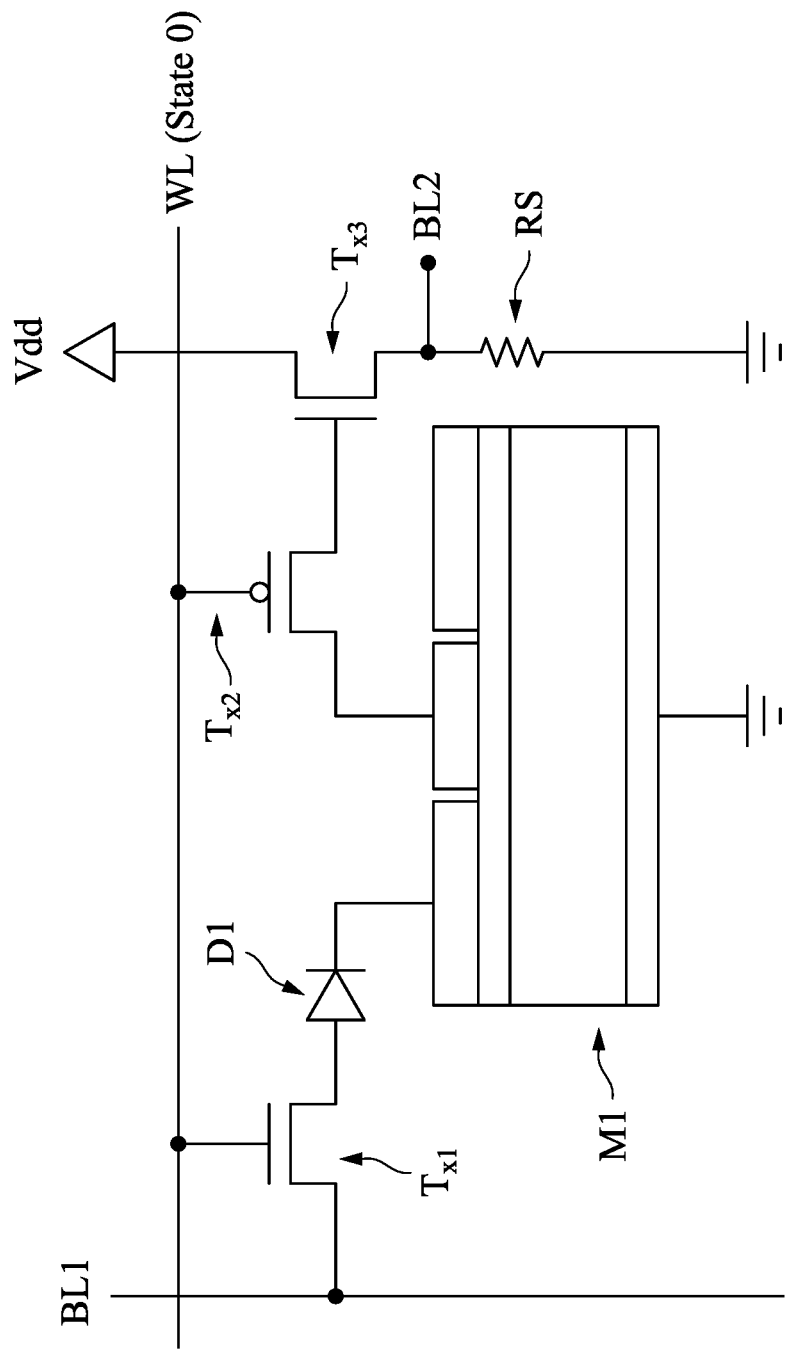
FIG. 7B illustrates a read operation of a memory device in accordance with some embodiments of the present disclosure.

FIG. 7A illustrates a write operation of a memory device in accordance with some embodiments of the present disclosure. FIG. 7B illustrates a read operation of a memory device in accordance with some embodiments of the present disclosure.

In FIG. 7A, a write operation is performed to the memory cell 10. A high voltage level (e.g., state 1) is applied to the word line WL. Because the first transistor $T_{x1}$ is an N-type transistor, the first transistor $T_{x1}$ is turned on when the high voltage level is applied to the gate of the first transistor $T_{x1}$. However, because the second transistor $T_{x2}$ is a P-type transistor, the second transistor $T_{x2}$ is turned off when the high voltage level is applied to the gate of the second transistor $T_{x2}$. That is, during the write operation, the first transistor $T_{x1}$ is "on", while the second transistor $T_{x2}$ is "off."

During the write operation of the memory cell 10, the bit line BL1 may be biased with a high voltage level (e.g., 1V) or a low voltage level (e.g., 0V), depending on the data to be write.

FIG. 7B, a read operation is performed to the memory cell 10. During the read operation, a low voltage level (e.g., state 0) is applied to the word line WL. Because the first transistor $T_{x1}$ is an N-type transistor, the first transistor $T_{x1}$ is turned off when the low voltage level is applied to the gate of the first transistor $T_{x1}$. However, because the second transistor $T_{x2}$ is a P-type transistor, the second transistor $T_{x2}$ is turned on when the low voltage level is applied to the gate of the second transistor $T_a$. That is, during the read operation, the first transistor $T_{x1}$ is "off", while the second transistor $T_{x2}$ is "on." Furthermore, a power voltage Vdd is supplied to the third transistor $T_{x3}$.

If the bit line BL1 is biased with a high voltage level during the write operation. The voltage at the inner circular electrode CE will be increased and stay stable for a duration (see FIG. 6C). Because the second transistor $T_{x2}$ is turned on during the read operation, the increased voltage at the inner circular electrode CE will be the same at the gate of the third transistor $T_{x3}$. Accordingly, the third transistor $T_{x3}$ is turned on, and drain current of the third transistor $T_{x3}$ will increase, which results in that the voltage at the bit line BL2 will increase. Accordingly, data '1' can be read out from the bit line BL2.

However, if the bit line BL1 is biased with a low voltage level during the write operation. The voltage at the inner circular electrode CE will not be increased. Therefore, even if the second transistor $T_{x2}$ is turned on during the read operation, the voltage at the inner circular electrode CE would not be able to turn on the third transistor $T_{x3}$. Accordingly, drain current of the third transistor $T_{x3}$ would not increase, and the voltage at the bit line BL2 will not increase. Accordingly, data '0' can be read out from the bit line BL2.

Figure 8A:
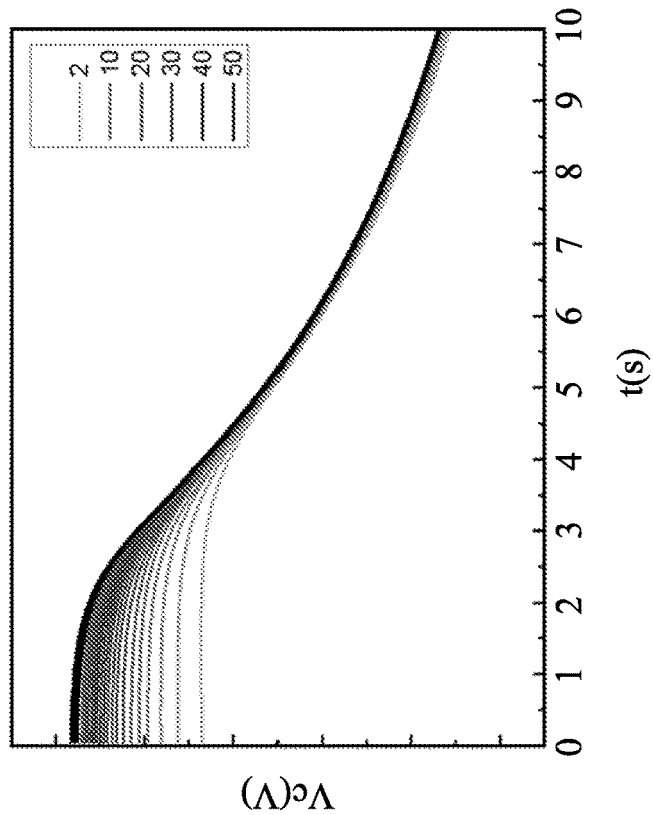
FIG. 8A illustrates voltage decay characteristics of an inner circular electrode of a MISTD structure after various times of bias-then-open switching in accordance with some embodiments of the present disclosure.
Figure 8B:
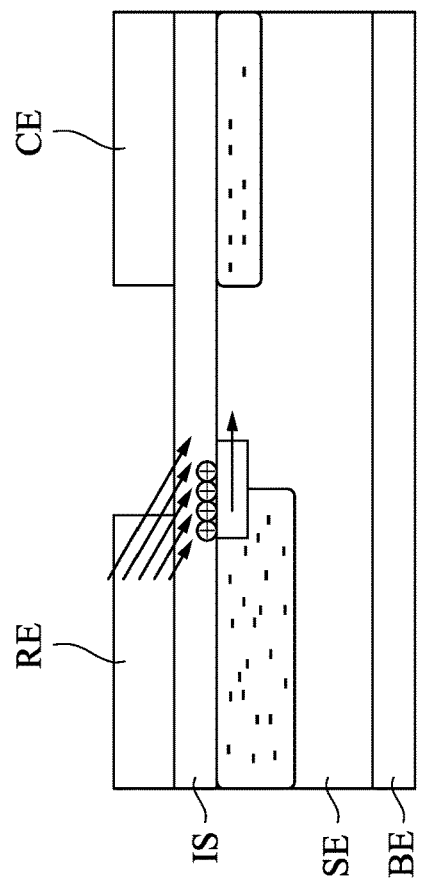
FIG. 8B illustrates a schematic view of the MISTD structure in accordance with some embodiments of the present disclosure.

FIG. 8A illustrates voltage decay characteristics of an inner circular electrode of a MISTD structure after various times of bias-then-open switching in accordance with some embodiments of the present disclosure. FIG. 8B illustrates a schematic view of the MISTD structure in accordance with some embodiments of the present disclosure.

In FIG. 8A, it is observed that when the bias-then-open switching operation is performed more times, the induced voltage Vc at the inner circular electrode CE will be improved, which may be due to the fringing field effect as will be discussed in FIG. 8B.

In FIG. 8B, when the outer ring electrode RE is biased at 1 V, the hole current is concentrated at the edge of outer ring electrode RE due to fringing field effect. The concentrated hole current results in holes trapping at the edge of the outer ring electrode RE. The trapped holes at the oxide (e.g, insulator IS) lower the potential of the substrate at the gap. As a result, the electrons from the inner circular electrode CE can reach the outer ring electrode RE more easily. The induced transient current is therefore increased gradually with the number of operations. Furthermore, this also results in a stronger coupling between the outer ring electrode RE and the inner circular electrode CE, and therefore the sensed $V_C$ will get higher after each Write 1 operation. It is noteworthy that the enhancement of both phenomena by the trapped holes will eventually come to saturation due to limited trap states in the oxide.

Figure 9A:
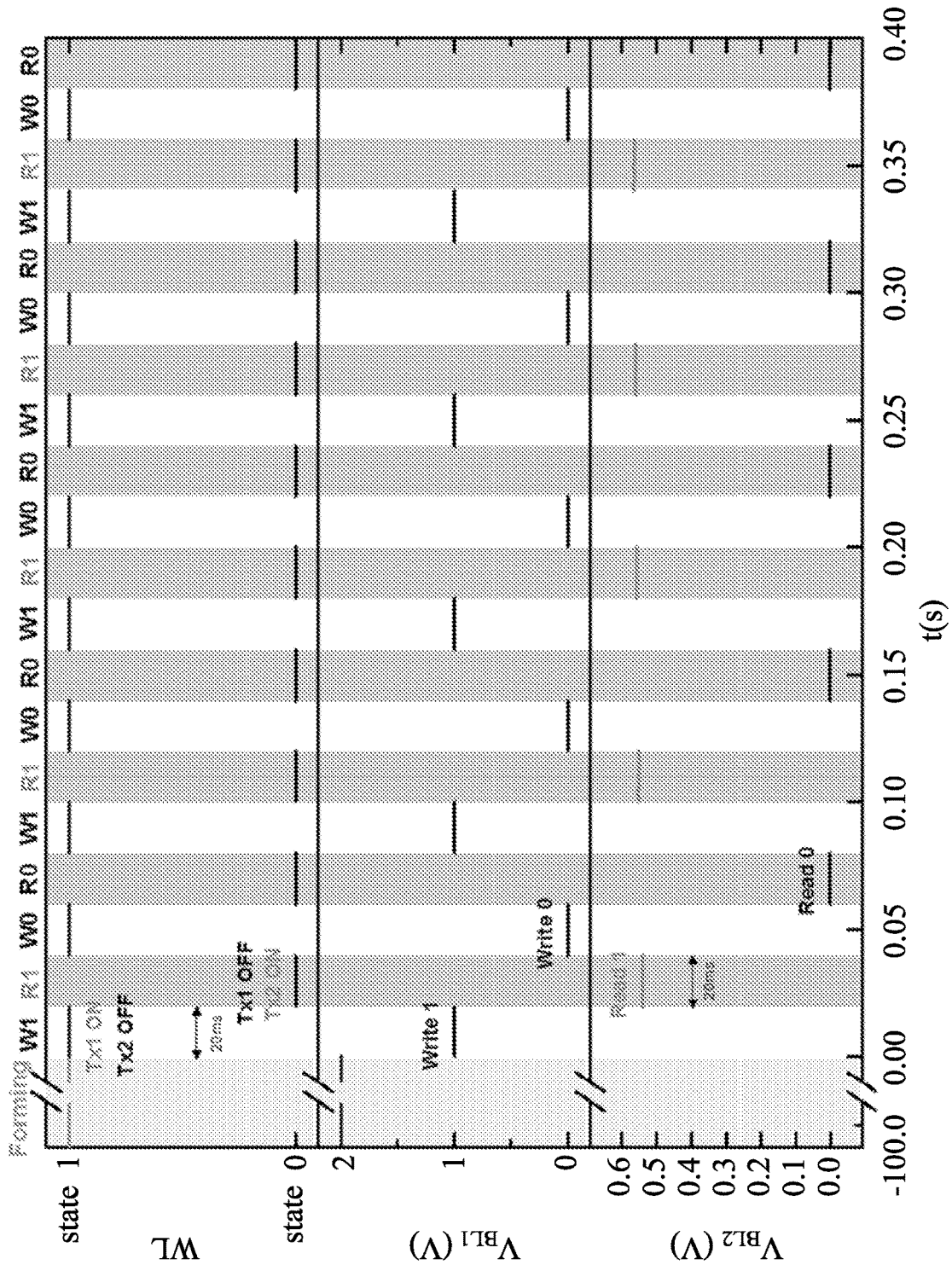
FIG. 9A illustrates memory operations of a memory device in accordance with some embodiments of the present disclosure.

FIG. 9A illustrates memory operations of a memory device in accordance with some embodiments of the present disclosure. FIG. 9B illustrates a diagram of a memory device under different memory operations in accordance with some embodiments of the present disclosure. FIGS. 9C to 9G illustrate schematic views of a memory device under different conditions in accordance with some embodiments of the present disclosure.

The first and second transistors $T_{x1}$ and $T_{x2}$ are controlled by the word line WL. To write "1" into the memory device, the bit line BL1 is biased at 1 V and the word line WL is in state 1 so that the first transistor $T_{x1}$ is on and the second transistor $T_{x2}$ is off. To write "0" into the memory device, the bit line BL1 is biased at 0 V, and the word line WL is also in state 1. To read the memory cell, the word line WL is in state 0 so that the first transistor $T_{x1}$ is off and second transistor $T_{x2}$ is on. The data can then be sensed on the bit line BL2. The durations of the read and write operations are about 20 ms.

As discussed in FIGS. 8A and 8B, because the trapping of holes at the oxide (e.g, insulator IS) will improve the characteristic of the sensed $V_C$ at the inner circular electrode CE, a forming operation is needed to trap those holes to the maximum capacity so that the unstable behavior can be prevented. The forming operation is conducted by biasing the word line WL in state 1 and the bit line BL1 in 2V for 100 s. The voltage applied to the word line WL in the forming operation is higher than the voltage applied to the word line WL in the write operation. In some embodiments, a device with oxide thickness of about 15 Å to 24 Å (e.g., 22.8 Å in this case) and gap width of about 5.

Figure 9C:
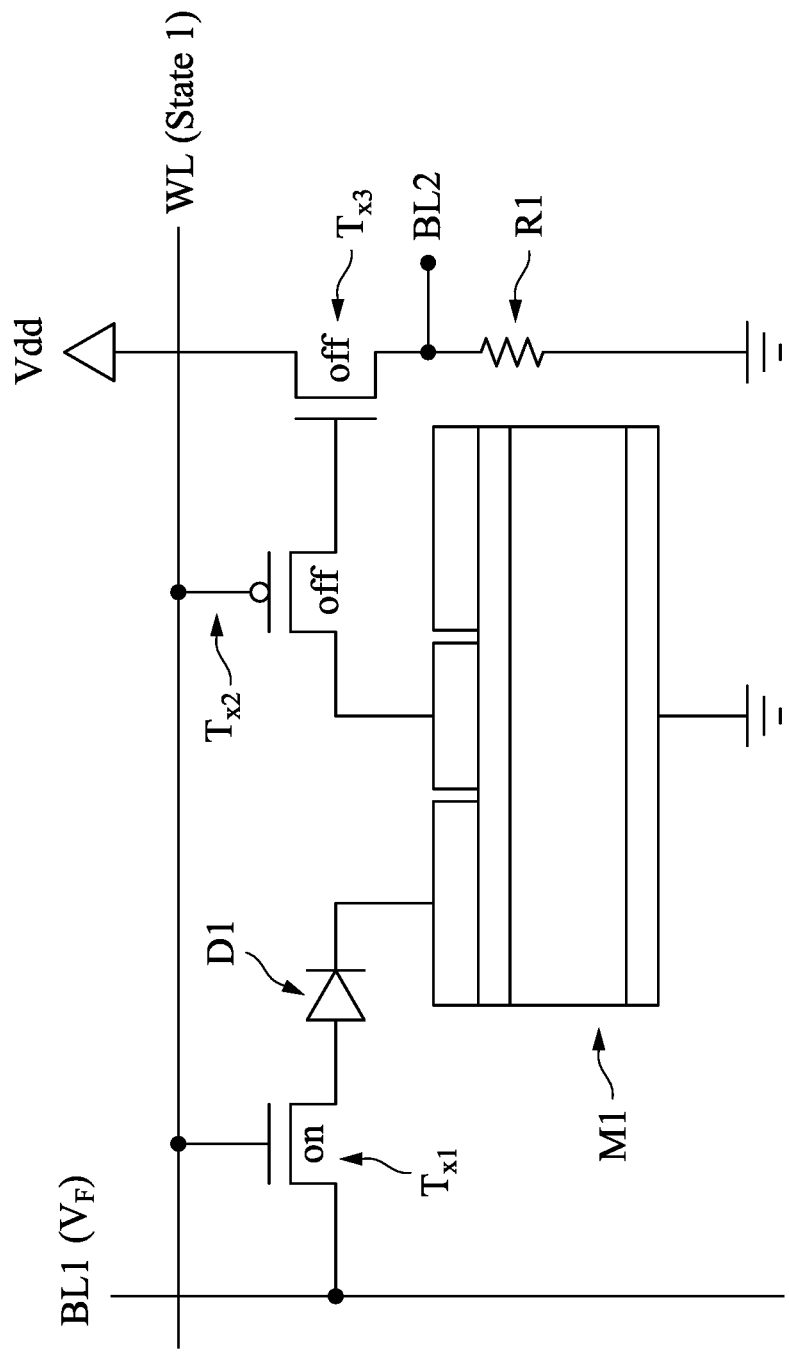
FIGS. 9C to 9G illustrate schematic views of a memory device under different conditions in accordance with some embodiments of the present disclosure.

Reference is made to FIGS. 9A, 9B, and 9C, a forming operation is performed to the memory cell 10. The bit line BL1 is biased at a voltage level $V_F$, such as about 2V. The word line WL is set to state 1 (e.g., high voltage level) so that the first transistor $T_{x1}$ is turned on and the second transistor $T_{x2}$ is turned off, the voltage of BL1 is exerted on the outer ring electrode RE. The duration of the forming operation is in a range from about 90 s to about 110 s, such as 100 s in some embodiments. In some embodiments, the duration of the forming operation can be reduced with narrower gap between the outer ring electrode RE and the inner circular electrode CE, and can be reduced with improved oxide quality.

Figure 9D:
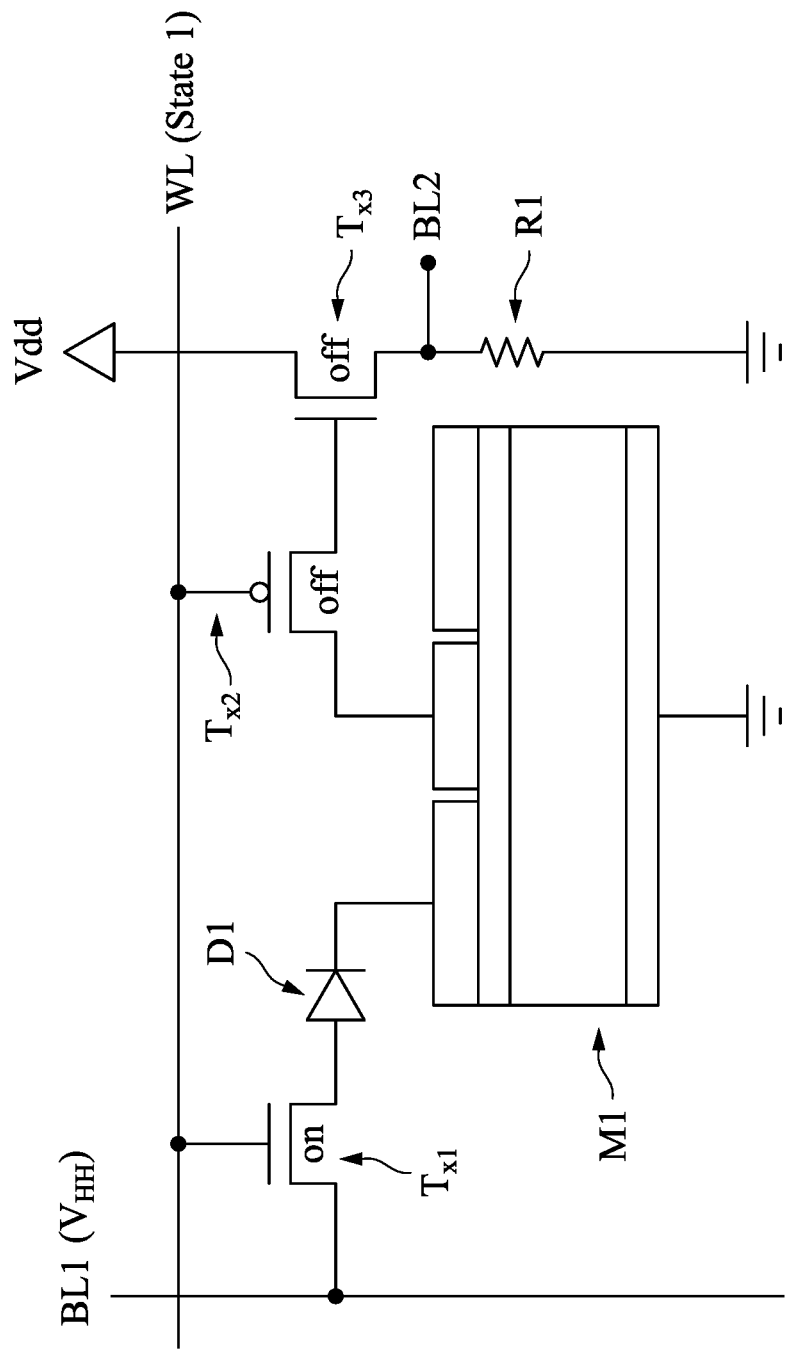

Reference is made to FIGS. 9A, 9B, and 9D, a write "1" operation is performed to the memory cell 10. The bit line BL1 is biased at a voltage level $V_{HH}$, such as about 1V. The word line WL is set to state 1 (e.g., high voltage level) so that the first transistor $T_{x1}$ is turned on and the second transistor $T_{x2}$ is turned off, the voltage of BL1 is exerted on the outer ring electrode RE. The duration of the write "1" operation is in a range from about 10 ms to about 30 ms, such as 20 ms in some embodiments.

Figure 9E:
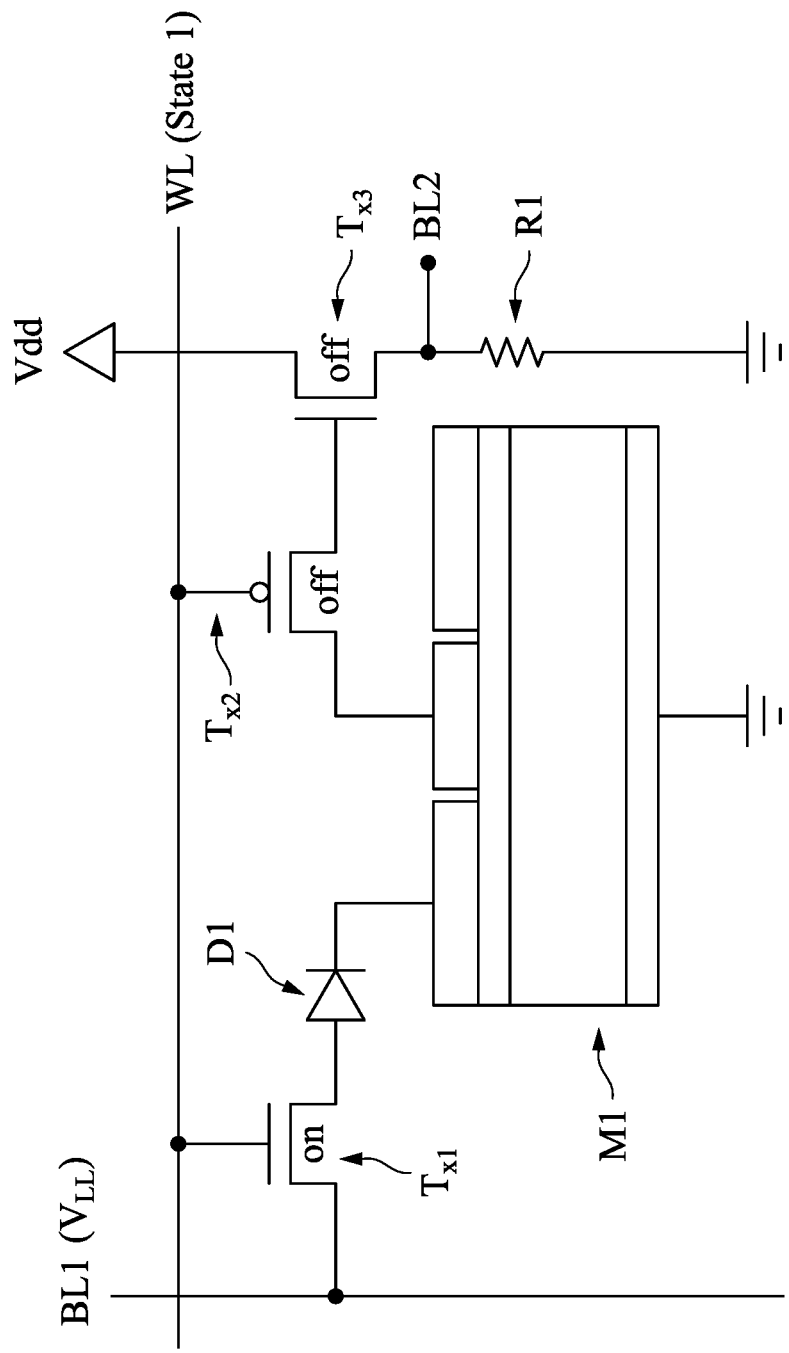

Reference is made to FIGS. 9A, 9B, and 9E, a write "0" operation is performed to the memory cell 10. The bit line BL1 is biased at a voltage level $V_{LL}$, such as 0V. The word line WL is set to state 1 (e.g., high voltage level) so that the first transistor $T_{x1}$ is turned on and the second transistor $T_{x2}$ is turned off, the voltage of BL1 is exerted on the outer ring electrode RE. The duration of the write "0" operation is in a range from about 10 ms to about 30 ms, such as 20 ms in some embodiments.

Figure 9F:
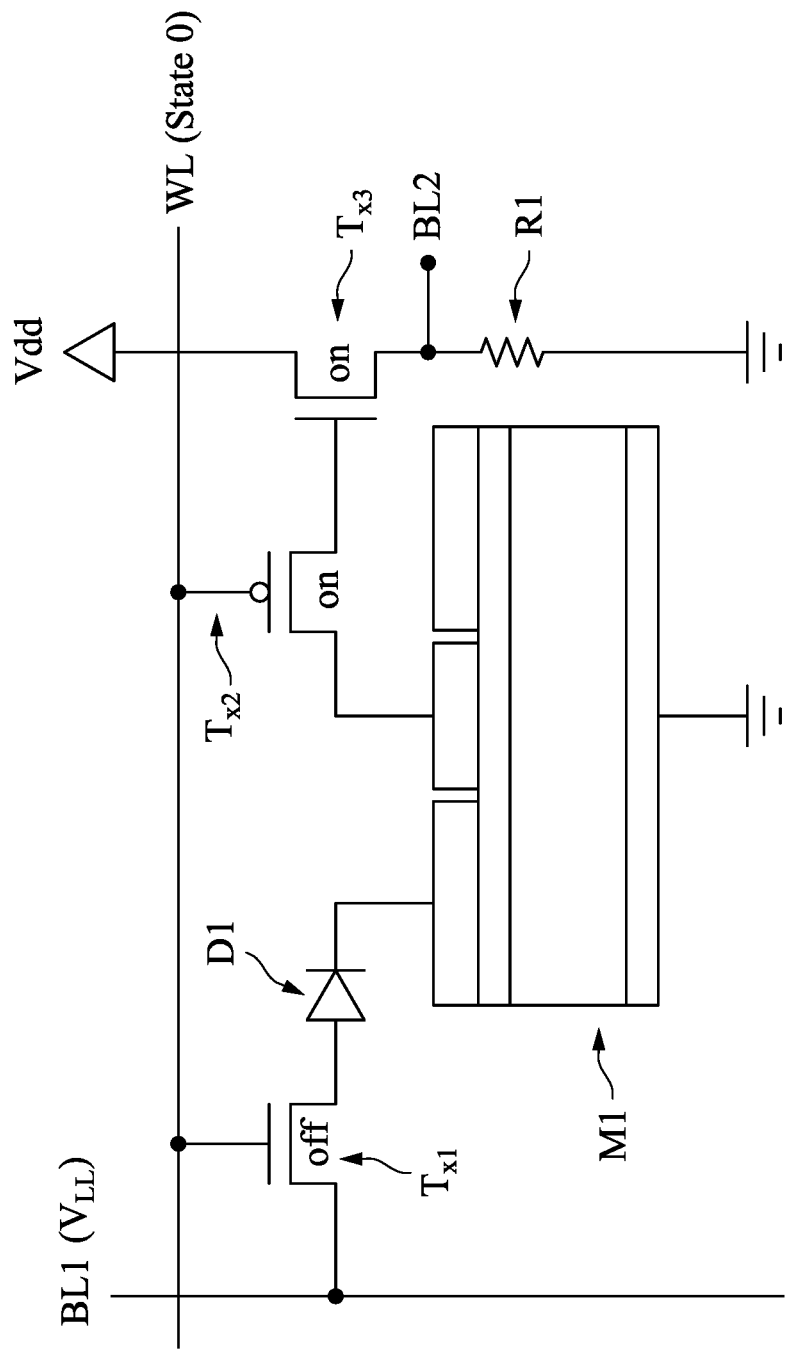

Reference is made to FIGS. 9A, 9B, and 9F, a read "1" operation is performed to the memory cell 10. The word line WL is set to state 0 (e.g., low voltage level) so that the first transistor $T_{x1}$ is turned off and the second transistor $T_{x2}$ is turned on, the high voltage on the inner circular electrode CE turns the third transistor $T_{x3}$ on and the bit line BL2 is pulled to a high voltage level. The duration of the read "1" operation is in a range from about 10 ms to about 30 ms, such as 20 ms in some embodiments.

Figure 9G:
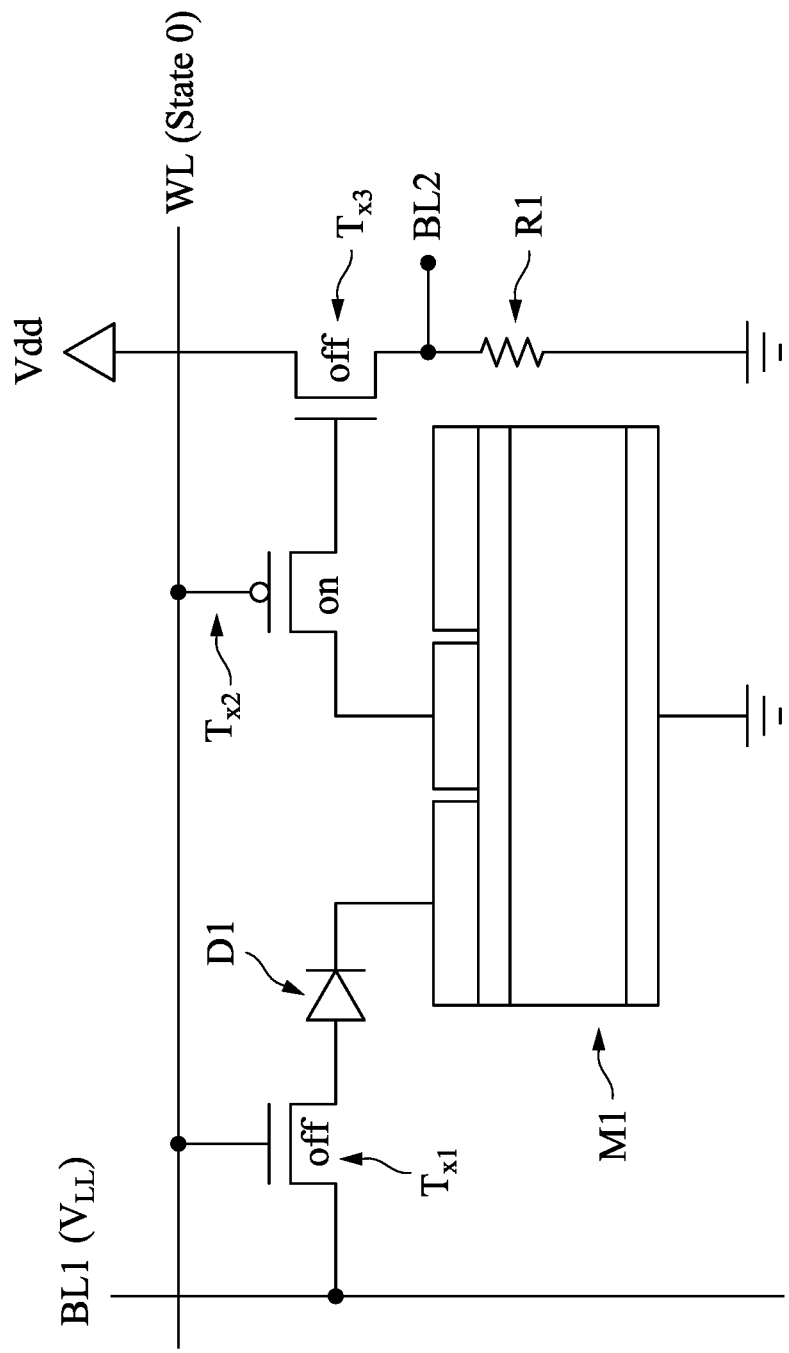

Reference is made to FIGS. 9A, 9B, and 9G, a read "0" operation is performed to the memory cell 10. The word line WL is set to state 0 (e.g., low voltage level) so that the first transistor $T_{x1}$ is turned off and the second transistor $T_{x2}$ is turned on, the low voltage on the inner circular electrode CE is unable to turn the third transistor $T_{x3}$ on and the bit line BL2 is remain at a low voltage level. The duration of the read "0" operation is in a range from about 10 ms to about 30 ms, such as 20 ms in some embodiments.

Figure 10A:
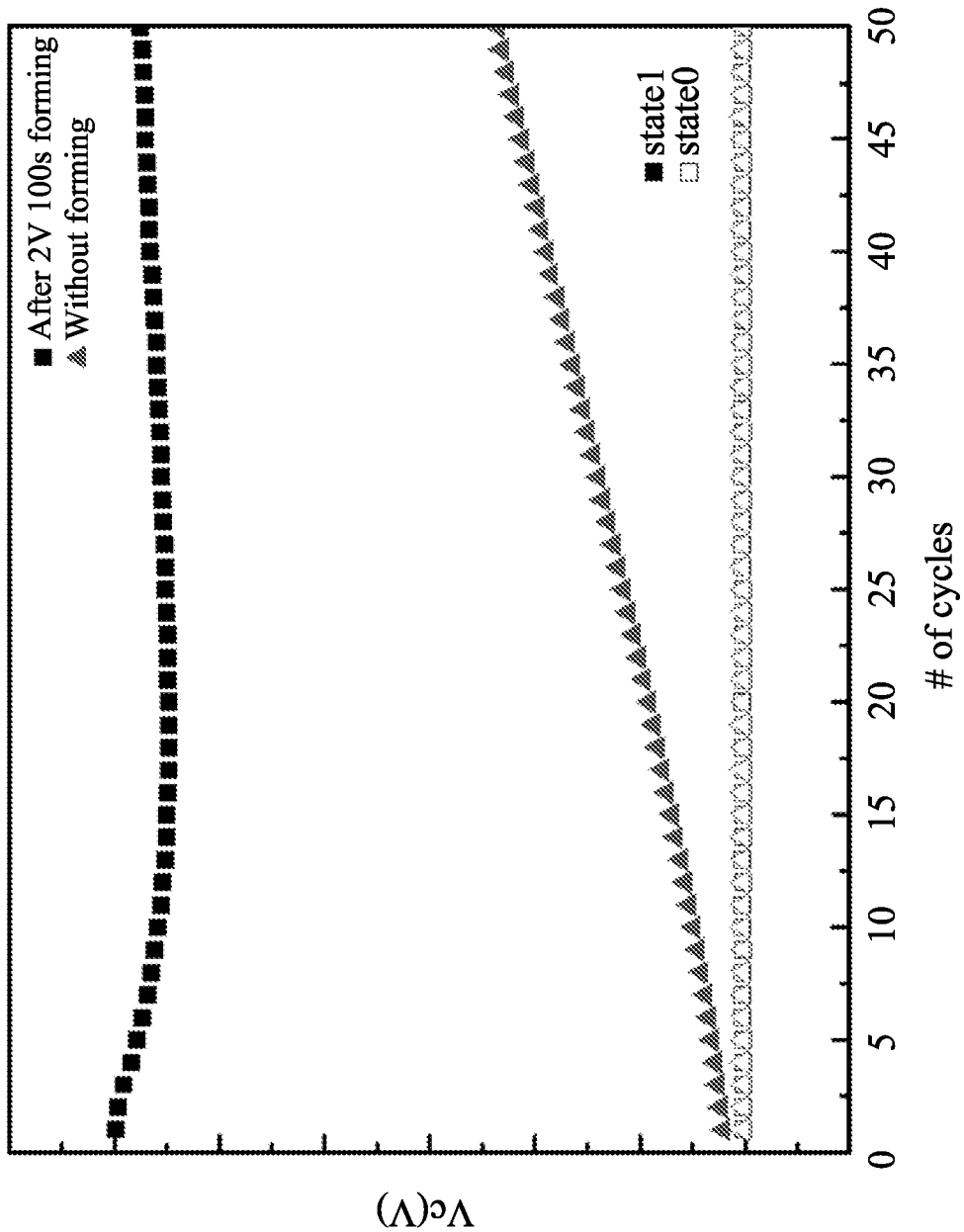
FIG. 10A illustrates a comparison of the measured voltage at the inner circular electrode with and without a forming process in accordance with some embodiments of the present disclosure.
Figure 10B:
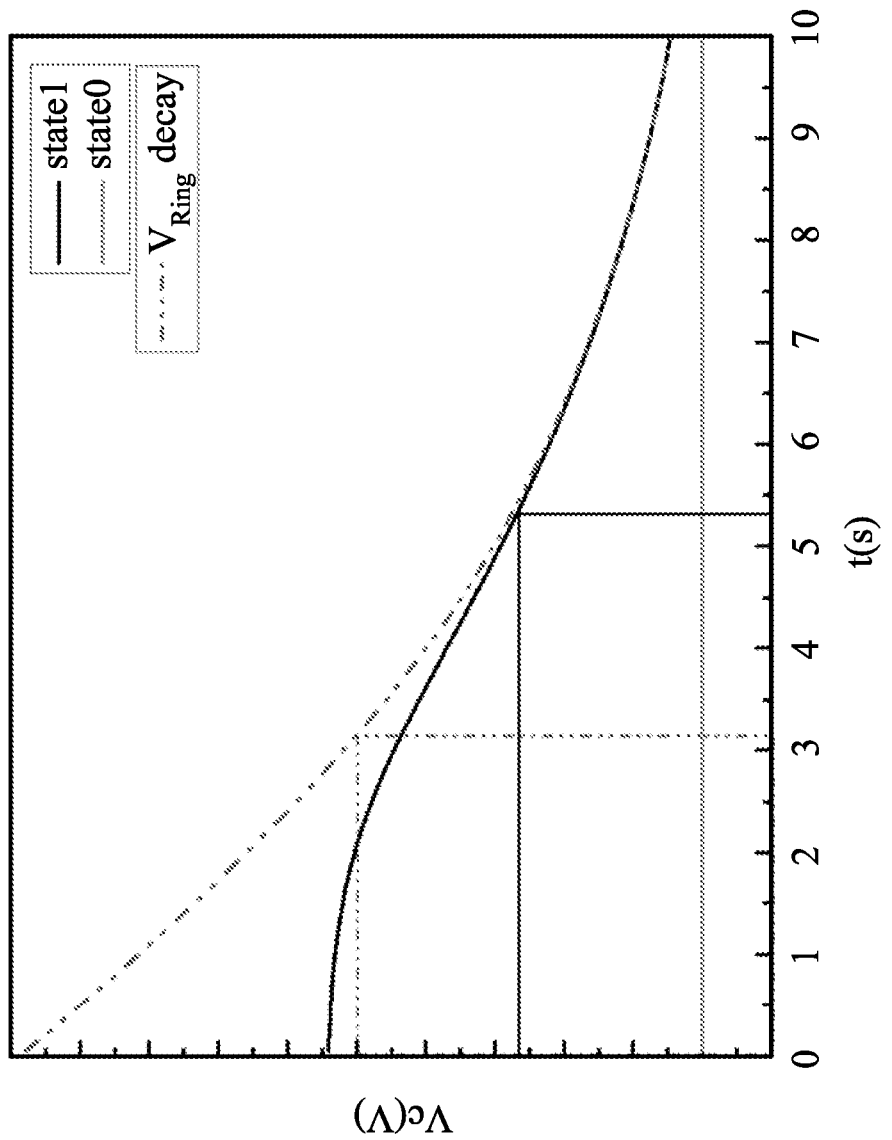
FIG. 10B illustrates a retention behavior of a memory device in accordance with some embodiments of the present disclosure.

FIG. 10A illustrates a comparison of the measured voltage at the inner circular electrode with and without a forming process in accordance with some embodiments of the present disclosure. FIG. 10B illustrates a retention behavior of a memory device in accordance with some embodiments of the present disclosure.

In FIG. 10A, it is observed that the read state in the memory device with forming operation is more stable than the memory device without performing a forming operation. Furthermore, the memory window of the memory device with forming operation is also increased.

In FIG. 10B, the retention time is calculated to be about 5.3 s. The retention time of the proposed memory may be enlarged by using the MISTD structure of present disclosure. For example, if the inner circular electrode CE of the MISTD is omitted, the structure only with ring electrode RE may be similar to a conventional 1T1C DRAM cell with the ring electrode RE as the capacitance. However, as shown in FIG. 10B, the retention of a single ring electrode RE is also shown and calculated to be only about 3.2 s. Accordingly, it can be seen that by using the MISTD structure, the retention time may be increased.

Figure 11:
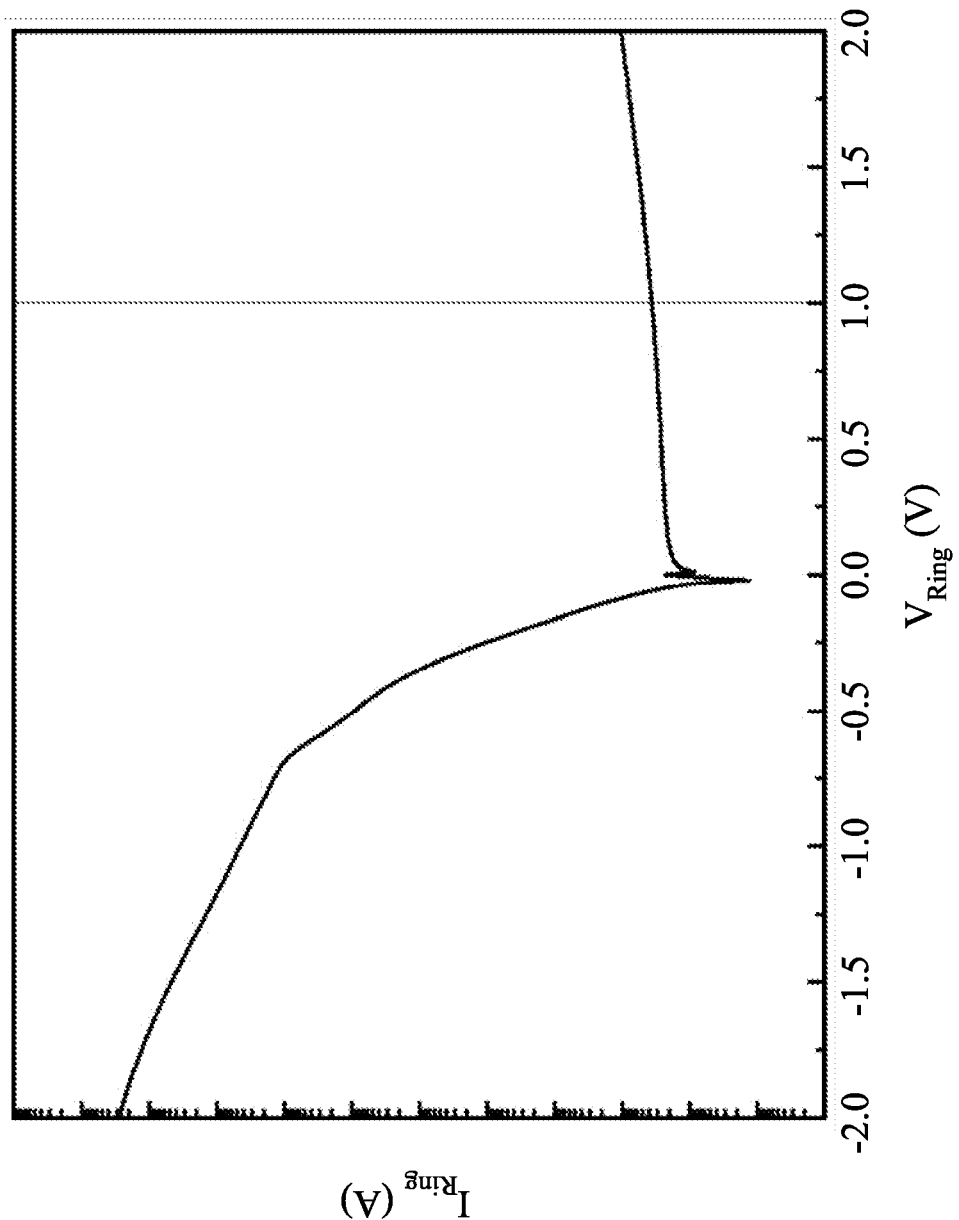
FIG. 11 illustrates an I-V curve of a memory device in accordance with some embodiments of the present disclosure.

FIG. 11 illustrates an I-V curve of a memory device in accordance with some embodiments of the present disclosure. As shown in FIG. 11, due to Schottky barrier modulation effect, the thinner the oxide (e.g., 22.8 Å in this case) the lower the current. Therefore the power consumption of a memory cycle is very low. Furthermore, the thinner the oxide the lower the power consumption will be.

Figure 12:
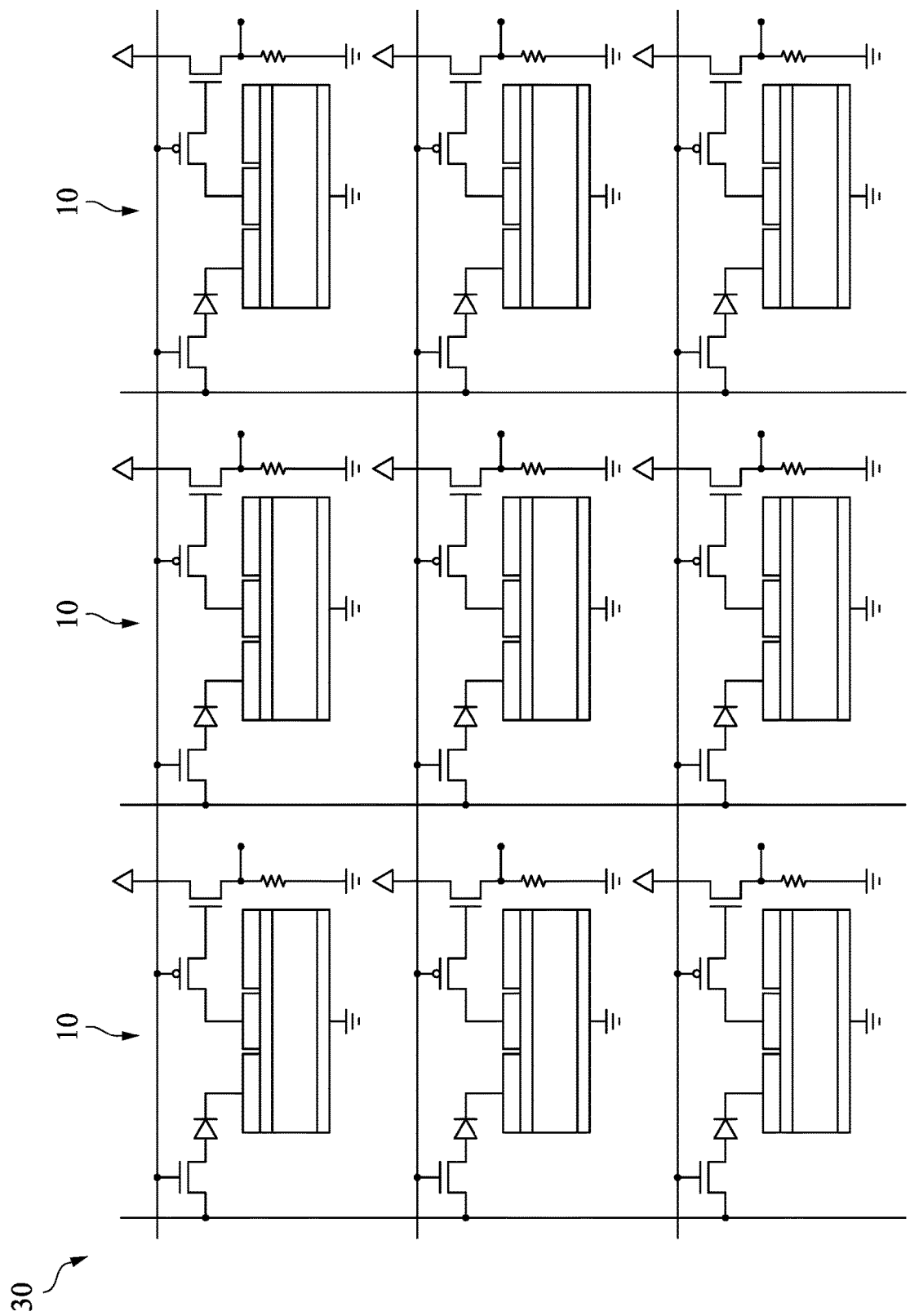
FIG. 12 illustrates a memory circuit in accordance with some embodiments of the present disclosure.

FIG. 12 illustrates a memory circuit in accordance with some embodiments of the present disclosure. The memory circuit 30 includes a plurality of memory cells 10, which is discussed in FIGS. 1 to 2B. The memory cells 10 are arranged as a set of rows and a set of rows.

FIGS. 13 to 44 show various stages of a sequential manufacturing operation of an integrated circuit structure according to an embodiment of the present disclosure. It is noted that FIGS. 13 to 44 illustrate a method of forming the memory device 20 as discussed in FIG. 3, similar elements are labeled the same throughout the discussion of FIGS. 13 to 44, and relevant details will not be repeated for brevity.

Figure 13:
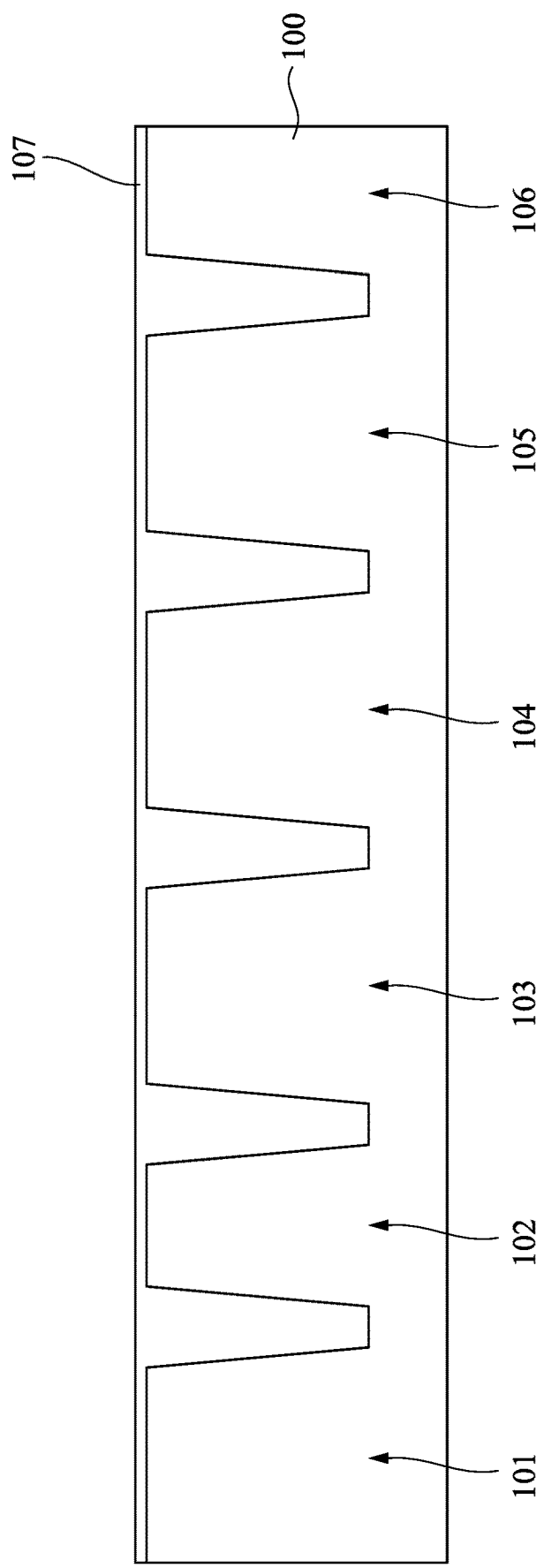
FIGS. 13 to 44 show various stages of a sequential manufacturing operation of an integrated circuit structure according to an embodiment of the present disclosure.

Reference is made to FIG. 13. A substrate 100 is provided. An etching process is performed to remove portions of the substrate 100, such that a plurality of protrusion regions 101, 102, 103, 104, 105, and 106 are formed. Afterward, a dielectric layer 107 is deposited over the substrate 100 and overfilling the trenches within the protrusion regions 101, 102, 103, 104, 105, and 106. In some embodiments, the dielectric layer 107 is made of oxide (e.g., silicon oxide), and may be formed by deposition process, such as CVD, flowable CVD, PVD, ALD, or other suitable deposition processes. In some embodiments, a chemical mechanism polishing (CMP) process may be performed to planarize the top surface of the dielectric layer 107, such that the dielectric layer 107 may include a thin layer covering top surfaces of the protrusion regions 101, 102, 103, 104, 105, and 106.

Figure 14:
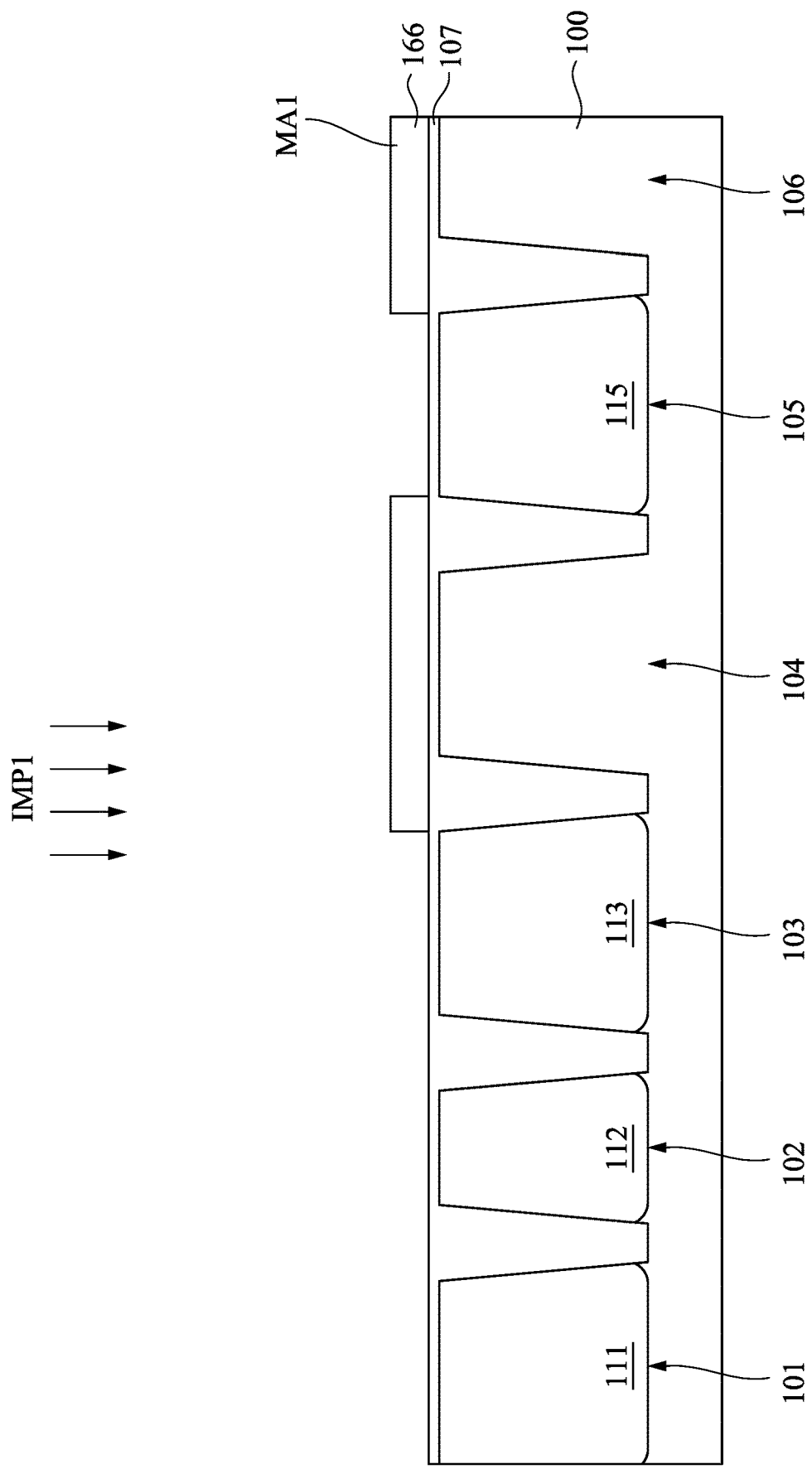

Reference is made to FIG. 14. A patterned mask MA1 is formed over the substrate 100. The patterned mask MA1 may include openings that expose the protrusion regions 101, 102, 103, and 105. Afterward, an implantation process IMP1 is performed to form P-well regions 111, 112, 113, and 115 in the protrusion regions 101, 102, 103, and 105, respectively. In some embodiments, the implantation process IMP1 may include ion implantation, thermal diffusion, or other suitable technique. In some embodiments, during the implantation process IMP1, the protrusion regions 104 and 106 are protected by the patterned mask MA1, and thus the implants of the implantation process IMP1 may not be doped in these regions. In some embodiments, the patterned mask MA1 may be a photoresist.

Figure 15:
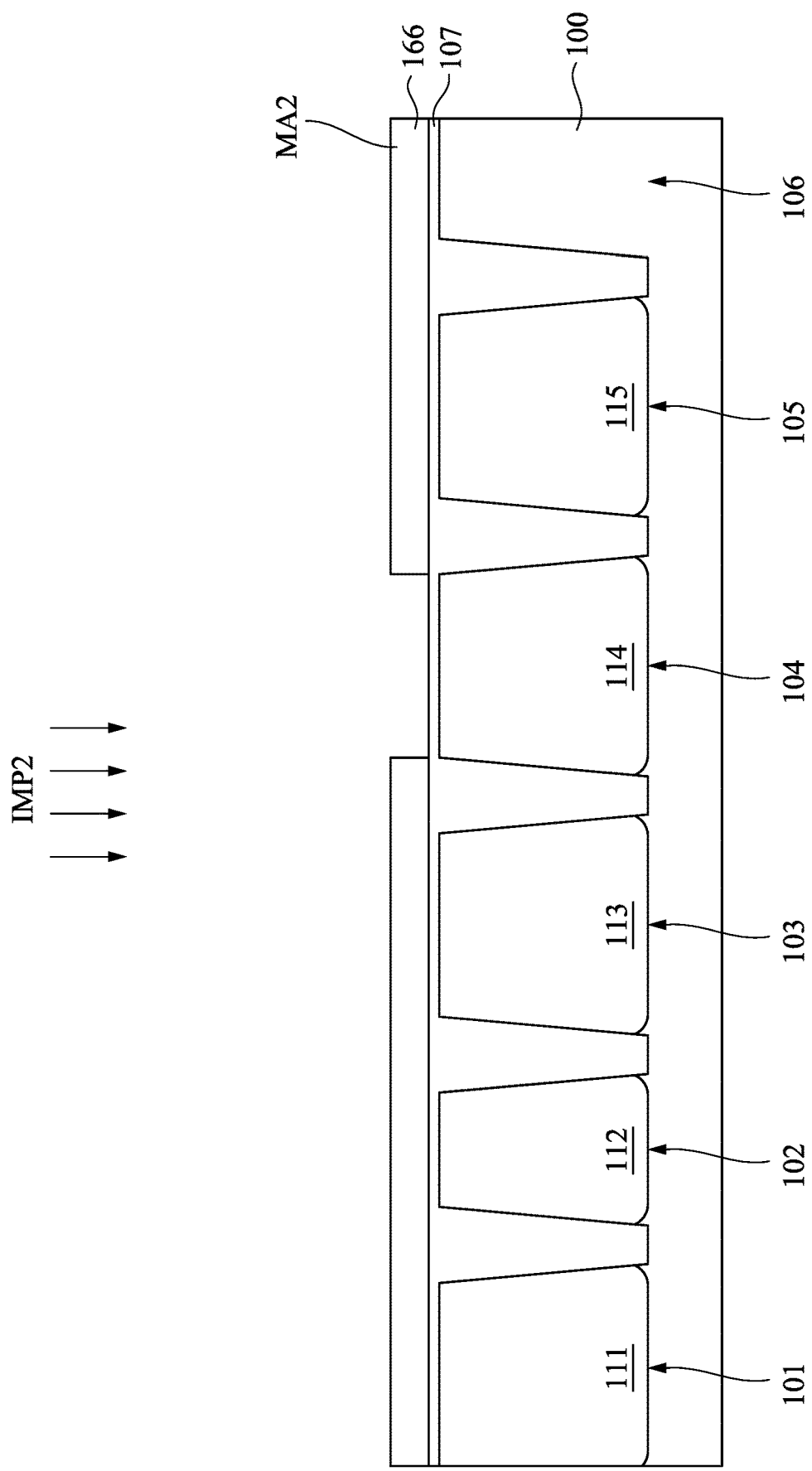

Reference is made to FIG. 15. After the implantation process IMP1 of FIG. 14 is completed, the patterned mask MA1 is removed. A patterned mask MA2 is formed over the substrate 100. The patterned mask MA2 may include an opening that exposes the protrusion region 104. Afterward, an implantation process IMP2 is performed to form an N-well region 114 in the protrusion region 104. In some embodiments, the implantation process IMP2 may include ion implantation, thermal diffusion, or other suitable technique. In some embodiments, during the implantation process IMP2, the protrusion regions 101, 102, 103, 105, and 106 are protected by the patterned mask MA2, and thus the implants of the implantation process IMP2 may not be doped in these regions. In some embodiments, the patterned mask MA2 may be a photoresist.

Figure 16:
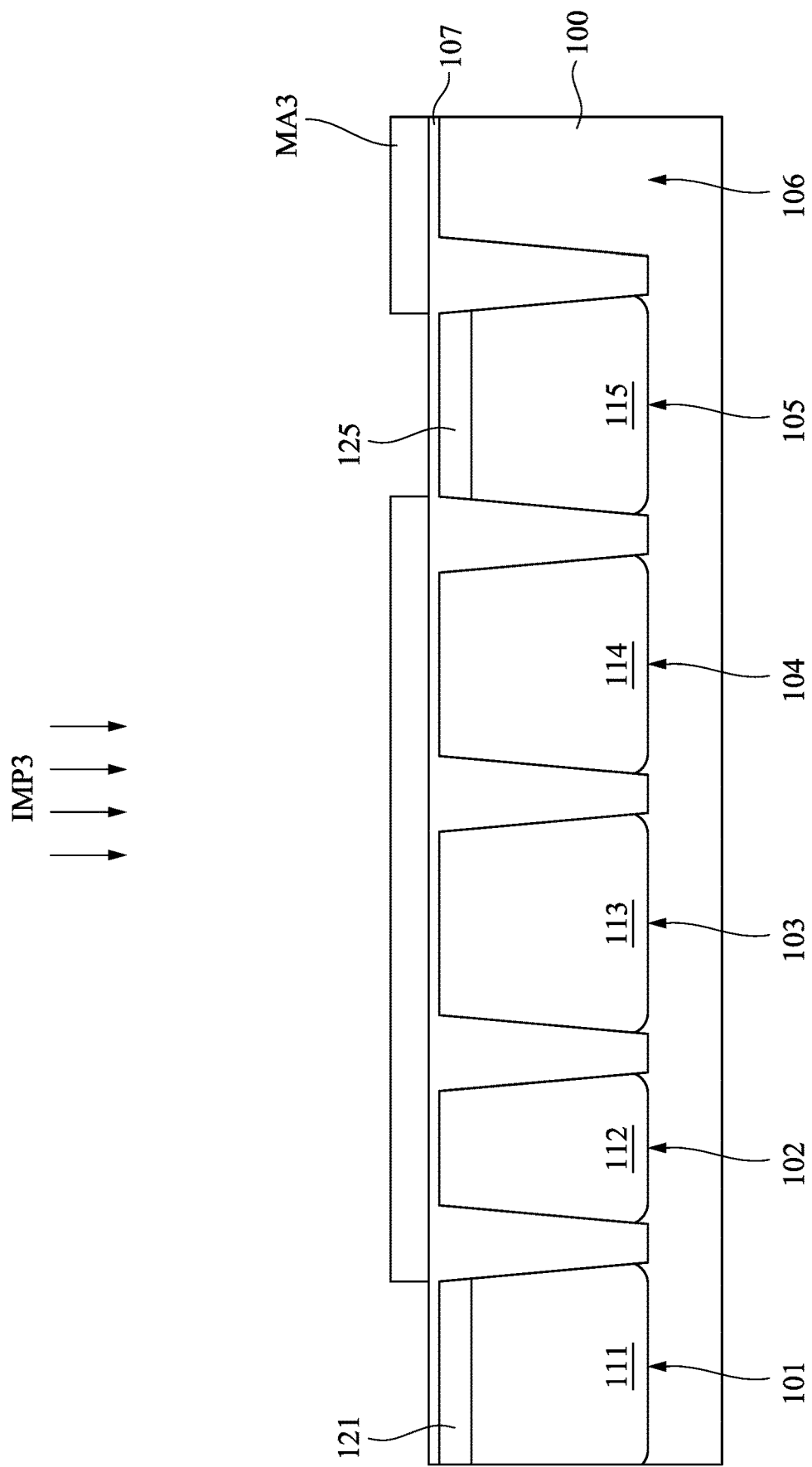

Reference is made to FIG. 16. After the implantation process IMP2 of FIG. 15 is completed, the patterned mask MA2 is removed. A patterned mask MA3 is formed over the substrate 100. The patterned mask MA3 may include openings that expose the protrusion regions 101 and 105. Afterward, an implantation process IMP3 is performed to form P-doped regions 121 and 125 in surface portion of the P-well region 111 of the protrusion region 101 and in surface portion of the P-well region 115 of the protrusion region 105, respectively. The P-doped regions 121 and 125 may act as channel regions of transistors formed in later steps (e.g., the first transistor $T_{x1}$ and the third transistor $T_{x3}$ in FIG. 24). In some embodiments, the implantation process IMP3 may include ion implantation, thermal diffusion, or other suitable technique. The implantation process IMP3 can also adjust the threshold voltage (Vth) of the transistors formed in later steps (e.g., the first transistor $T_{x1}$ and the third transistor $T_{x3}$ in FIG. 24), and thus the implantation process IMP3 can also be referred to as a Vth adjustment implantation process. In some embodiments, during the implantation process IMP3, the protrusion regions 102, 103, 104, and 106 are protected by the patterned mask MA3, and thus the implants of the implantation process IMP3 may not be doped in these regions. In some embodiments, the patterned mask MA3 may be a photoresist.

Figure 17:
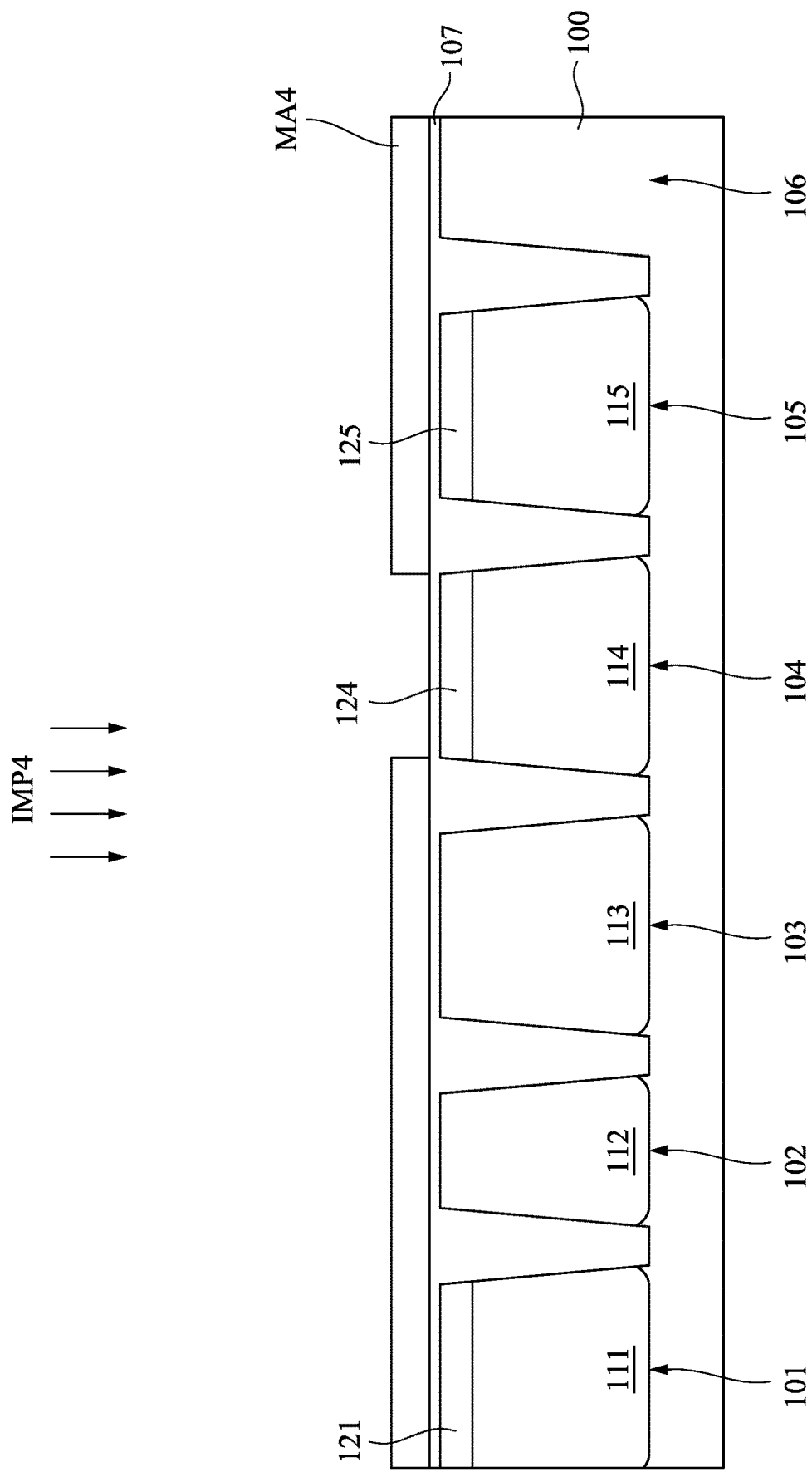

Reference is made to FIG. 17. After the implantation process IMP3 of FIG. 16 is completed, the patterned mask MA3 is removed. A patterned mask MA4 is formed over the substrate 100. The patterned mask MA4 may include an opening that exposes the protrusion region 104. Afterward, an implantation process IMP4 is performed to form an N-doped region 124 in surface portion of the N-well region 114 of the protrusion region 104. The N-doped region 124 may act as a channel region of a transistor formed in later steps (e.g., the second transistor $T_{x2}$ in FIG. 23). In some embodiments, the implantation process IMP4 may include ion implantation, thermal diffusion, or other suitable technique. The implantation process IMP4 can also adjust the threshold voltage (Vth) of the transistor formed in later steps (e.g., the second transistor $T_{x2}$ in FIG. 23), and thus the implantation process IMP4 can also be referred to as a Vth adjustment implantation process. In some embodiments, during the implantation process IMP4, the protrusion regions 101, 102, 103, 105, and 106 are protected by the patterned mask MA4, and thus the implants of the implantation process IMP4 may not be doped in these regions. In some embodiments, the patterned mask MA4 may be a photoresist.

Figure 18:
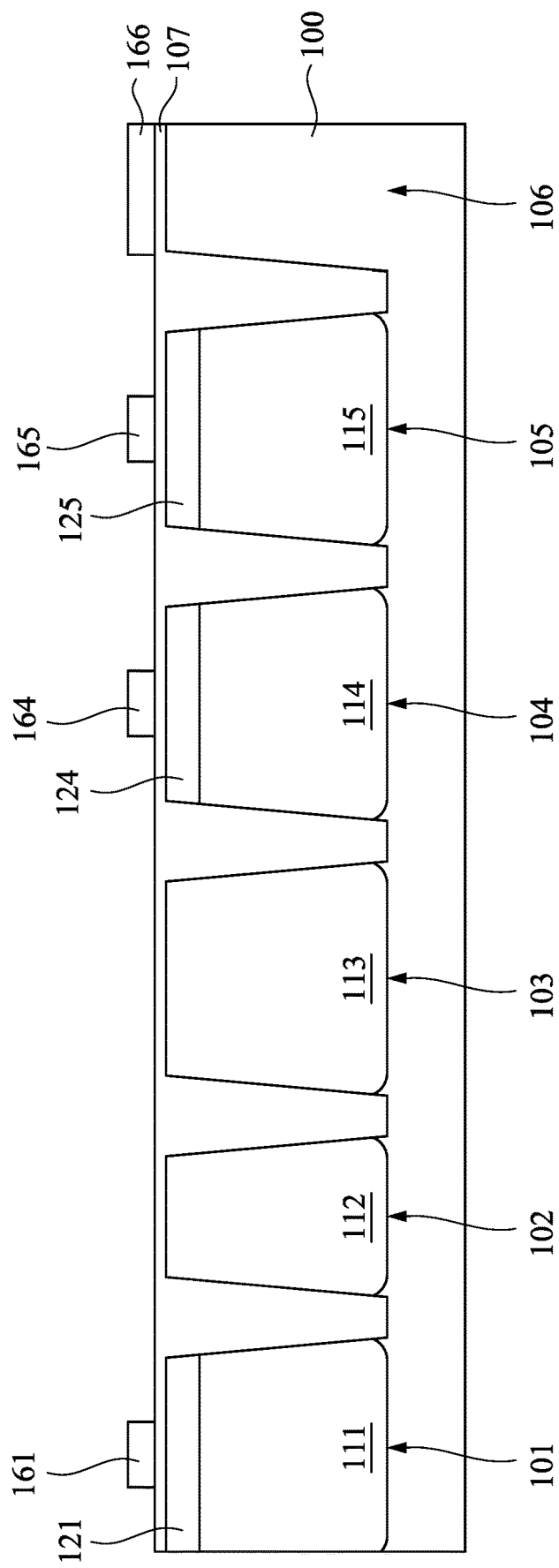

Reference is made to FIG. 18. After the implantation process IMP4 of FIG. 17 is completed, the patterned mask MA4 is removed. Gate conductors 161, 164, and 165, and a resistor element 166 are formed over the protrusion regions 101, 104, 105, and 106, respectively. In some embodiments, the gate conductors 161, 164, and 165, and the resistor element 166 may be formed by, for example, depositing a conductive layer blanket over the substrate 100, forming a patterned mask that exposes unwanted portions of the conductive layer, and performing an etching process to remove the unwanted portions of the conductive layer. As a result, the remaining portions of the conductive layer over the protrusion regions 101, 104, 105, and 106 are referred to as the gate conductors 161, 164, and 165, and the resistor element 166, respectively. In some embodiments, the gate conductors 161, 164, and 165, and the resistor element 166 may be deposited using suitable method such as CVD, plasma-enhanced CVD (PECVD), atomic layer deposition (ALD), plasma-enhanced ALD (PEALD) or the like.

Figure 19:
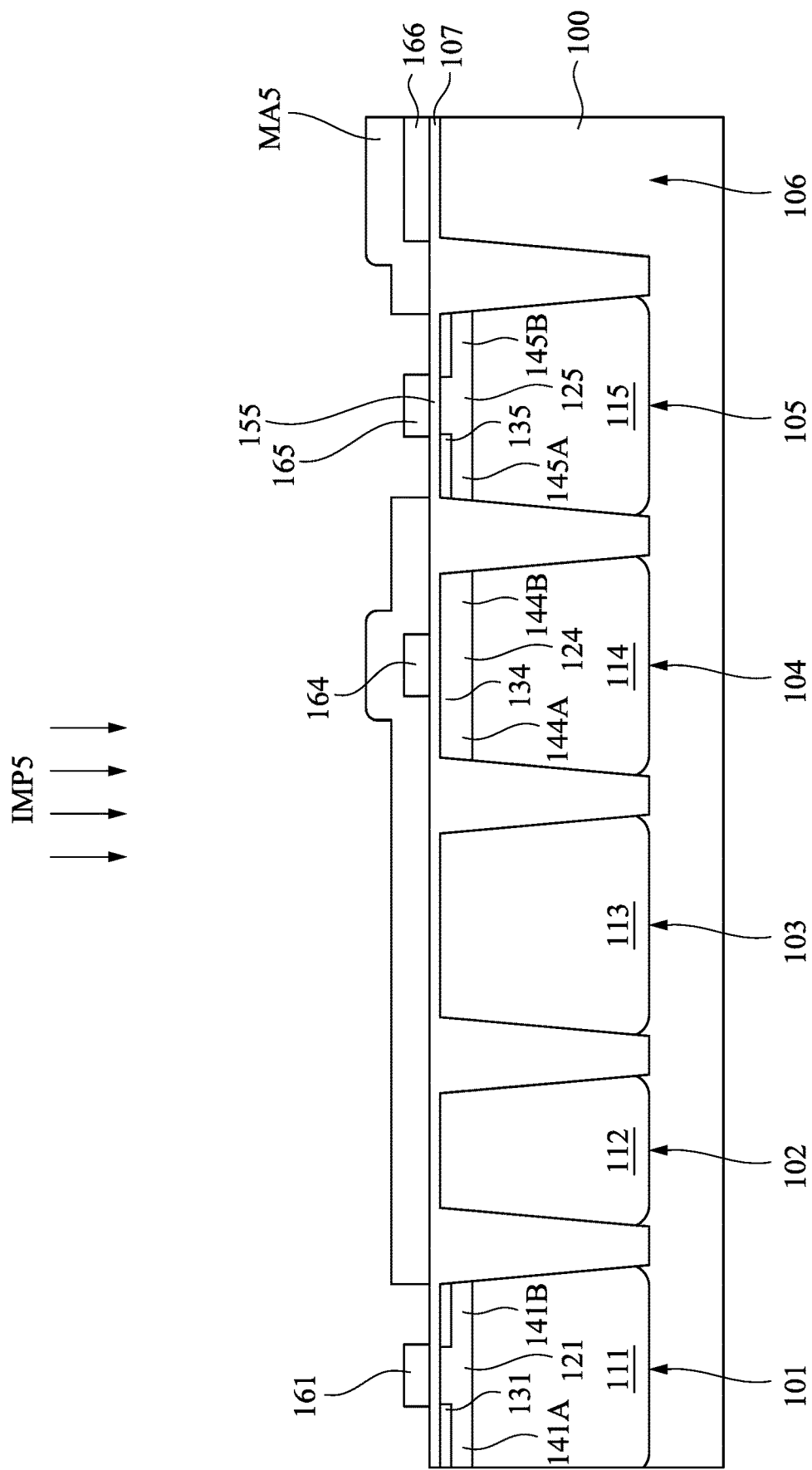

Reference is made to FIG. 19. A patterned mask MA5 is formed over the substrate 100. The patterned mask MA5 may include openings that expose the protrusion regions 101 and 105. Afterward, an implantation process IMP5 is performed to form lightly-doped (LDD) regions 131 and 135 in the protrusion regions 101 and 105, respectively. In some embodiments, during the implantation process IMP5, the gate conductors 161 and 165 may also act as masks that protect the underlying protrusion regions 101 and 105. Accordingly, the LDD regions 131 are formed on opposite sides of the gate conductor 161, and the LDD regions 135 are formed on opposite sides of the gate conductor 165. In some embodiments, the implantation process IMP5 may include ion implantation, thermal diffusion, or other suitable technique. In some embodiments, the patterned mask MA5 may be a photoresist.

Figure 20:
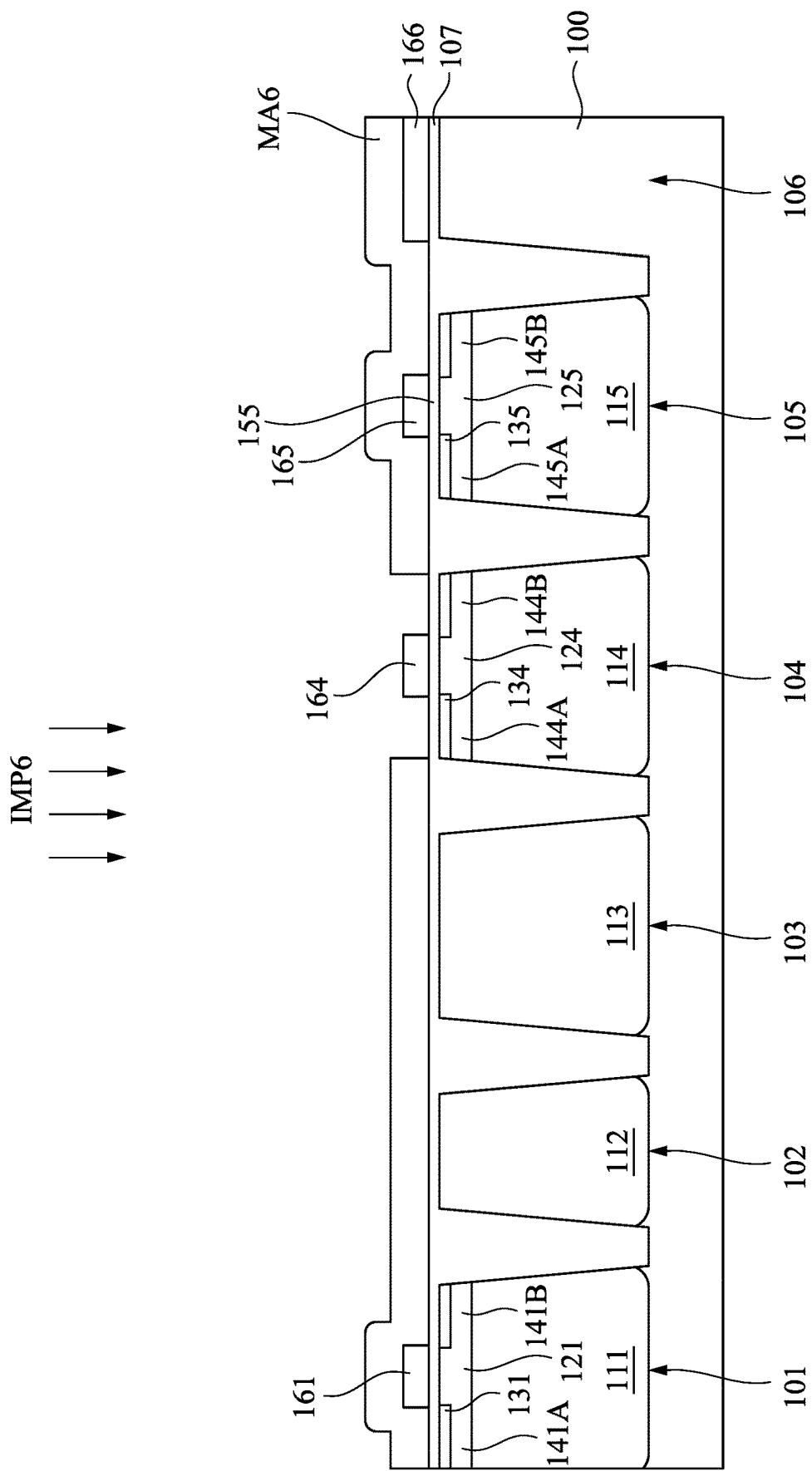

Reference is made to FIG. 20. After the implantation process IMP5 of FIG. 19 is completed, the patterned mask MA5 is removed. A patterned mask MA6 is formed over the substrate 100. The patterned mask MA6 may include an opening that exposes the protrusion region 104. Afterward, an implantation process IMP6 is performed to form lightly-doped (LDD) regions 134 in the protrusion region 104. In some embodiments, during the implantation process IMP6, the gate conductor 164 may also act as a mask that protects the underlying protrusion region 104. Accordingly, the LDD regions 134 are formed on opposite sides of the gate conductor 164. In some embodiments, the implantation process IMP6 may include ion implantation, thermal diffusion, or other suitable technique. In some embodiments, the patterned mask MA6 may be a photoresist.

Figure 21:
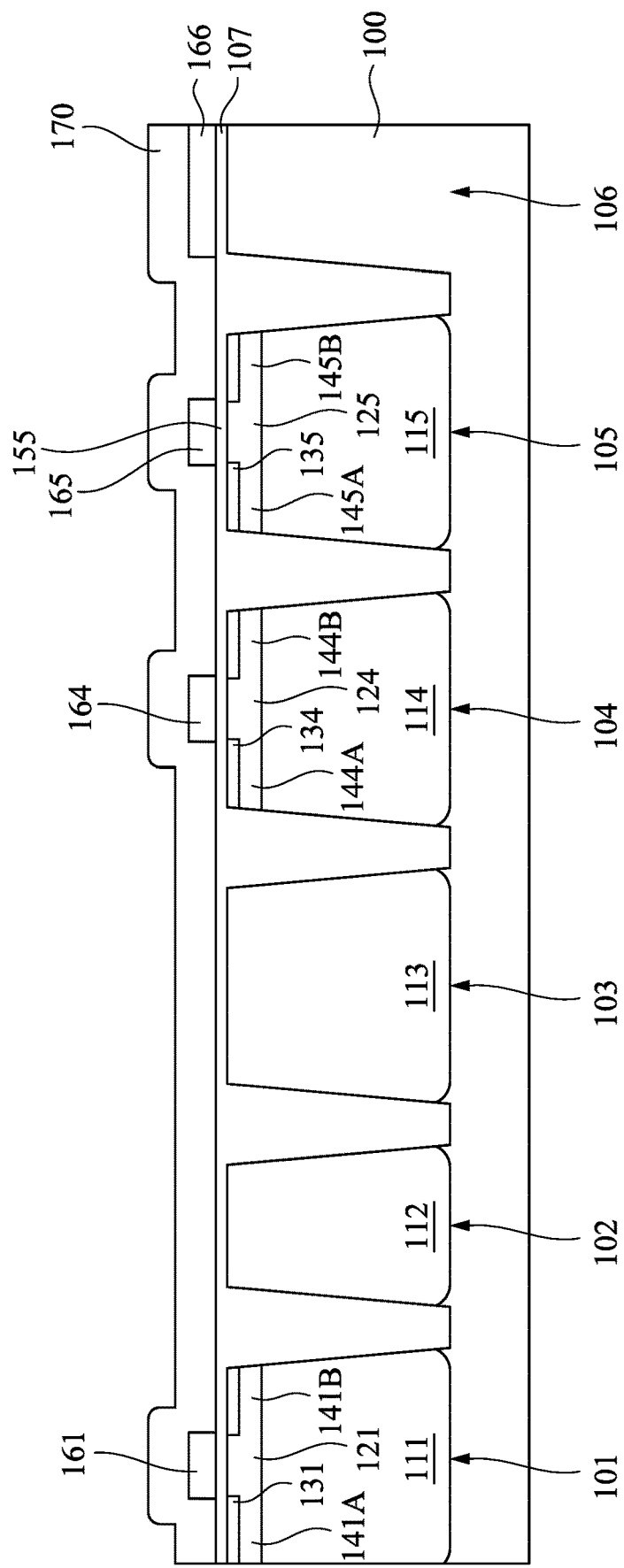

Reference is made to FIG. 21. After the implantation process IMP6 of FIG. 20 is completed, the patterned mask MA6 is removed. A spacer layer 170 is deposited blanket over the substrate 100. The spacer layer 170 may be deposited using suitable method, such as CVD, plasma-enhanced CVD (PECVD), atomic layer deposition (ALD), plasma-enhanced ALD (PEALD) or the like.

Figure 22:
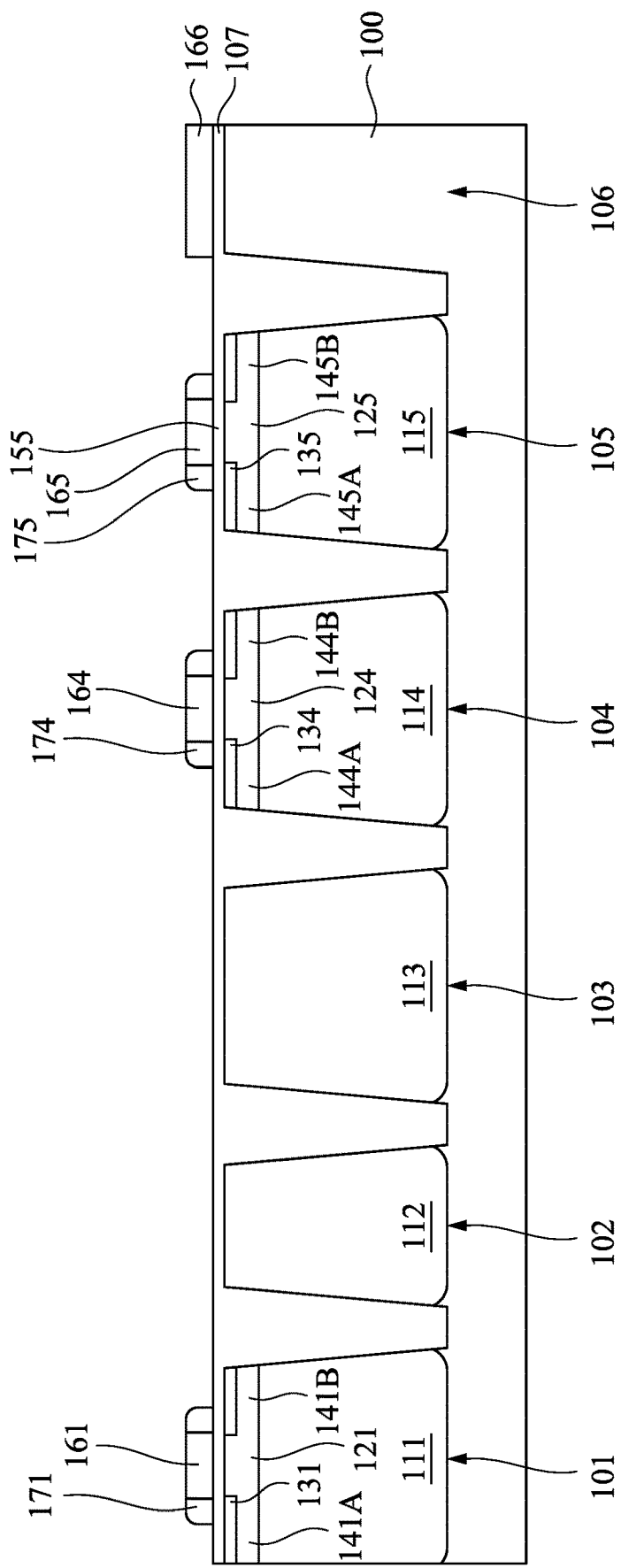

Reference is made to FIG. 22. An etching process is performed to remove horizontal portions of the spacer layer 170, while leaving vertical portions of the spacer layer 170 remaining on opposite sidewalls of the gate conductors 161, 164, and 165. In some embodiments, the remaining portions of the spacer layer 170 on sidewalls of the gate conductors 161, 164, and 165 can be referred to as gate spacers 171, 174, and 175, respectively. In some embodiments, the etching process may be an anisotropic etching process.

Figure 23:
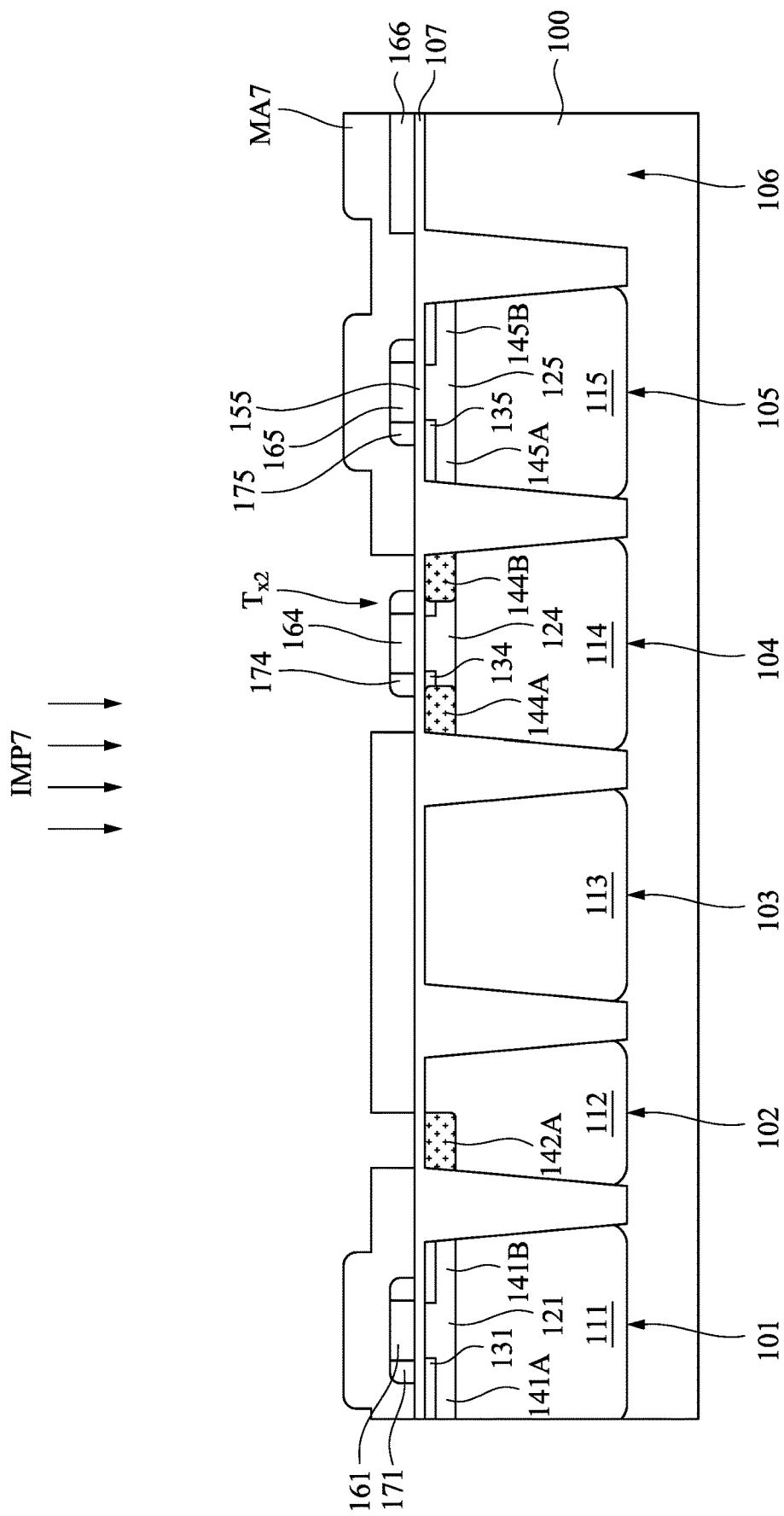

Reference is made to FIG. 23. A patterned mask MA7 is formed over the substrate 100. The patterned mask MA7 may include openings that expose a portion of the protrusion region 102, and the protrusion region 104. Afterward, an implantation process IMP7 is performed to form a P-doped region 142A in the exposed portion of the protrusion region 102, and to form source/drain regions 144A and 144B in the protrusion region 104. As a result, the second transistor $T_{x2}$ is formed. In some embodiments, during the implantation process IMP7, the gate conductor 164 and gate spacers 174 may also act as masks that protect the underlying protrusion region 104. Accordingly, the source/drain regions 144A and 144B may be formed self-aligned with the gate spacers 174. In some embodiments, the implantation process IMP7 may include ion implantation, thermal diffusion, or other suitable technique. In some embodiments, the patterned mask MA7 may be a photoresist.

Figure 24:
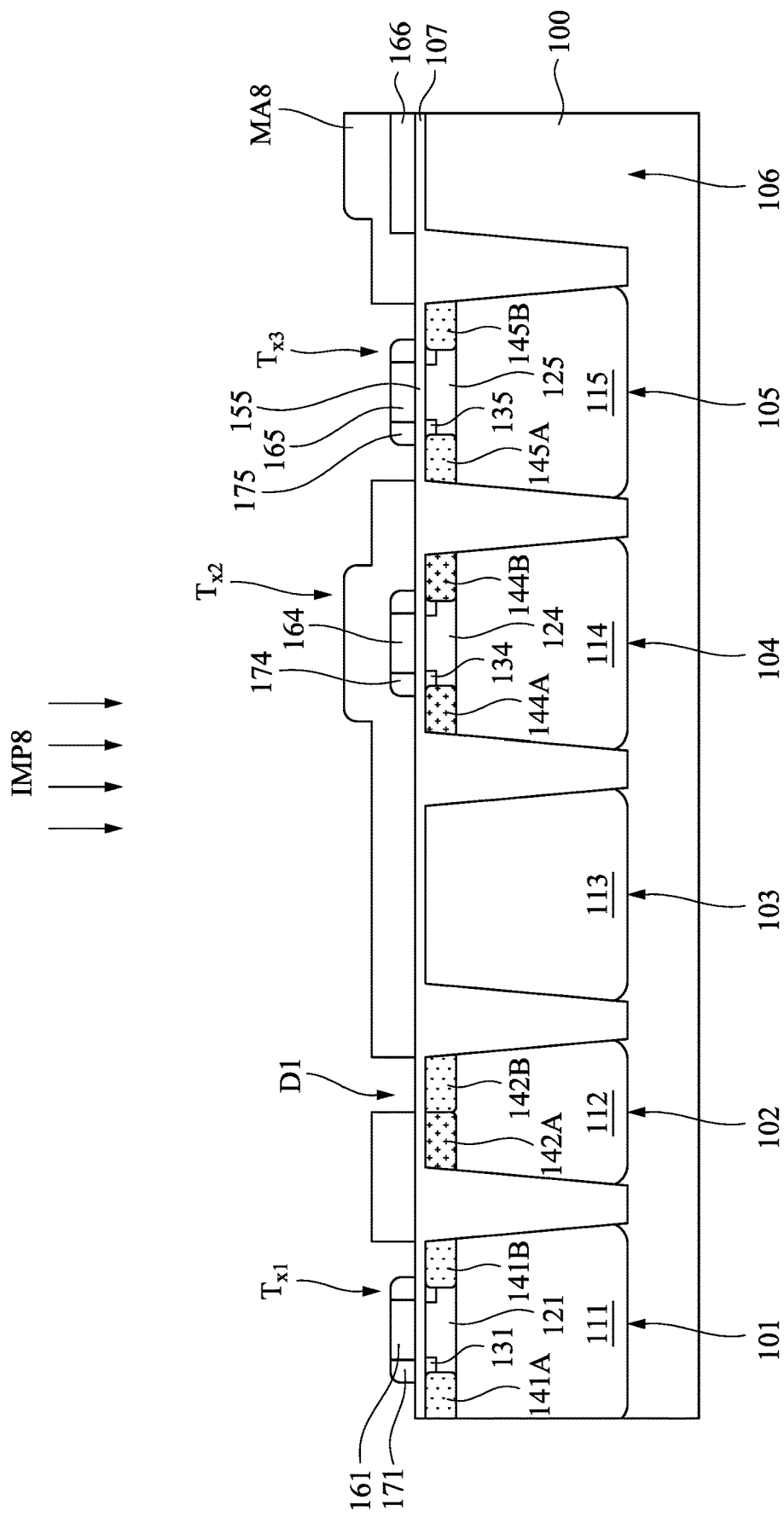

Reference is made to FIG. 24. After the implantation process IMP7 of FIG. 23 is completed, the patterned mask MA7 is removed. A patterned mask MA8 is formed over the substrate 100. The patterned mask MA8 may include openings that expose another portion of the protrusion region 102, and the protrusion regions 101 and 105. Afterward, an implantation process IMP8 is performed to form an N-doped region 142B in the exposed portion of the protrusion region 102, to form source/drain regions 141A and 141B in the protrusion region 102, and to form source/drain regions 145A and 145B in the protrusion region 105. As a result, the first transistor $T_{x1}$, the diode D1, and the third transistor $T_{x3}$ are formed. In some embodiments, during the implantation process IMP8, the gate conductors 161 and gate spacers 171 may also act as masks that protect the underlying protrusion region 101, and the gate conductors 165 and gate spacers 175 may also act as masks that protect the underlying protrusion region 105. Accordingly, the source/drain regions 141A and 141B may be formed self-aligned with the gate spacers 171, and the source/drain regions 145A and 145B may be formed self-aligned with the gate spacers 175. In some embodiments, the implantation process IMP8 may include ion implantation, thermal diffusion, or other suitable technique. In some embodiments, the patterned mask MA8 may be a photoresist.

In some embodiments, the implantation processes IMP1, IMP3, IMP6, and IMP7 discussed above may include same type dopants, such as P-type dopants. On the other hand, the implantation processes IMP2, IMP4, IMP5, and IMP8 discussed above may include same type dopants, such as N-type dopants.

Figure 25:
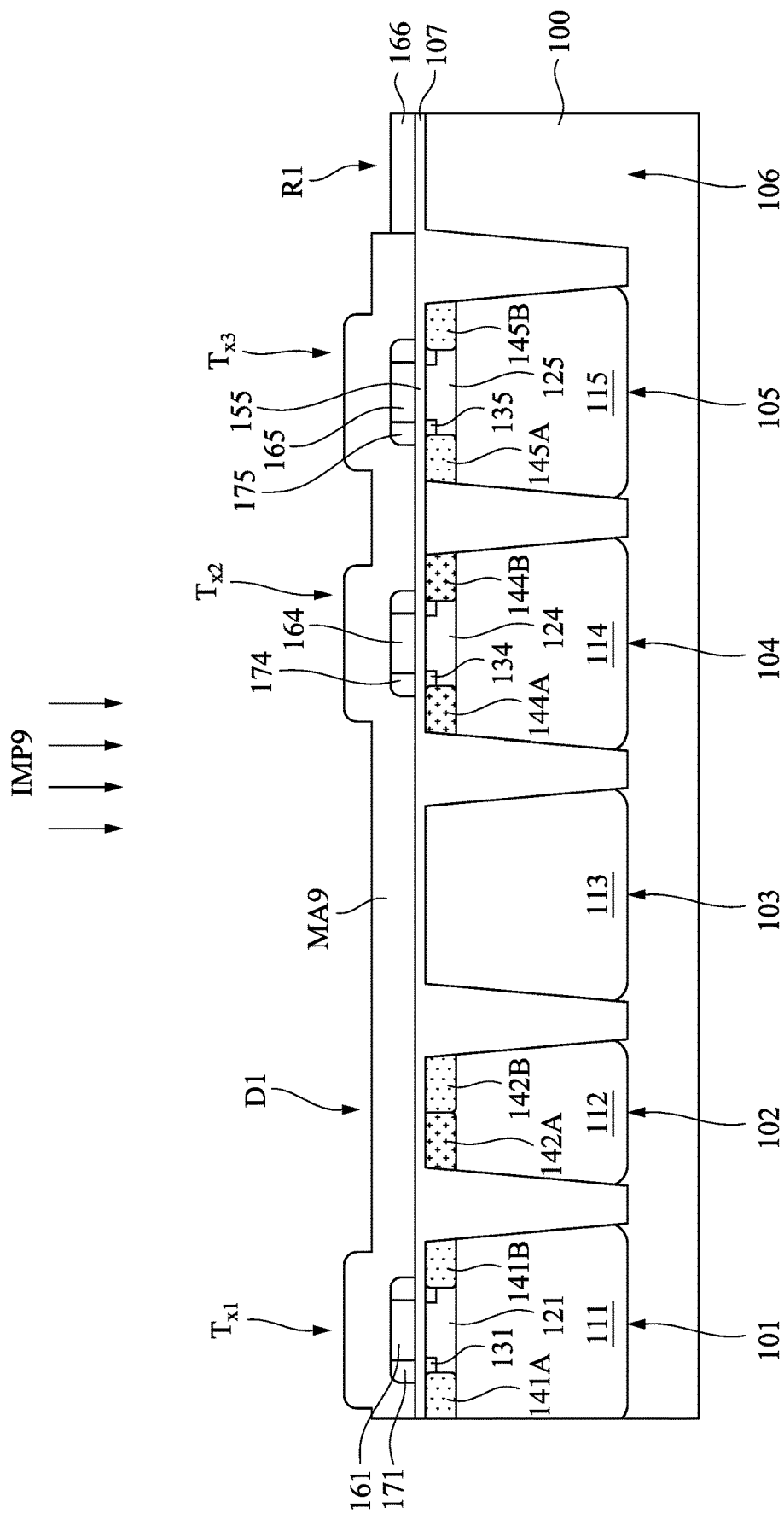

Reference is made to FIG. 25. After the implantation process IMP8 of FIG. 24 is completed, the patterned mask MA8 is removed. A patterned mask MA9 is formed over the substrate 100. The patterned mask MA9 may include an opening that exposes the resistor element 166. Afterward, an implantation process IMP9 is performed to the resistor element 166. In some embodiments, the implantation process IMP9 may include N-type or P-type dopants that are used to adjust the resistivity of the resistor element 166. Accordingly, the implantation process IMP9 can also be referred to as a resistivity adjustment implantation process. As a result, the resistor element R1 is formed. In some embodiments, the implantation process IMP9 may include ion implantation, thermal diffusion, or other suitable technique. In some embodiments, the patterned mask MA9 may be a photoresist.

Figure 26:
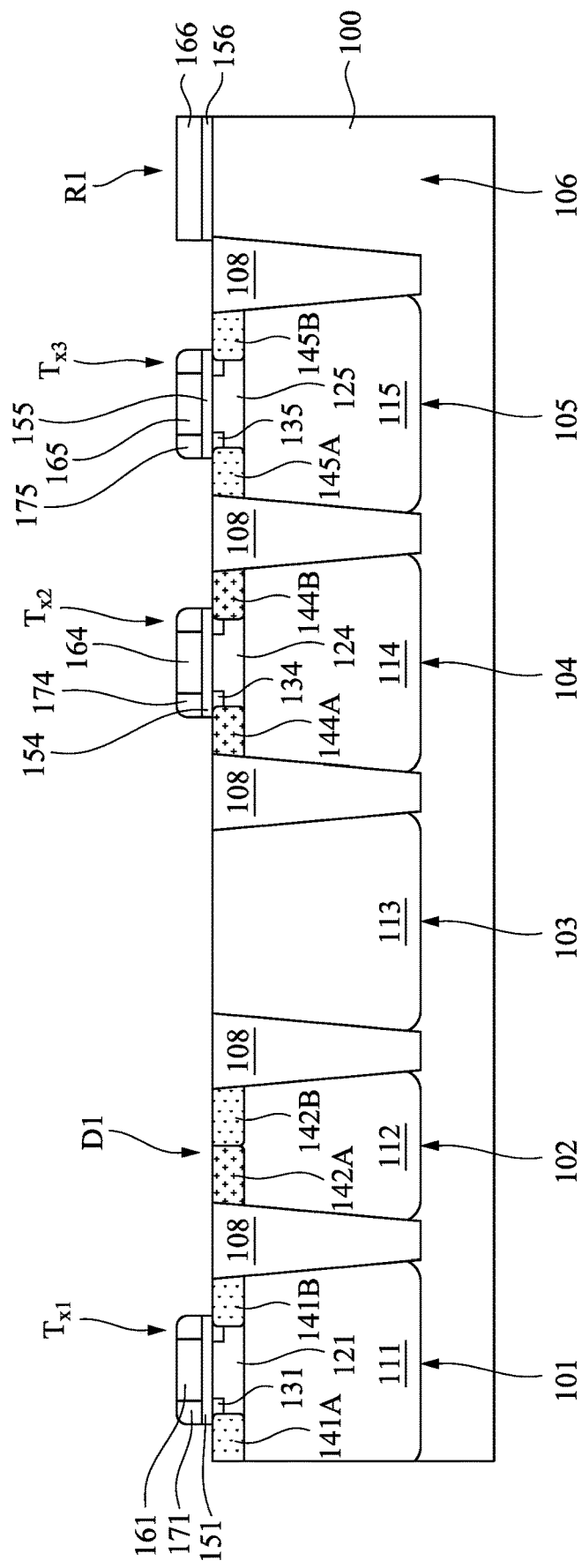

Reference is made to FIG. 26. After the implantation process IMP9 of FIG. 25 is completed, the patterned mask MA9 is removed. An etching process is performed to remove portions of the exposed dielectric layer 107. In greater details, the etching process is performed by using the gate conductors 161, 164, 165, the gate spacers 171, 174, 175, and the resistor element 166 as etch masks. As a result of the etching process, the source/drain regions 141A, 141B, 144A, 144B, 145A, 145B, the P-doped region 142A, the N-doped region 142B, and the top surface of the protrusion region 103 are exposed. The remaining portions of the dielectric layer 107 within the protrusion regions 101, 102, 103, 104, 105, and 106 can be referred to as the isolation structures 108, in which the top surfaces of the isolation structures 108 may be level with or slightly below the top surfaces of the protrusion regions 101, 102, 103, 104, 105, and 106. The remaining portion of the dielectric layer 107 under the gate conductor 161 and the gate spacers 171 can be referred to as the gate dielectric layer 151, the remaining portion of the dielectric layer 107 under the gate conductor 164 and the gate spacers 174 can be referred to as the gate dielectric layer 154, the remaining portion of the dielectric layer 107 under the gate conductor 165 and the gate spacers 175 can be referred to as the gate dielectric layer 155, and the remaining portion of the dielectric layer 107 under the resistor element 166 can be referred to as the dielectric layer 156.

Figure 27:
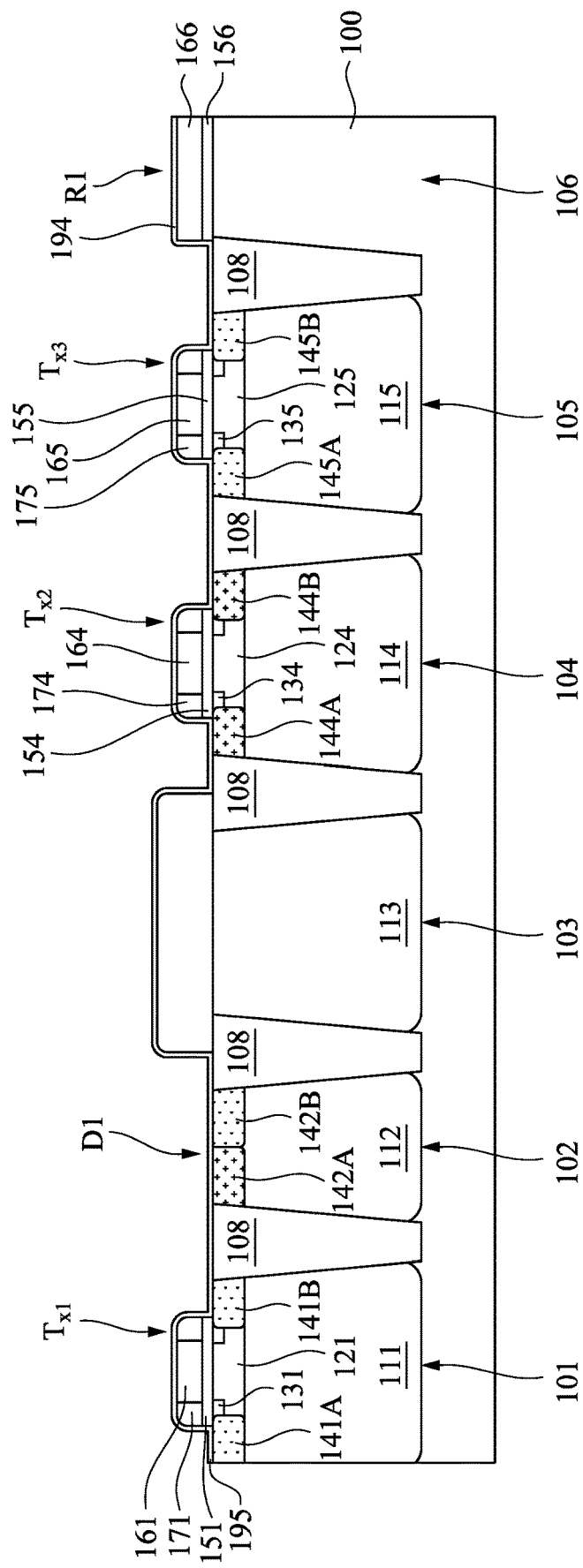

Reference is made to FIG. 27. A metal layer 194 is deposited blanket over the substrate 100. In some embodiments, the metal layer 194 may include metal, such as Ti, Co, W, Ni, Mo, Ta, Pt, or the like. The metal layer 194 may be deposited using suitable method, such as CVD, plasma-enhanced CVD (PECVD), atomic layer deposition (ALD), plasma-enhanced ALD (PEALD) or the like.

Figure 28:
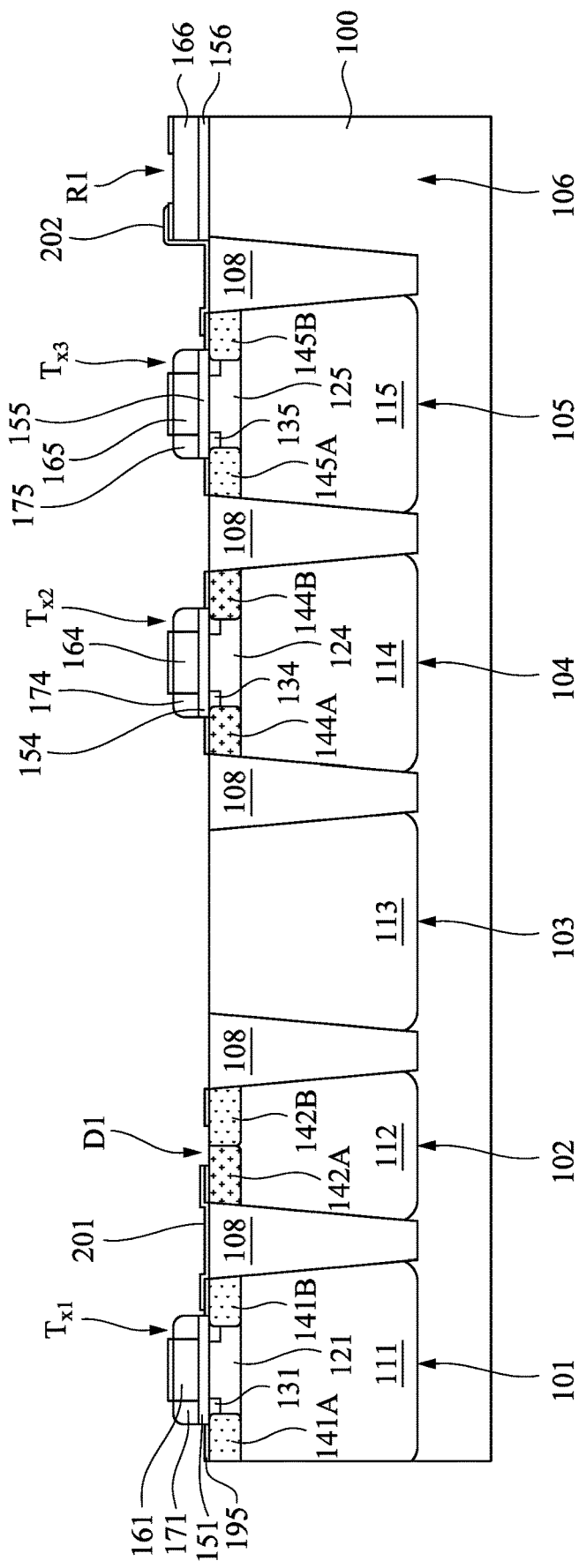

Reference is made to FIG. 28. An annealing process may be performed, such that the metal layer 194 may react with the underlying silicon-containing materials to form silicide pads 195. In some embodiments, the annealing process may be performing in an $N_2$ environment. After the annealing process is completed, a patterning process is performed to remove the remaining portions of the metal layer 194 or unwanted portions of the silicide pads 195. As a result of the patterning process, the silicide pads 195 remain over the source/drain regions 141A, 141B, 144A, 144B, 145A, 145B, over the gate conductors 161, 164, 165, and the resistor element 166.

Afterward, conductive layers 201 and 202 are formed over the substrate 100, in which the conductive layer 201 is formed to electrically connect the source/drain region 141B and the P-doped region 142A, and the conductive layer 202 is formed to electrically connect the source/drain region 145B and the resistor element 166. In some embodiments, the conductive layers 201 and 202 may be formed by, for example, depositing a conductive material blanket over the substrate 100, and then performing an etching process to remove unwanted portions of the conductive material. The remaining portions of the conductive material are referred to as the conductive layers 201 and 202. The conductive layers 201 and 202 may be deposited using suitable method, such as CVD, plasma-enhanced CVD (PECVD), atomic layer deposition (ALD), plasma-enhanced ALD (PEALD) or the like.

Figure 29:
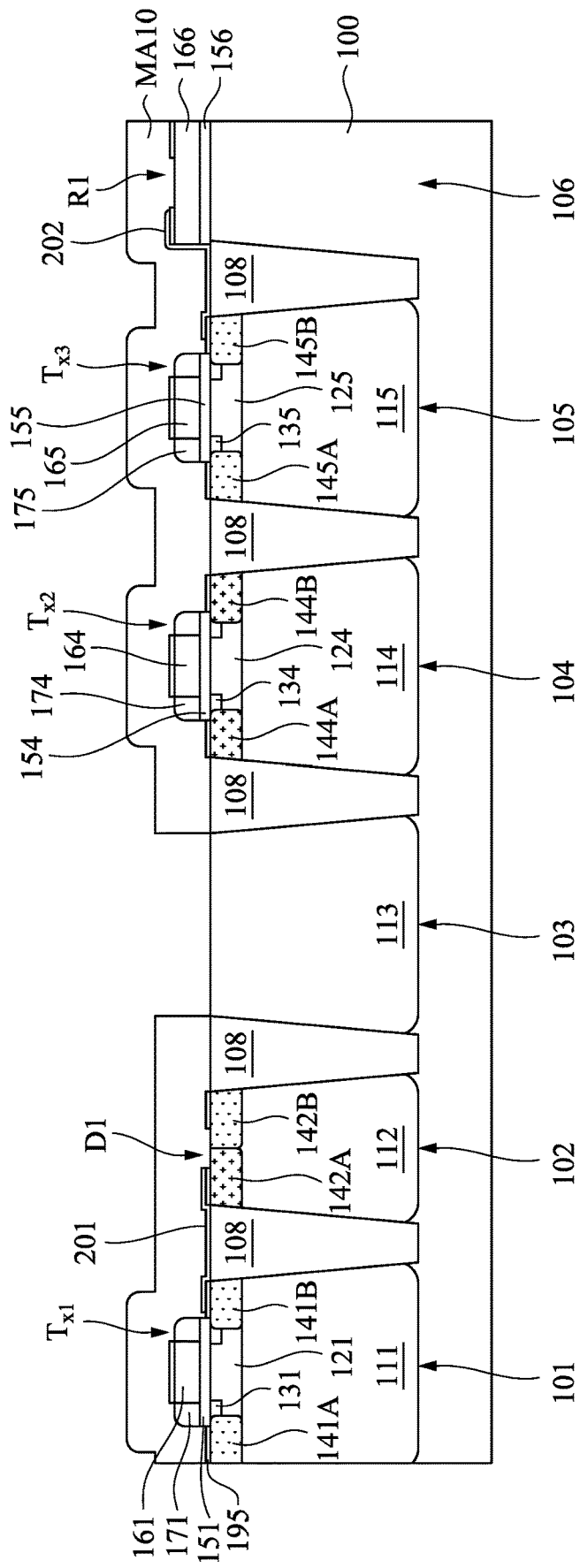

Reference is made to FIG. 29. A patterned mask MA10 is formed over the substrate 100. The patterned mask MA10 may include an opening that exposes the protrusion region 103. Afterward, a cleaning process is performed to remove native oxide on the top surface of the protrusion region 103. In some embodiments, during the cleaning process, the protrusion regions 101, 102, 104, 105, and 106 are protected by the patterned mask MA10. In some embodiments, the patterned mask MA10 may be photoresist.

Figure 30:
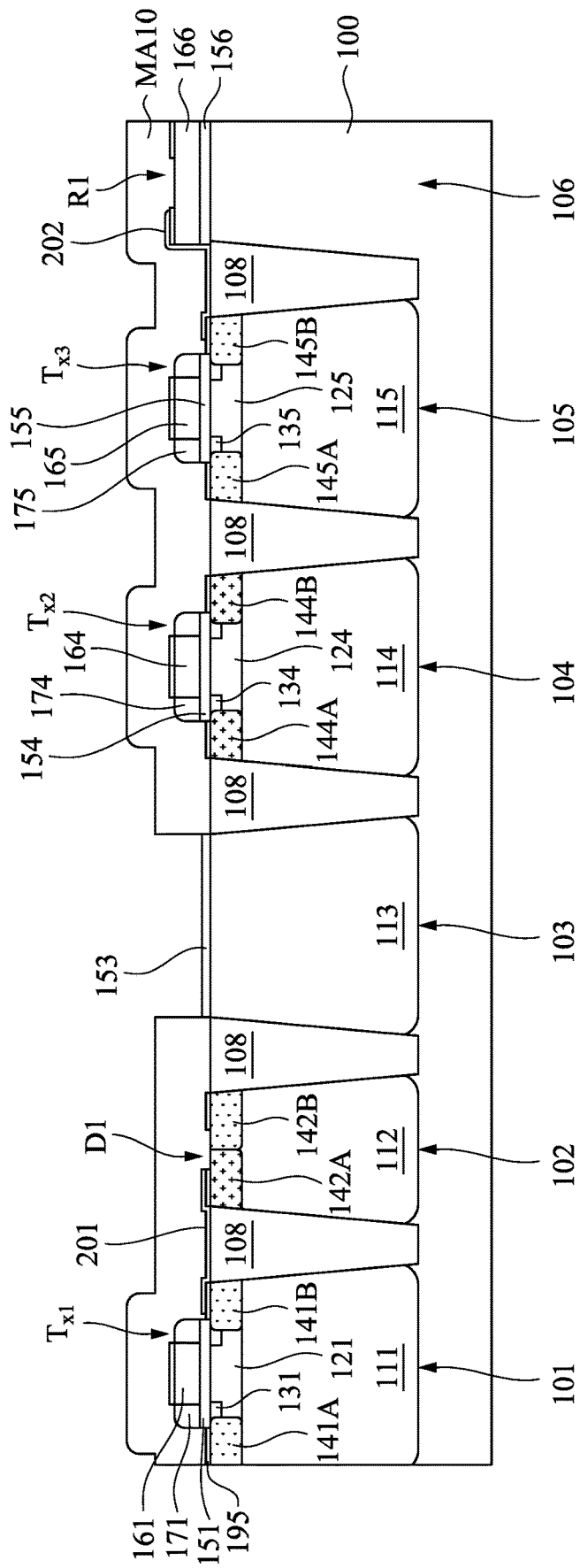

Reference is made to FIG. 30. After the cleaning process of FIG. 29 is completed, a dielectric layer 153 is formed over the exposed surface of the protrusion region 103. In some embodiments, the dielectric layer 153 may be formed by a thermal oxidation process, such that the dielectric layer 153 may be selectively formed on the exposed surface of the protrusion region 103 without forming on the patterned mask MA10. Stated another way, the dielectric layer 153 may be formed self-aligned with the exposed surface of the protrusion region 103.

Figure 31:
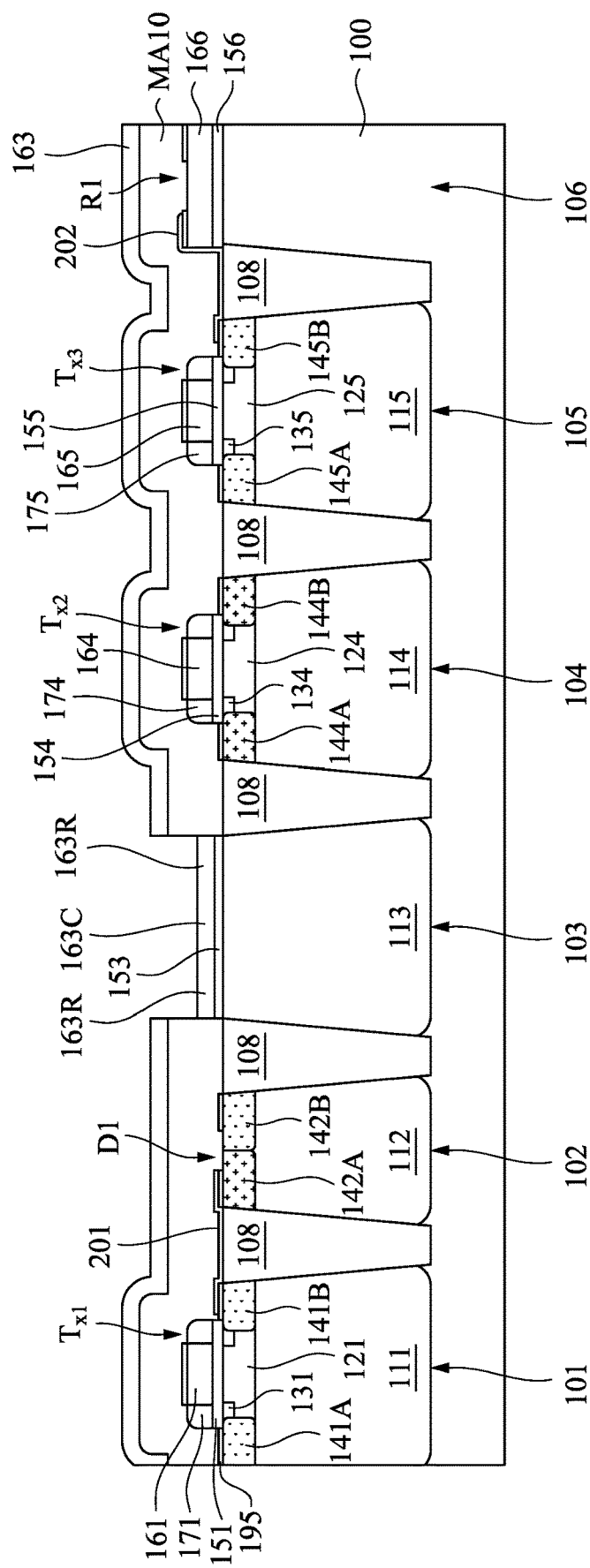

Reference is made to FIG. 31. A metal layer 163 is deposited over the substrate 100 and filling the opening of the patterned mask MA10. In greater details, the metal layer 163 is formed over the dielectric layer 153. The metal layer 163 may be deposited using suitable method, such as CVD, plasma-enhanced CVD (PECVD), atomic layer deposition (ALD), plasma-enhanced ALD (PEALD) or the like.

Figure 32:
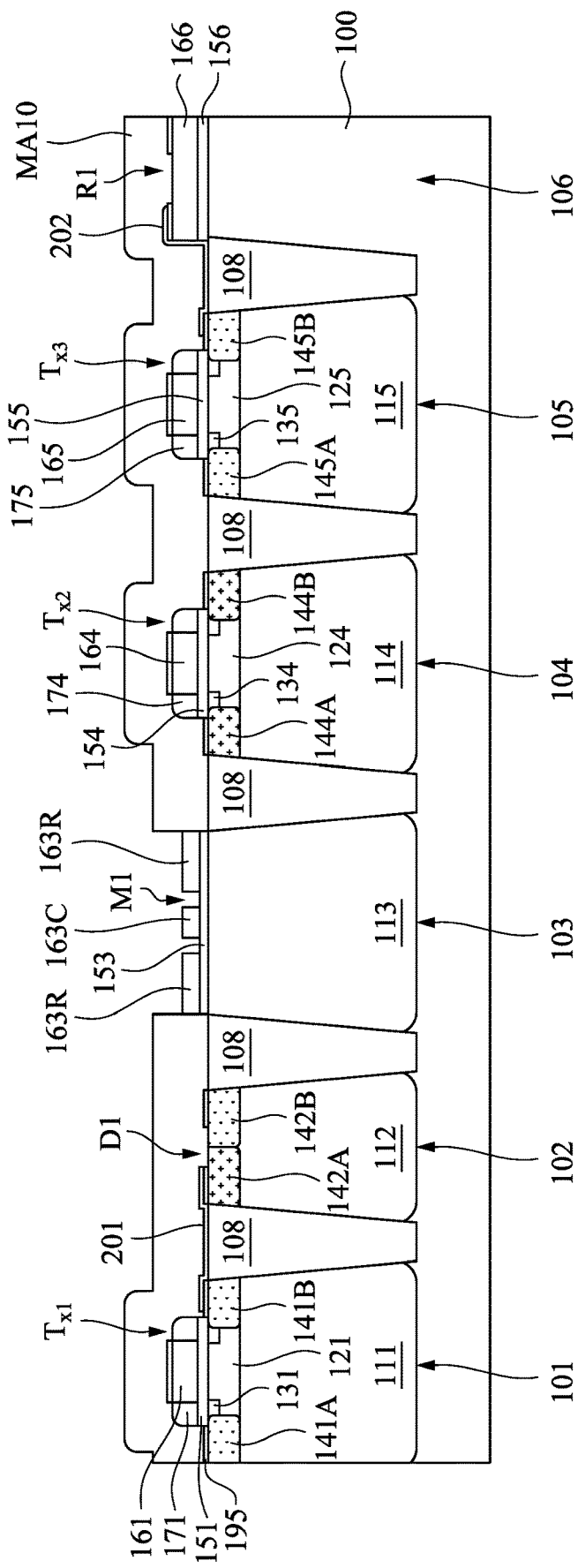

Reference is made to FIG. 32. The metal layer 163 is patterned to form an inner circular electrode 163C and an outer ring electrode 163R. In some embodiments, the metal layer 163 may be patterned by suitable lithography process, such as forming a patterned mask that expose unwanted portions of the metal layer 163, and then performing an etching process to remove the unwanted portions of the metal layer 163. The remaining portions of the metal layer 163 form the inner circular electrode 163C and the outer ring electrode 163R, respectively. As a result, the MISTD structure M1 is formed.

Figure 33:
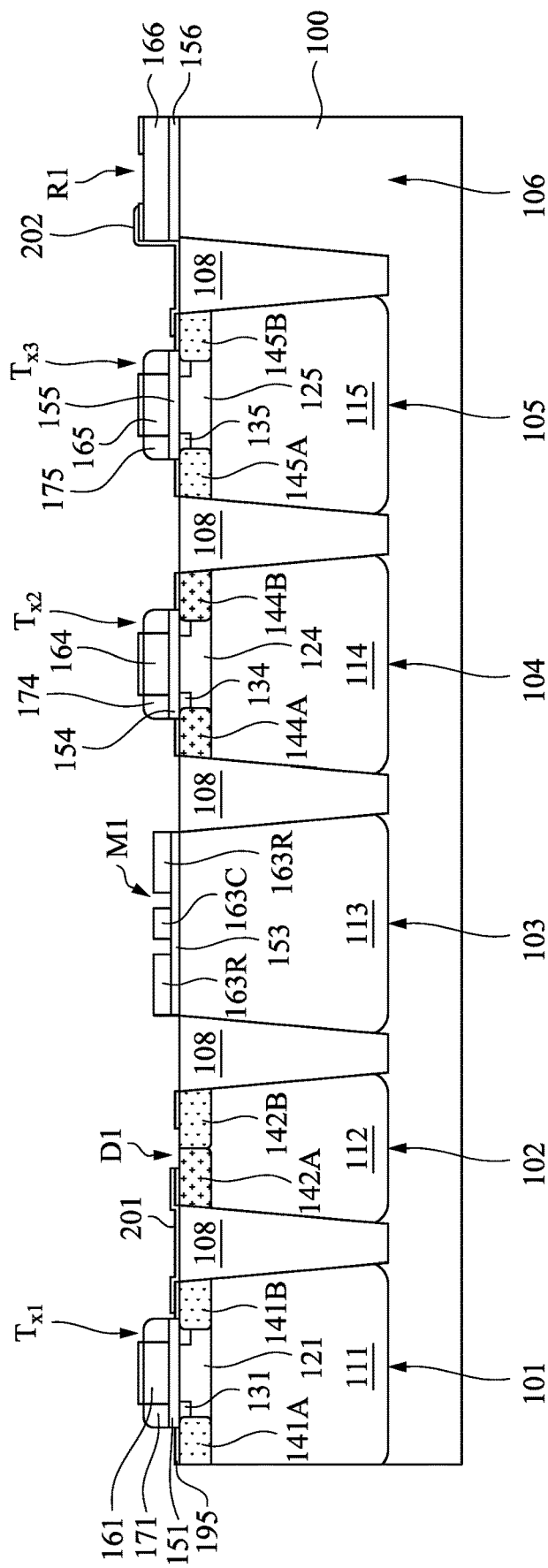

Reference is made to FIG. 33. The patterned mask MA10 is removed. In some embodiments where the patterned mask MA10 is formed of a photoresist, the patterned mask MA10 can be removed using a strip process.

Figure 34:
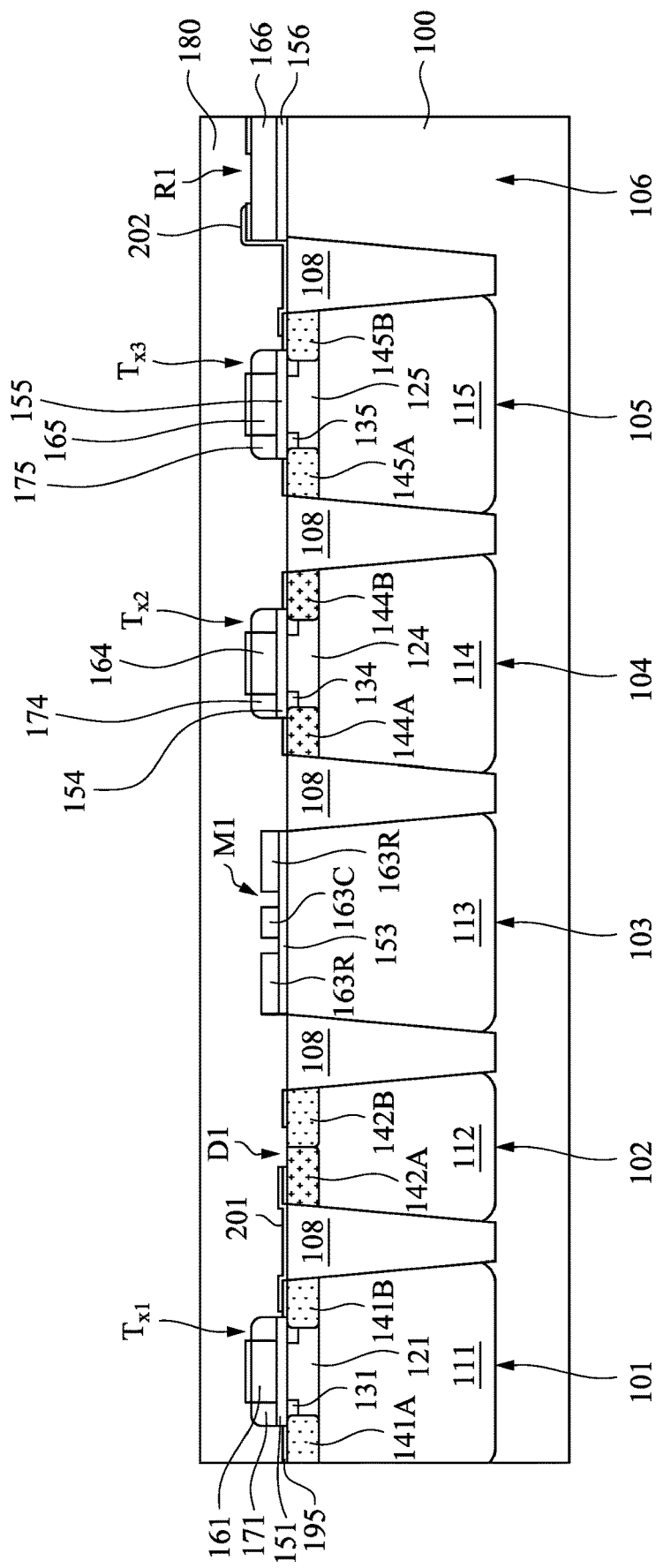

Reference is made to FIG. 34. An interlayer dielectric (ILD) layer 180 is deposited over the substrate 100. The dielectric materials used to form the ILD layer 180 may be deposited using any suitable method, such as CVD, physical vapor deposition (PVD), ALD, PEALD, PECVD, SACVD, FCVD, spin-on coating, and/or the like, or a combination thereof. In some embodiments, a chemical mechanism polishing (CMP) process may be performed to the ILD layer 180 to planarize the top surface of the ILD layer 180.

Figure 35:
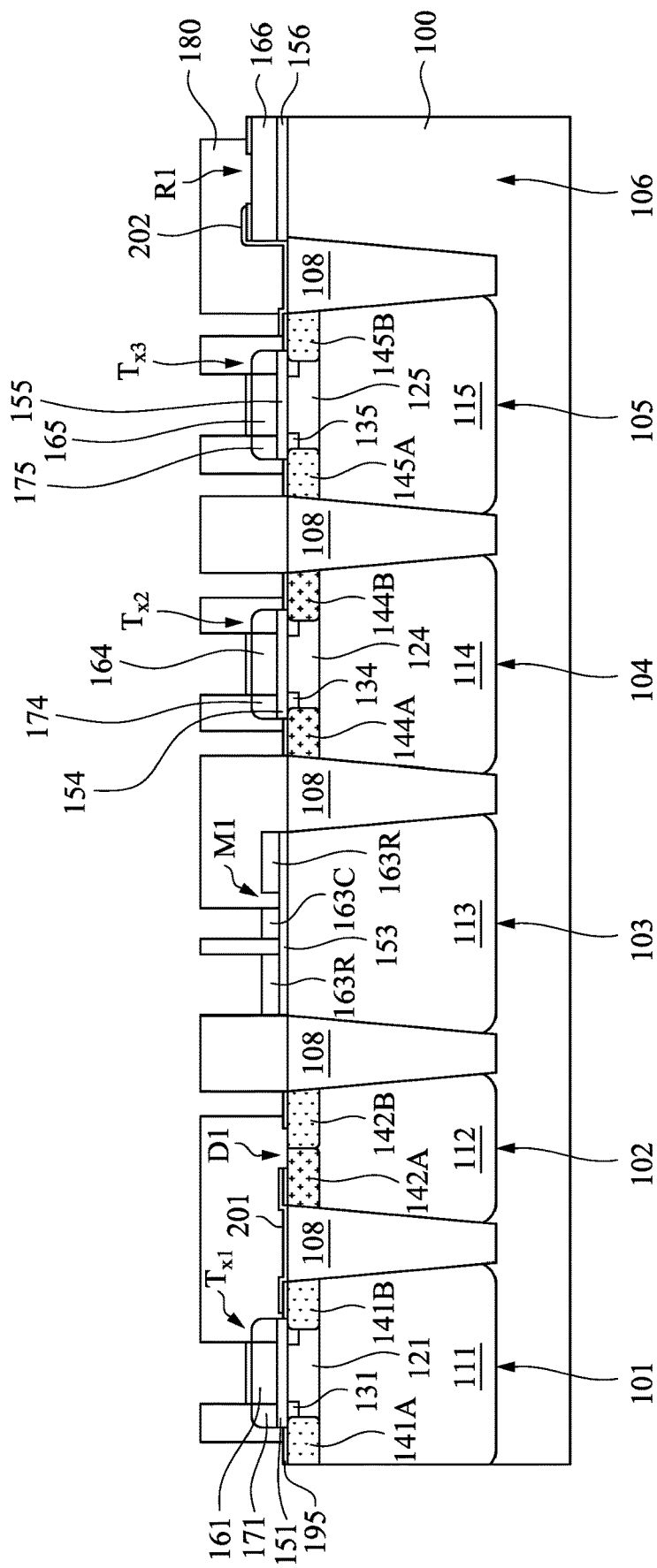

Reference is made to FIG. 35. The ILD layer 180 is patterned to form openings that expose underlying structures. For example, the openings of the ILD layer 180 may be aligned with the source/drain regions 141A, 144A, 144B, 145A, 145B, the gate conductors 161, 164, 165, the N-doped region 142B, the inner circular electrode 163C, the outer ring electrode 163R, and the resistor element 166. In some embodiments, the ILD layer 180 may be patterned by, for example, forming a patterned mask that exposes unwanted portions of the ILD layer 180, performing an etching process to remove the unwanted portions of the ILD layer 180 to form the openings in the ILD layer 180, and then removing the patterned mask.

Figure 36:
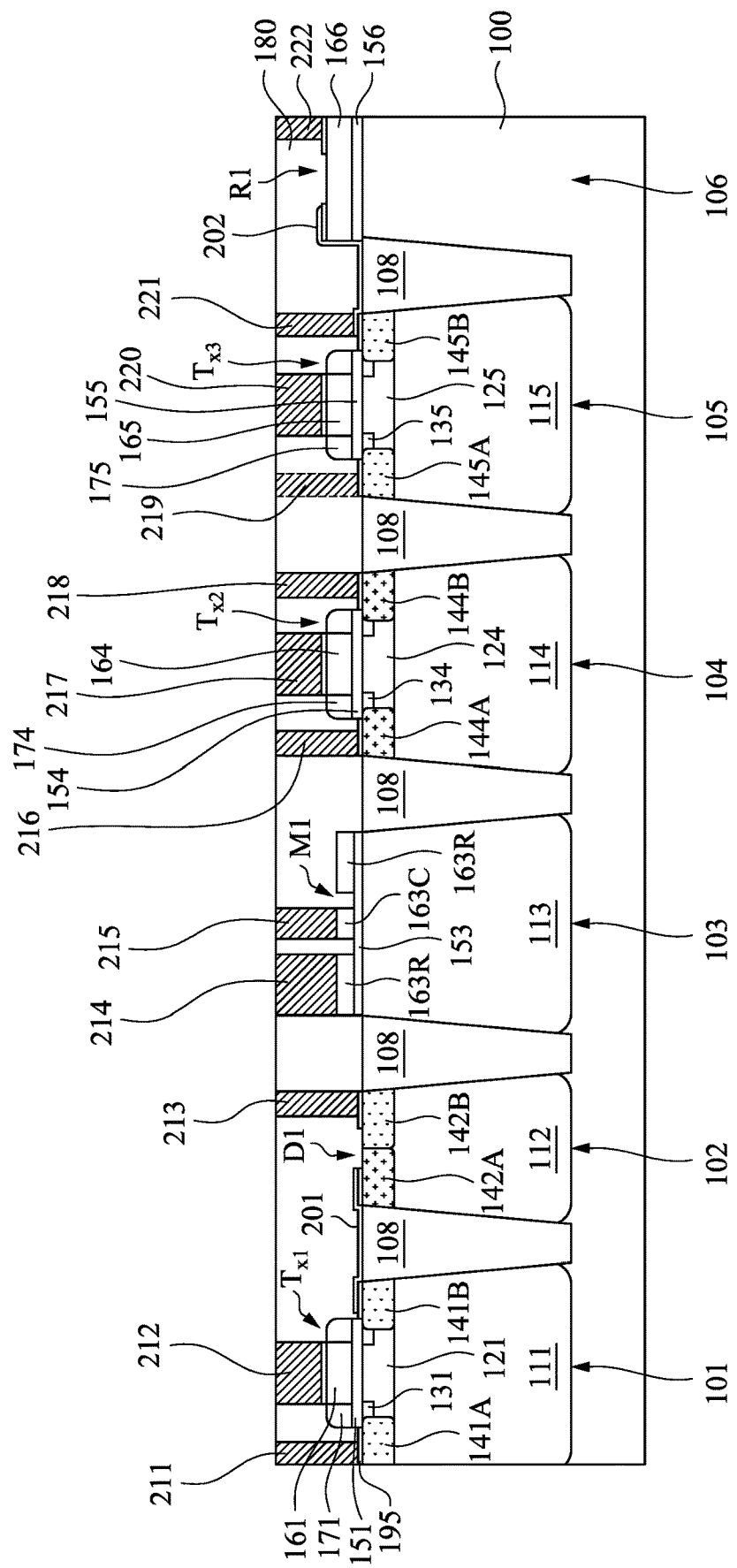

Reference is made to FIG. 36. Conductive materials are formed over the substrate 100 and overfilling the openings of the ILD layer 180. Afterward, a chemical mechanism polishing (CMP) process is performed to remove excess conductive material until the top surface of the ILD layer 180 is exposed. As a result, the remaining portions of the conductive materials form a source/drain contact 211, a gate via 212, a metal via 213, a metal via 214, a metal via 215, a source/drain contact 216, a gate via 217, a source/drain contact 218, a source/drain contact 219, a gate via 220, a source/drain contact 221, and a metal via 222, respectively. The conductive materials may be deposited using suitable method, such as CVD, PECVD, PVD, ALD, PEALD, electrochemical plating (ECP), electroless plating and/or the like.

Figure 37:
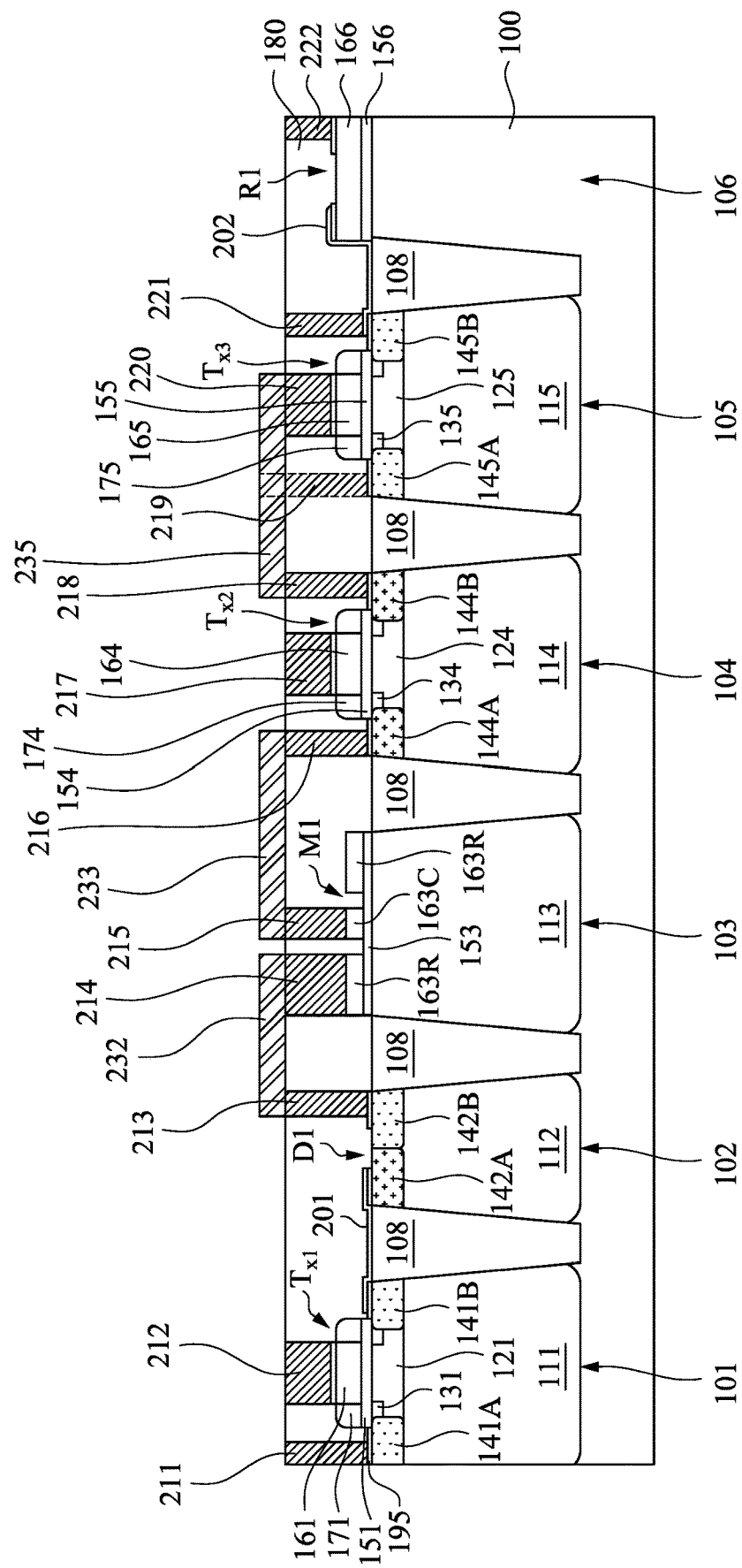

Reference is made to FIG. 37. Metal lines 232, 233, and 235 are formed over the ILD layer 180. In some embodiments, the metal lines 232, 233, and 235 may be formed by, for example, depositing a metal layer over the ILD layer 180, and then patterning the metal layer. The remaining portions of the metal layer form the metal lines 232, 233, and 235. The metal lines 232, 233, and 235 may be deposited using suitable method, such as CVD, PECVD, PVD, ALD, PEALD, electrochemical plating (ECP), electroless plating and/or the like.

Figure 38:
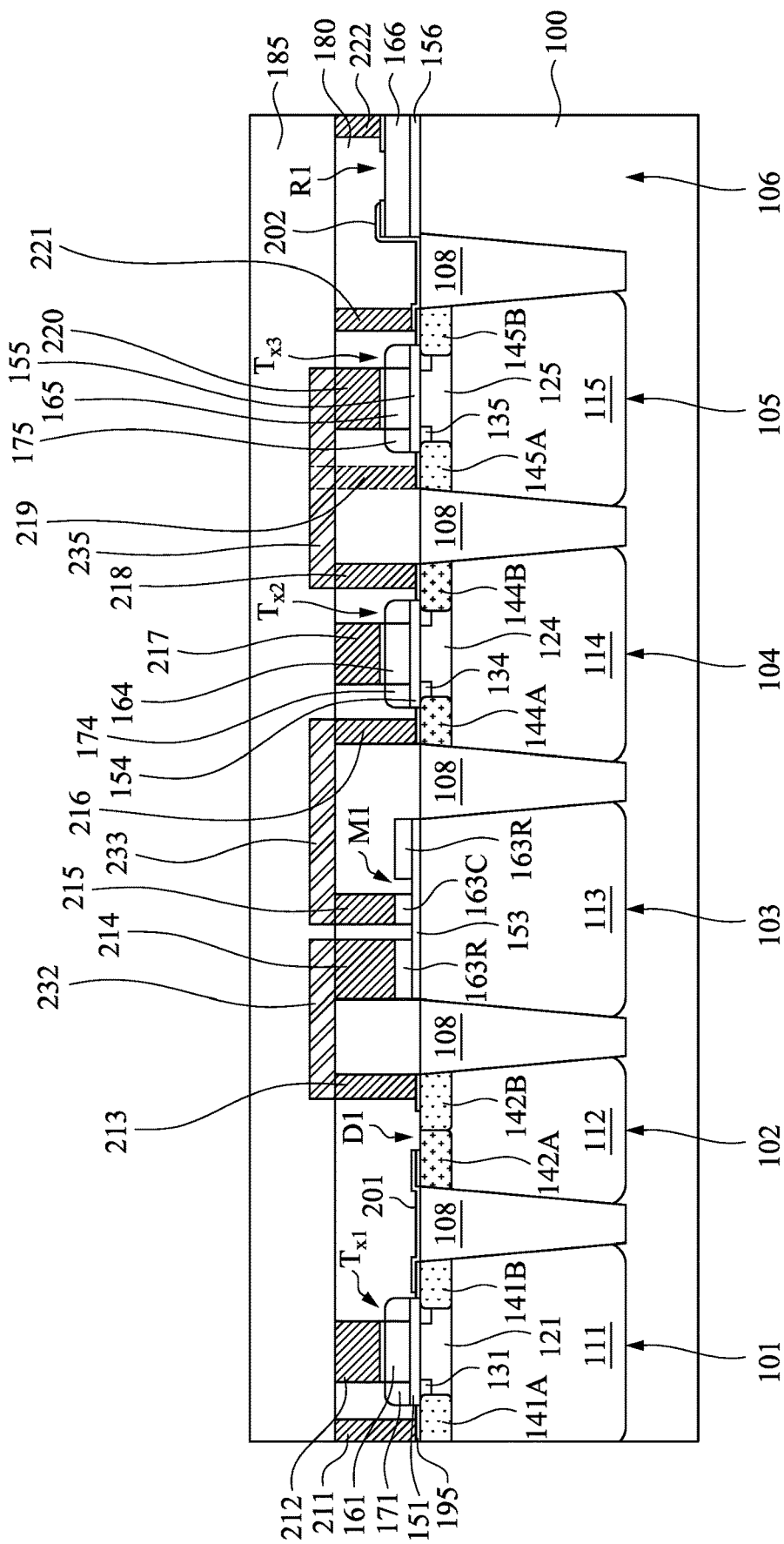

Reference is made to FIG. 38. An interlayer dielectric (ILD) layer 185 is deposited over the ILD layer 180 and covering the metal lines 232, 233, and 235. The dielectric materials used to form the ILD layer 185 may be deposited using any suitable method, such as CVD, physical vapor deposition (PVD), ALD, PEALD, PECVD, SACVD, FCVD, spin-on coating, and/or the like, or a combination thereof. In some embodiments, a chemical mechanism polishing (CMP) process may be performed to the ILD layer 185 to planarize the top surface of the ILD layer 185.

Figure 39:
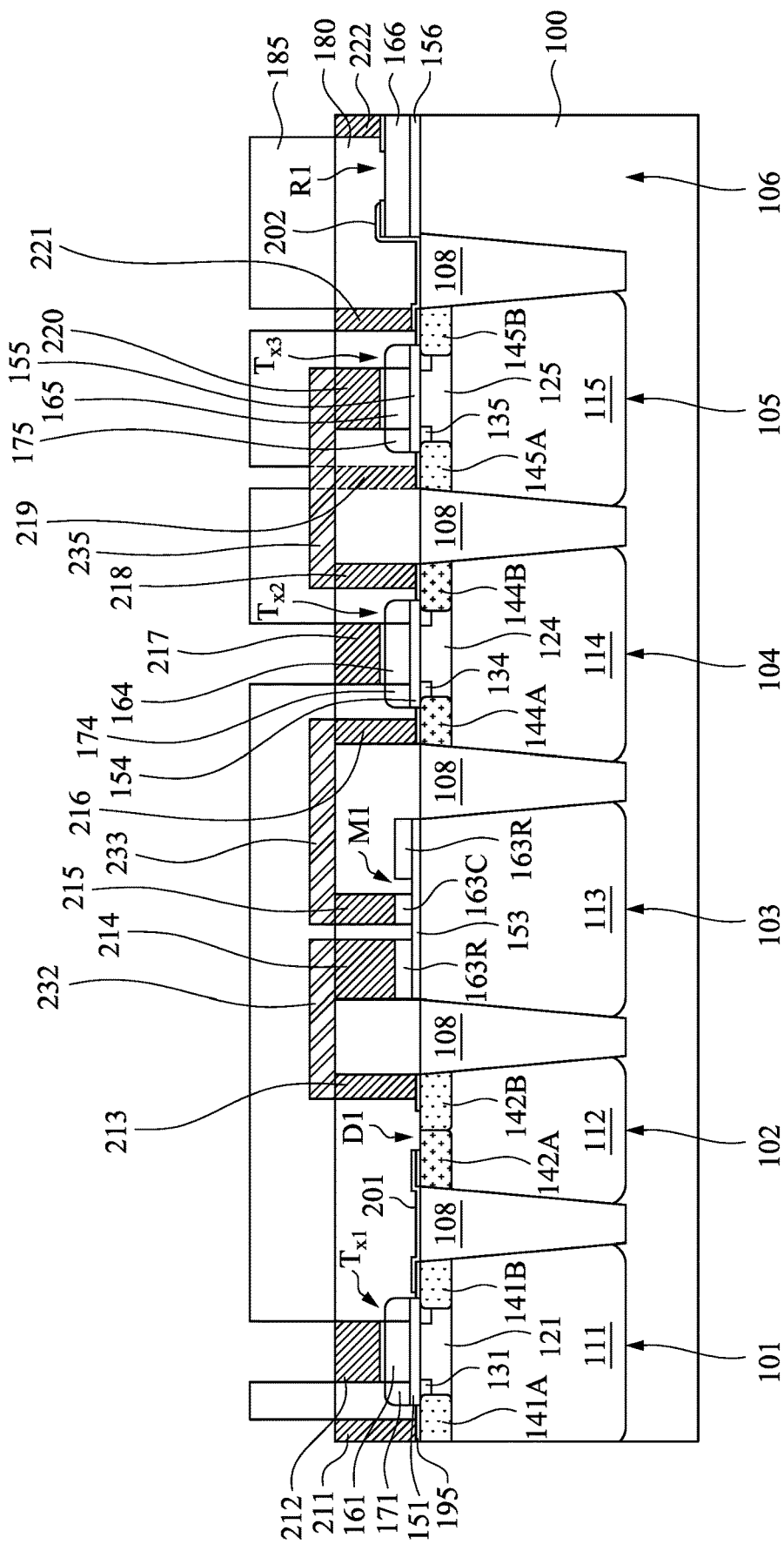

Reference is made to FIG. 39. The ILD layer 185 is patterned to form openings that expose underlying structures. For example, the openings of the ILD layer 185 may be aligned with the source/drain contact 211, the gate via 212, the gate via 217, the source/drain contact 218, the source/drain contact 219, the source/drain contact 221, and the metal via 222, respectively. In some embodiments, the ILD layer 185 may be patterned by, for example, forming a patterned mask that exposes unwanted portions of the ILD layer 185, performing an etching process to remove the unwanted portions of the ILD layer 185 to form the openings in the ILD layer 185, and then removing the patterned mask. It is noted than the source/drain contact 219 and the opening of the ILD layer 185 aligned with the source/drain contact 219 are drawn in dash-line, because the source/drain contact 219 and the opening of the ILD layer 185 that is aligned with the source/drain contact 219 may not be presented in this cross-sectional view in a real structure. That is, opening of the ILD layer 185 aligned with the source/drain contact 219 may bypass the metal line 235 and may be connected to the source/drain contact 219.

Figure 40:
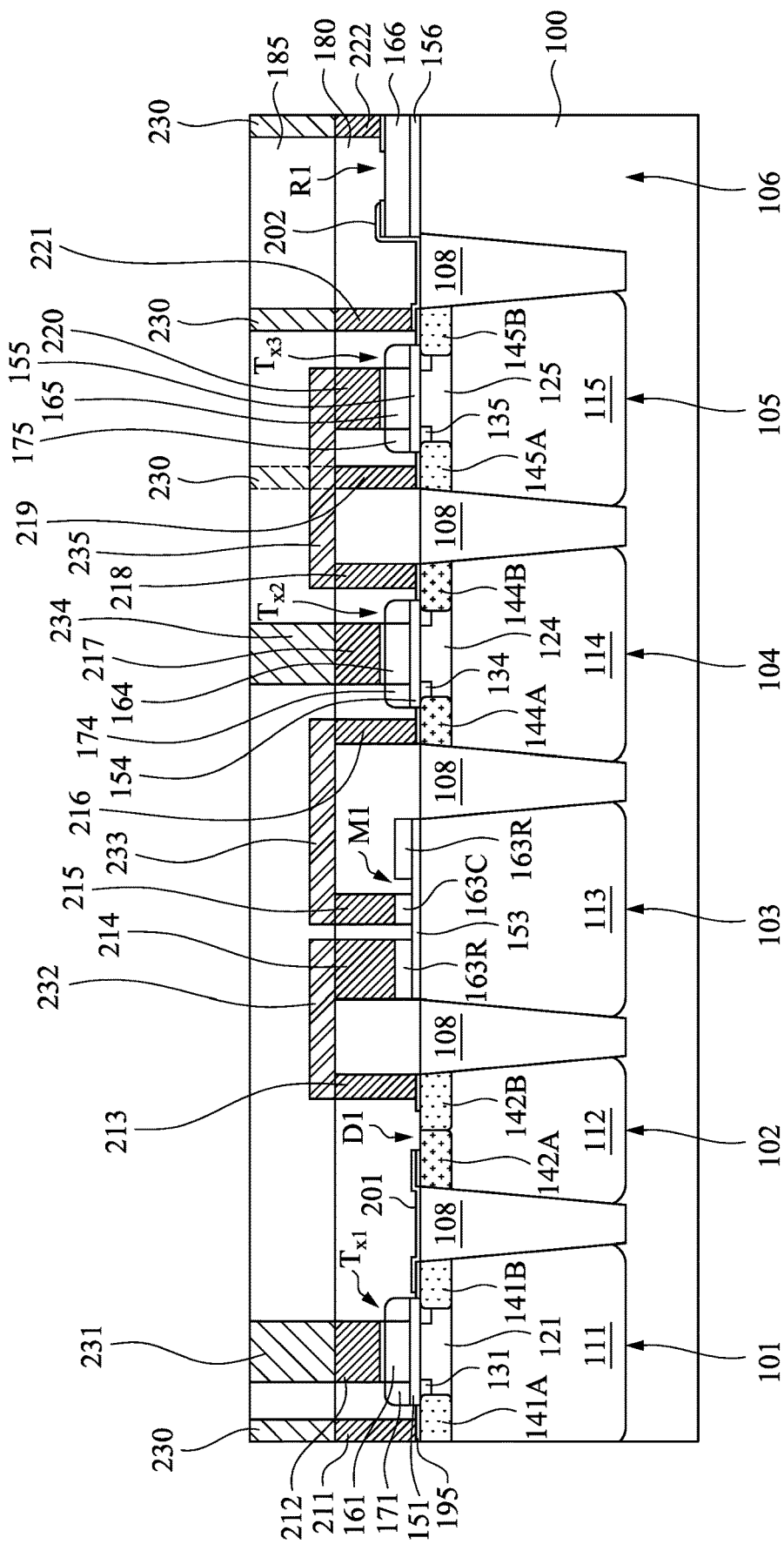

Reference is made to FIG. 40. Conductive materials are formed over the substrate 100 and overfilling the openings of the ILD layer 185. Afterward, a chemical mechanism polishing (CMP) process is performed to remove excess conductive material until the top surface of the ILD layer 185 is exposed. As a result, the remaining portions of the conductive materials form metal vias 230, 231, 234, respectively. In greater details, the metal vias 230 are in contact with the source/drain contacts 211, 219, 221, and the metal via 222, and will serve as parts of bit line BL1, word line WL, bit line BL2, and ground contact GND formed in later steps (see FIG. 44). The conductive materials may be deposited using suitable method, such as CVD, PECVD, PVD, ALD, PEALD, electrochemical plating (ECP), electroless plating and/or the like. It is noted than the source/drain contact 219 and the metal via 230 that is aligned with the source/drain contact 219 are drawn in dash-line, because the source/drain contact 219 and the metal via 230 that is aligned with the source/drain contact 219 may not be presented in this cross-sectional view in a real structure. That is, the metal via 230 that is aligned with the source/drain contact 219 may bypass the metal line 235 and may be connected to the source/drain contact 219.

Figure 41:
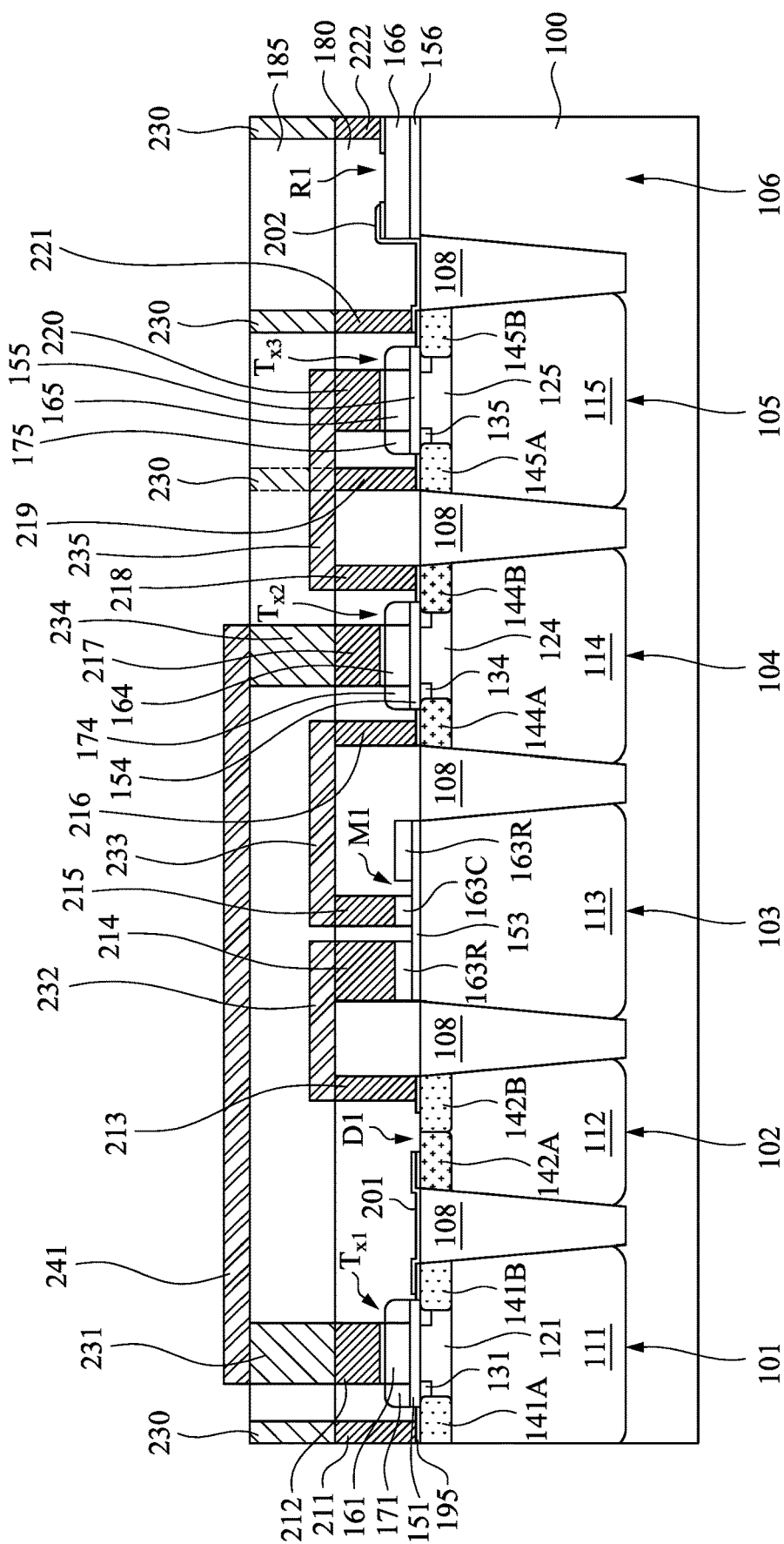

Reference is made to FIG. 41. A metal line 241 is formed over the ILD layer 185. In some embodiments, the metal line 241 may be formed by, for example, depositing a metal layer over the ILD layer 185, and then patterning the metal layer. The remaining portions of the metal layer form the metal line 241. The metal line 241 may be deposited using suitable method, such as CVD, PECVD, PVD, ALD, PEALD, electrochemical plating (ECP), electroless plating and/or the like.

Figure 42:
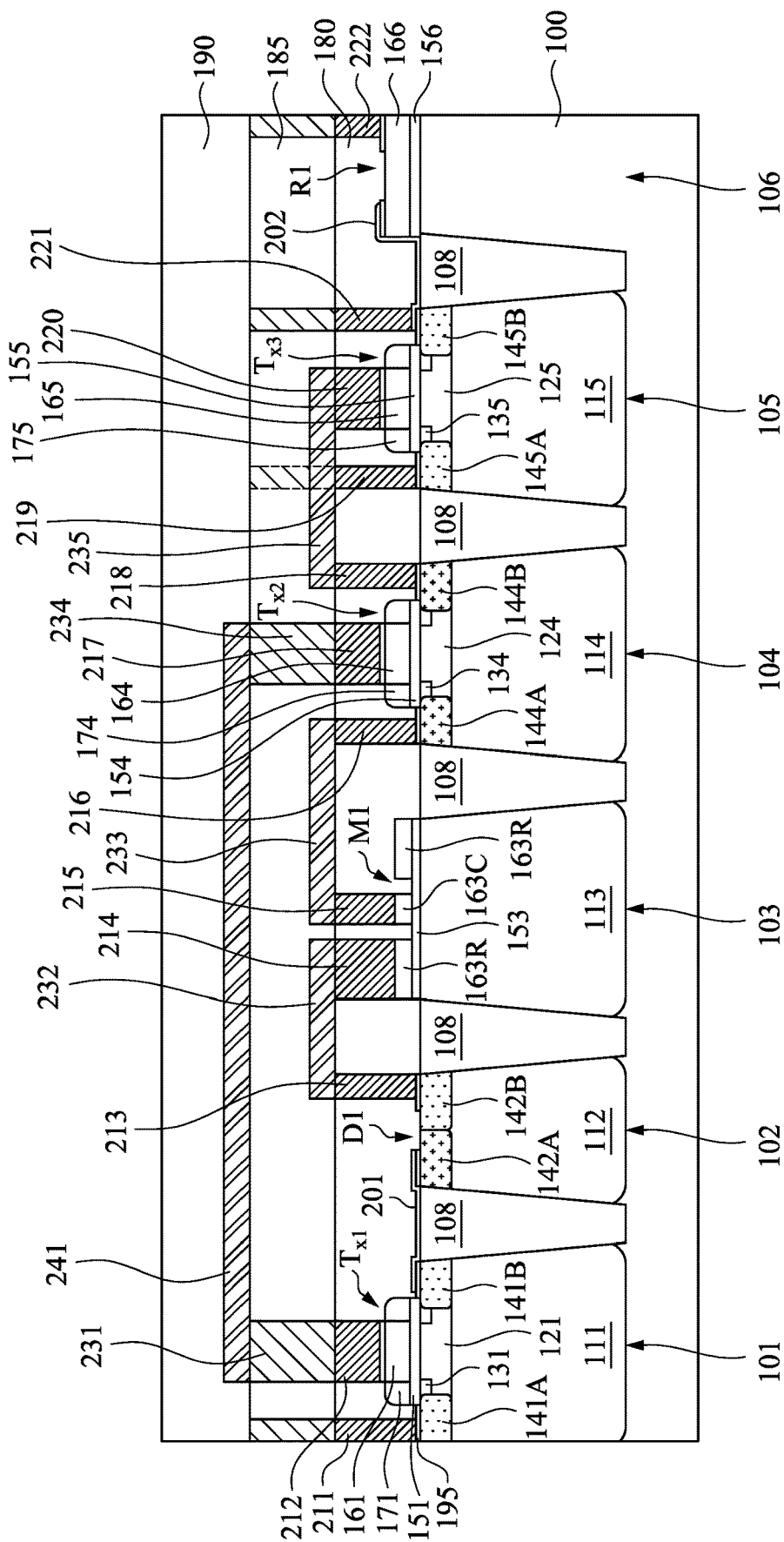

Reference is made to FIG. 42. An interlayer dielectric (ILD) layer 190 is deposited over the ILD layer 185 and covering the metal line 241. The dielectric materials used to form the ILD layer 190 may be deposited using any suitable method, such as CVD, physical vapor deposition (PVD), ALD, PEALD, PECVD, SACVD, FCVD, spin-on coating, and/or the like, or a combination thereof. In some embodiments, a chemical mechanism polishing (CMP) process may be performed to the ILD layer 190 to planarize the top surface of the ILD layer 190.

Figure 43:
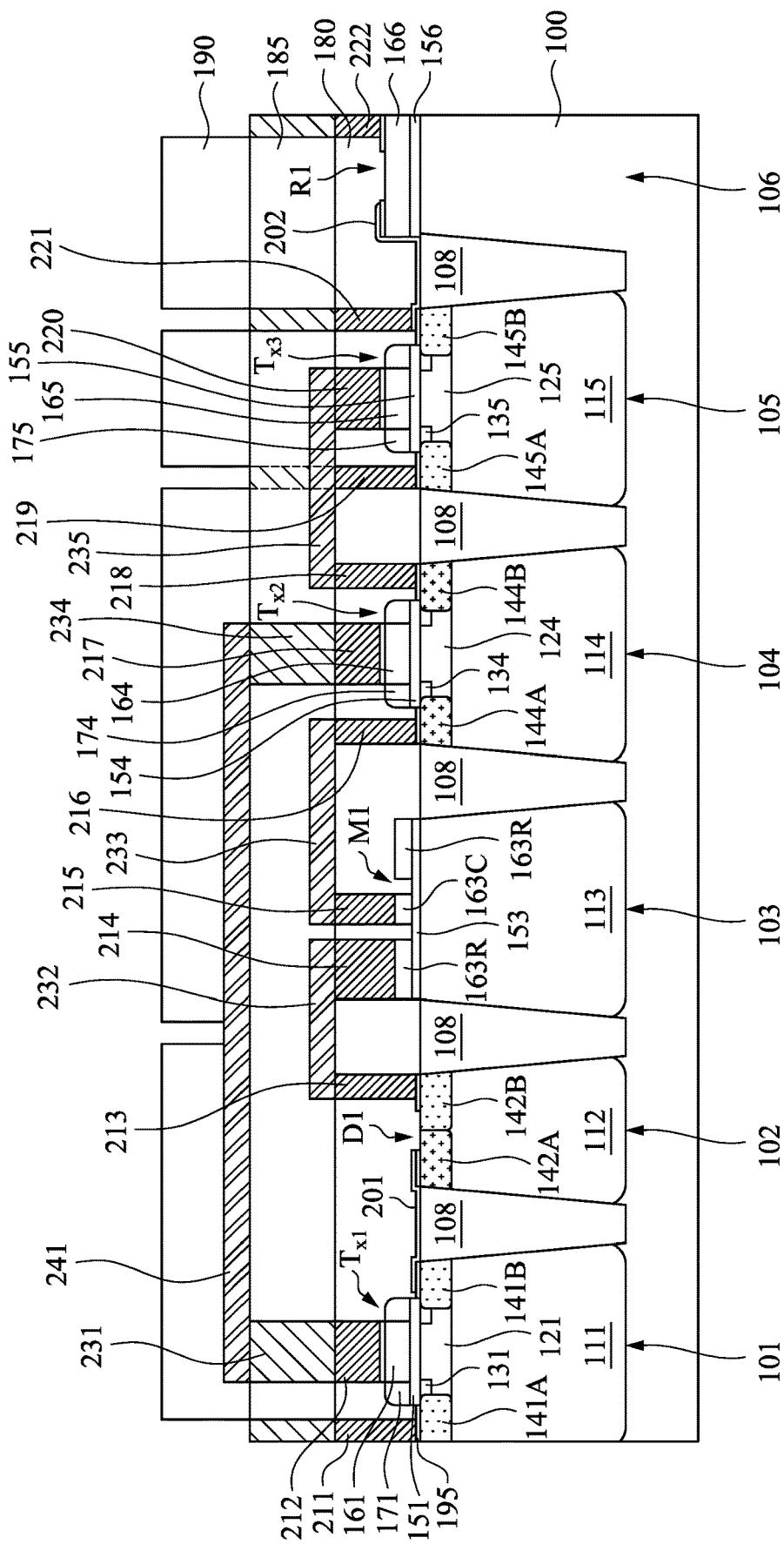

Reference is made to FIG. 43. The ILD layer 190 is patterned to form openings that expose underlying structures. For example, the openings of the ILD layer 190 may be aligned with the metal vias 230 and the metal line 241, respectively. In some embodiments, the ILD layer 190 may be patterned by, for example, forming a patterned mask that exposes unwanted portions of the ILD layer 190, performing an etching process to remove the unwanted portions of the ILD layer 190 to form the openings in the ILD layer 190, and then removing the patterned mask.

Figure 44:
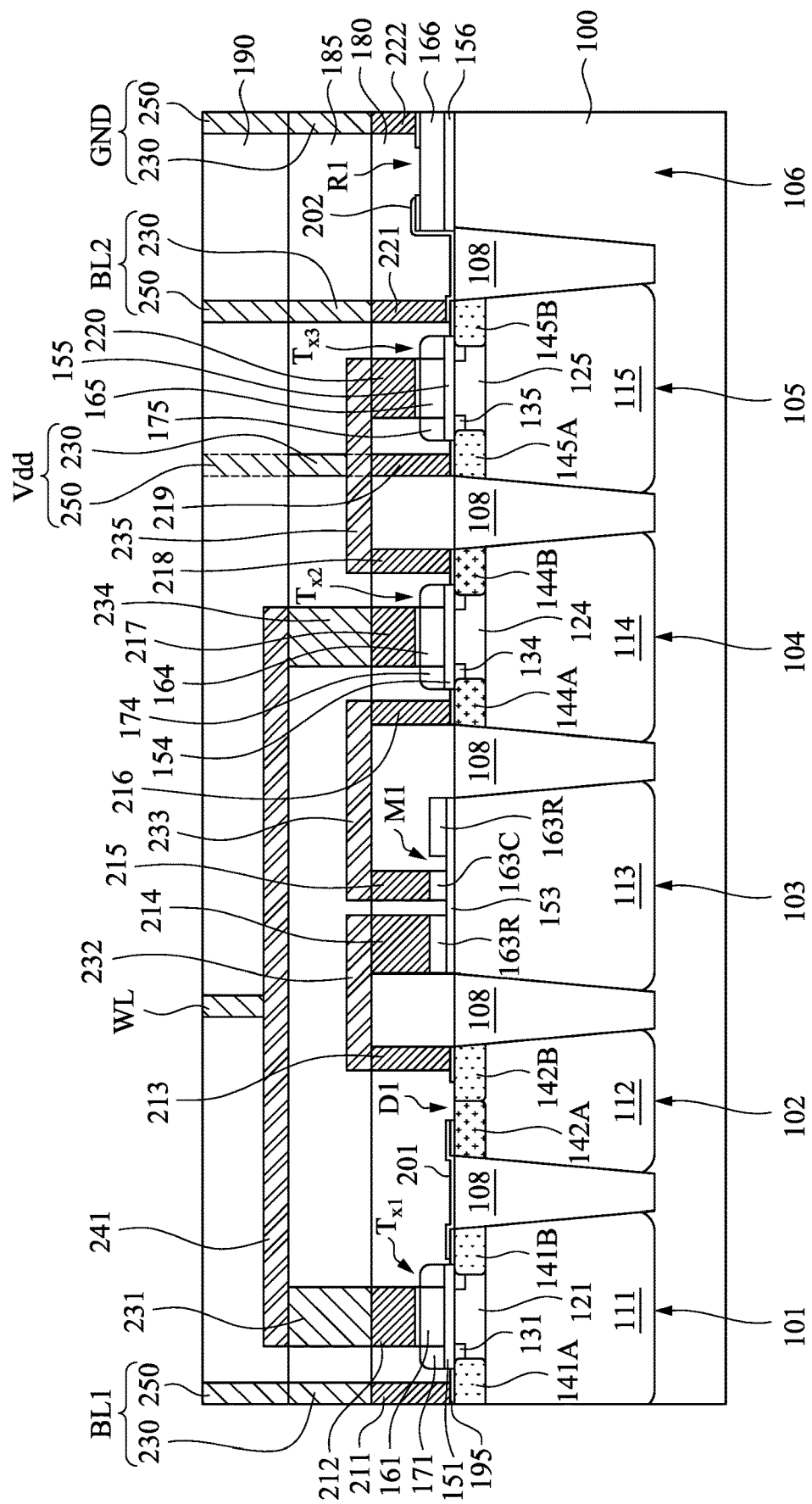

Reference is made to FIG. 44. Conductive materials are formed over the substrate 100 and overfilling the openings of the ILD layer 190. Afterward, a chemical mechanism polishing (CMP) process is performed to remove excess conductive material until the top surface of the ILD layer 190 is exposed. As a result, metal vias 250 and word line WL are formed in the ILD layer 190. In some embodiments, the metal via 230 and the metal via 250 over the source/drain contact 211 can be collectively referred to as a bit line BL1. The metal via 230 and the metal via 250 over the source/drain contact 219 can be collectively referred to as a power line Vdd. The metal via 230 and the metal via 250 over the source/drain contact 221 can be collectively referred to as a bit line BL2. The metal via 230 and the metal via 250 over the metal via 222 can be collectively referred to as a ground contact GND.

According to the aforementioned embodiments, it can be seen that the present disclosure offers advantages in fabricating integrated circuits. It is understood, however, that other embodiments may offer additional advantages, and not all advantages are necessarily disclosed herein, and that no particular advantage is required for all embodiments. One advantage is that by operating the MISTD structure in deep depletion, a MISTD memory can be achieved. Furthermore, by utilizing Schottky barrier modulation effect of MISTD under current saturation region, the proposed memory device is of low power consumption. The MISTD memory shows longer retention time. Moreover, the device includes a simple structure, which can be easily fabricated. The device can be operated under room temperature with low power consumption and long retention time.

In some embodiments of the present disclosure, a method includes etching a substrate to form first, second, third, fourth, fifth and sixed protrusion regions over the substrate; forming a first dielectric layer over the substrate and covering the first, second, third, fourth, fifth and sixth protrusion regions; forming first, second, and third gate conductors over the first, fourth, and fifth protrusion regions, respectively; performing a first implantation process to form a second source region and a second drain region in the fourth protrusion region and on opposite sides of the second gate conductor; performing a second implantation process to form a first source region and a first drain region in the first protrusion region and on opposite sides of the first gate conductor, and to form a third source region and a third drain region in the fifth protrusion region and on opposite sides of the third gate conductor; forming a metal layer over the third protrusion region; patterning the metal layer to form an inner circular electrode and an outer ring electrode encircling the inner circular electrode; forming a word line electrically coupled to the first and second gate conductors; and forming a bit line electrically coupled to the first source region.

In some embodiments of the present disclosure, a method includes etching a substrate to form first, second, third, fourth, fifth and sixth protrusion regions over the substrate; forming first, second, and third transistors over the first, fourth, and fifth protrusion regions; forming a diode over the second protrusion region, wherein the diode comprises a P-doped region and an N-doped region in the second protrusion region; forming a first dielectric layer over the third protrusion region; forming an inner circular electrode and an outer ring electrode over the first dielectric layer, wherein the outer ring electrode encircles the inner circular electrode; forming a word line electrically coupled to gates of the first and second transistors; and forming a bit line electrically coupled to a source of the first transistor.

In some embodiments of the present disclosure, a memory device includes a substrate; first, second, and third protrusion regions over the substrate; shallow trench isolation (STI) structures over the substrate and laterally surrounding the first, second, and third protrusion regions; a first transistor over the first protrusion region; a second transistor over the second protrusion region; a dielectric layer in contact with a top surface the third protrusion region; an inner circular electrode in contact with a top surface of the dielectric layer, wherein the inner circular electrode is electrically connected to a source of the second transistor; an outer ring electrode in contact with the top surface of the dielectric layer and encircling the inner circular electrode, wherein the outer ring electrode is electrically connected to a drain of the second transistor; a word line electrically coupled to a gate of the first transistor and a gate of the second transistor; and a bit line electrically coupled to a source of the first transistor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   etching a substrate to form first, second, third, fourth, fifth and sixth protrusion regions over the substrate;
   forming a first dielectric layer over the substrate and covering the first, second, third, fourth, fifth and sixth protrusion regions;
   forming first, second, and third gate conductors over the first, fourth, and fifth protrusion regions, respectively;
   performing a first implantation process to form a second source region and a second drain region in the fourth protrusion region and on opposite sides of the second gate conductor;
   performing a second implantation process to form a first source region and a first drain region in the first protrusion region and on opposite sides of the first gate conductor, and to form a third source region and a third drain region in the fifth protrusion region and on opposite sides of the third gate conductor;
   forming a metal layer over the third protrusion region;
   patterning the metal layer to form an inner circular electrode and an outer ring electrode encircling the inner circular electrode;
   forming a word line electrically coupled to the first and second gate conductors; and
   forming a bit line electrically coupled to the first source region.

2. The method of claim 1, wherein,
   performing the first implantation process further comprises forming a P-doped region in a first portion of the second protrusion region; and
   performing the second implantation process further comprises forming an N-doped region in a second portion of the second protrusion region, such that the P-doped region and the N-doped region form a diode.

3. The method of claim 1, further comprising forming interconnect structures electrically coupling the first drain region to the outer ring electrode, coupling the inner circular electrode to the second source region, and coupling the second drain region to the third gate conductor.

4. The method of claim 1, further comprising forming a resistor element over the sixth protrusion region, wherein the resistor element and the first, second, and third gate conductors are formed in a same step.

5. The method of claim 4, further comprising:
   forming a conductive layer electrically coupling the third drain region to the resistor element; and
   forming a ground contact electrically coupled to the resistor element.

6. The method of claim 1, further comprising:
   removing a portion of the first dielectric layer from the third protrusion region after performing the second implantation process; and
   forming a second dielectric layer over the third protrusion region prior to forming the metal layer.

7. The method of claim 6, further comprising performing a cleaning process to remove a native oxide from the third protrusion region after removing the portion of the first dielectric layer from the third protrusion region and prior to forming the second dielectric layer.

8. The method of claim 6, wherein the second dielectric layer is selectively formed over an exposed surface of the third protrusion region.

9. A method, comprising:
   etching a substrate to form first, second, third, fourth, fifth and sixth protrusion regions over the substrate;
   forming first, second, and third transistors over the first, fourth, and fifth protrusion regions;
   forming a diode over the second protrusion region, wherein the diode comprises a P-doped region and an N-doped region in the second protrusion region;
   forming a first dielectric layer over the third protrusion region;
   forming an inner circular electrode and an outer ring electrode over the first dielectric layer, wherein the outer ring electrode encircles the inner circular electrode;
   forming a word line electrically coupled to gates of the first and second transistors; and
   forming a bit line electrically coupled to a source of the first transistor.

10. The method of claim 9, further comprising forming interconnect structures electrically coupling a drain of the first transistor to the P-doped region of the diode, coupling the N-doped region of the diode to the outer ring electrode, coupling the inner circular electrode to a source of the second transistor, and coupling a drain of the second transistor to a gate of the third transistor.

11. The method of claim 9, wherein forming the inner circular electrode and the outer ring electrode comprises:

forming a patterned mask having an opening exposing the third protrusion region;
depositing a metal layer in the opening;
patterning the metal layer; and
removing the patterned mask.

12. The method of claim 9, further comprising:
forming a second dielectric layer over and laterally surrounding the first, second, third, fourth, fifth and sixth protrusion regions; and
removing the second dielectric layer to expose the third protrusion region prior to forming the first dielectric layer, wherein the first dielectric layer is formed self-aligned with an exposed surface of the third protrusion region.

13. The method of claim 9, further comprising forming a resistor element over the sixth protrusion region, wherein the resistor element and gates of the first, second, and third transistors are formed by patterning a same material.

14. The method of claim 9, wherein the N-doped region of the diode, source and drain of the first transistor, and source and drain of the third transistor are formed in a same implantation process.

15. The method of claim 14, wherein the P-doped region of the diode, and source and drain of the second transistor are formed in a same implantation process.

16. A method, comprising:
forming a first transistor and a second transistor over a substrate;
forming a dielectric layer in contact with a portion of the substrate;
forming an inner circular electrode and an outer ring electrode in contact with a top surface of the dielectric layer, wherein the inner circular electrode is electrically connected to a source of the second transistor, and the outer ring electrode is electrically connected to a drain of the first transistor;
forming a word line electrically coupled to a gate of the first transistor and a gate of the second transistor; and
forming a bit line electrically coupled to a source of the first transistor.

17. The method of claim 16, further comprising forming a P-doped region and an N-doped region in the substrate, wherein the P-doped region and the N-doped region form a diode, and wherein the diode electrically couples the drain of the first transistor to the outer ring electrode.

18. The method of claim 17, further comprising forming a third transistor over the substrate, wherein a drain of the second transistor is electrically coupled to a gate of the third transistor.

19. The method of claim 18, further comprising forming a resistor element over the substrate, wherein the resistor element and the gates of the first, second, and third transistors are made of a same material.

20. The method of claim 16, wherein a thickness of the dielectric layer is in a range from about 15 Å to about 24 Å.

* * * * *